United States Patent
McCairn et al.

(10) Patent No.: US 11,149,110 B2
(45) Date of Patent: *Oct. 19, 2021

(54) NANOPARTICLES FOR USE IN LIGHT EMITTING APPLICATIONS

(71) Applicant: Chromition Limited, Stockport (GB)

(72) Inventors: Mark McCairn, Manchester (GB); Michael Turner, Manchester (GB); Jair Esquivel Guzman, Manchester (GB); Benjamin Lidster, Manchester (GB)

(73) Assignee: Chromition Limited, Stockport (GB)

( * ) Notice: Subject to any disclaimer, the term of this patent is extended or adjusted under 35 U.S.C. 154(b) by 449 days.

This patent is subject to a terminal disclaimer.

(21) Appl. No.: 16/070,778

(22) PCT Filed: Jan. 18, 2017

(86) PCT No.: PCT/EP2017/051012
§ 371 (c)(1),
(2) Date: Jul. 17, 2018

(87) PCT Pub. No.: WO2017/125454
PCT Pub. Date: Jul. 27, 2017

(65) Prior Publication Data
US 2019/0023834 A1    Jan. 24, 2019

(30) Foreign Application Priority Data

Jan. 19, 2016 (GB) .................................. 1601007

(51) Int. Cl.
*C09K 11/06* (2006.01)
*C08G 61/12* (2006.01)
(Continued)

(52) U.S. Cl.
CPC ......... *C08G 61/123* (2013.01); *C09D 183/04* (2013.01); *C09K 11/06* (2013.01);
(Continued)

(58) Field of Classification Search
CPC ....................................................... C09K 11/06
See application file for complete search history.

(56) References Cited

U.S. PATENT DOCUMENTS

2011/0068322 A1   3/2011   Pickett et al.
2014/0017130 A1   1/2014   Trogler et al.
(Continued)

FOREIGN PATENT DOCUMENTS

CN   102627776   *   4/2012
CN   102627776   A   8/2012
(Continued)

OTHER PUBLICATIONS

Ibrahimova. Facile synthesis of cross-linked patchy fluorescent conjugated polymer nanoparticles by click reactions. Polym. Chem., 2011, 2, 2818 (Year: 2011).*

(Continued)

*Primary Examiner* — Matthew E. Hoban
(74) *Attorney, Agent, or Firm* — Foley Hoag LLP; David P. Halstead; Lawrence P. Tardibono

(57) ABSTRACT

Resins comprising nanoparticles formed from π-conjugated cross-linked polymers are disclosed, together with their methods of manufacture and their applications in light emitting devices.

20 Claims, 28 Drawing Sheets

(51) Int. Cl.
| | |
|---|---|
| H01L 51/00 | (2006.01) |
| H01L 51/50 | (2006.01) |
| C09D 183/04 | (2006.01) |
| C08G 77/20 | (2006.01) |
| C08G 77/12 | (2006.01) |
| B82Y 20/00 | (2011.01) |
| B82Y 40/00 | (2011.01) |

(52) U.S. Cl.
CPC ........ *H01L 51/0039* (2013.01); *H01L 51/502* (2013.01); *B82Y 20/00* (2013.01); *B82Y 40/00* (2013.01); *C08G 77/12* (2013.01); *C08G 77/20* (2013.01); *C08G 2261/135* (2013.01); *C08G 2261/145* (2013.01); *C08G 2261/148* (2013.01); *C08G 2261/1412* (2013.01); *C08G 2261/1424* (2013.01); *C08G 2261/1426* (2013.01); *C08G 2261/3142* (2013.01); *C08G 2261/3246* (2013.01); *C08G 2261/411* (2013.01); *C08G 2261/5222* (2013.01); *C08G 2261/76* (2013.01); *C08G 2261/95* (2013.01); *C09K 2211/1416* (2013.01); *C09K 2211/1425* (2013.01); *C09K 2211/1458* (2013.01); *C09K 2211/1483* (2013.01)

(56) References Cited

U.S. PATENT DOCUMENTS

| | | |
|---|---|---|
| 2015/0270455 A1 | 9/2015 | Naasani et al. |
| 2016/0272884 A1* | 9/2016 | Kim ..................... C09K 11/06 |

FOREIGN PATENT DOCUMENTS

| | | |
|---|---|---|
| WO | WO-2013/101902 A2 | 7/2013 |
| WO | WO-2014/017983 A1 | 1/2014 |
| WO | WO-2015/052529 A1 | 4/2015 |
| WO | WO-2016/009231 A1 | 1/2016 |

OTHER PUBLICATIONS

Ekiz. Synthesis and Characterization of Cross-Linked Waterdispersible Conjugated Polymer Nanoparticles. Thesis. Published by Bilkent University. Apr. 2012. Retrieved from: http://repository.bilkent.edu.tr/handle/11693/15828 on Mar. 5, 2021 (Year: 2012).*

Vusala et al., "Facile Synthesis of Cross-Linked Patchy Fluorescent Conjugated Polymer Nanoparticles by Click Reactions," Polym. Chem., 2:2818-2824 (2011).

Wu et al., "Synthesis and Characterization of Spiro-Linked Poly(terfluorene): a blue-emitting polymer with controlled conjugated length," Journal of Materials Chemistry, 12(1):2893-2897 (2002).

Behrendt et al., "Hybrid inorganic-organic composite nanoparticles from crosslinkable polyfluorenes," Journal of Materials Chemistry C, 1: 3297-3304 (2013).

Behrendt et al., "Fluorescent nanoparticles from PEGylated polyfluorenes," Polymer Chemistry, 4: 1333-1336 (2013).

Marsitzky et al., "Amorphous Poly-2, 7-fluorene Networks," Chem. Mater., 13: 4285-4289 (2001).

Moon et al., "Organic Sol-Gel Synthesis of Microporous Molecular Networks Containing Spirobifluorene and Tetraphenylmethane Nodes," Journal of Polymer Science, Part A, Polymer Chemistry, 51: 1758-1766 (2013).

Park et al., "White-Emitting Conjugated Polymer Nanoparticles with Cross-Linked Shell for Mechanical Stability and Controllable Photometric Properties in Color-Conversion LED Applications," ACS Nano, 5(4): 2483-2492 (2011).

Park et al., "Pattern Formation of Silver Nanoparticles in 1-, 2-, and 3D Microstructures Fabricated by a Photo- and Thermal Reduction Method," Advanced Functional Materials, 20: 2296-2302 (2010).

Patra et al., "Fluoresecent nanoparticles based on a microporous organic polymer network: fabrication and efficient energy transfer to surface-bound dyes," ChemComm, 47: 9612-9614 (2011).

Schmidt et al., "Microporous Conjugated Poly(thienylene arylene) Network," Advanced Materials, 21: 702-705 (2009).

Sun et al., "Toward High Molecular Weight Triphenylamine-Based Hyperbranched Polymers," Macromolecules, 38: 2651-2658 (2005).

Wang et al., "Synthesis and Characterization of Highly Stable Blue-Light-Emitting Hyperbranced Conjugated Polymers," Journal of Polymer Science, Part A, Polymer Chemistry, 46: 790-802 (2008).

Xin et al., "Hyperbranced Oxadiazole-Containing Polyfluorenes: Toward Stable Blue Light PLEDS," Macromolecules, 38: 6755-6758 (2005).

Zhang et al., "Preparation of Chiral and Fluorescent Nanoparticles of Hyperbranched Conjugated Polymers By The Solvent Chirality Transfer Technology," College of Chemistry, Chemical Engineering and Materials Science, Soochow University, Suzhou 215123, 4: 426-435 (2013).

* cited by examiner

NANOPARTICLES FOR USE IN LIGHT EMITTING APPLICATIONS

RELATED APPLICATIONS

This application is a § 371 national-stage application based on Patent Cooperation Treaty Application serial number PCT/EP2017/051012, filed Jan. 18, 2017, which claims the benefit of priority to United Kingdom Patent Application No. GB1601007.6, filed on Jan. 19, 2016.

The present invention relates to nanoparticles for use in light emitting devices, such as, for example, light emitting diodes (LEDs) and optoelectronic displays.

BACKGROUND OF THE INVENTION

Light-emitting devices, such as, for example, light emitting diodes (LEDs) and optoelectronic displays, are becoming increasingly important in many forms of modern day lighting, including various forms of household lighting, automobile lights, traffic signals, liquid crystal display (LCD) backlighting and display screens.

LED devices are typically made from inorganic solid-state compound semiconductors, such as AlGaAs (red), AlGaInP (orange-yellow-green), and AlGaInN (green-blue). However, it is not possible to provide LEDs that emit white light or light of other desired colours by mixing conventional solid-state LEDs of different frequencies.

One method to facilitate colour mixing involves the use a combination of phosphorescent and/or fluorescent materials which are placed on top of the solid-state LED whereby the light from the LED (the "primary light") is absorbed by the phosphorescent and/or fluorescent material and then re-emitted at a different wavelength (the "secondary light"), i.e. the phosphorescent and/or fluorescent materials down convert the primary light to the secondary light.

Current materials used in down converting applications absorb UV or blue light and convert it to longer wavelengths, with most phosphors currently using trivalent rare-earth doped oxides or halophosphates. White emission can be obtained by blending phosphors which emit in the blue, green and red regions with that of a blue or UV emitting solid-state device. White LEDs can also be made by combining a blue LED with a yellow phosphor, however, colour control and colour rendering is poor when using this methodology due to lack of tunability of the LEDs and the phosphor. Moreover, conventional LED phosphor technology uses down converting materials that have poor colour rendering (i.e. colour rendering index (CRI)<75). In addition, materials that absorb UV-component of sun-light and remit visible-light of desired wavelength could be used in horticulture to promote plant growth and increase photovoltaic solar cell efficiency.

Quantum dots (ODs) have previously shown promise in a number of applications, including their use in light emitting devices, such as, for example, light emitting diodes (LEDs) and optoelectronic displays and the like. WO2012/164284 discloses the use of QDs in light emitting devices, such as LEDs.

However, one major drawback is that QDs typically comprise heavy metal species (e.g. cadmium and lead), which are toxic and require careful handling during manufacture and are subject to use is restrictions in certain territories, or they are critical raw materials (e.g. rare earth elements, indium), which are often scarce and subject to strict supply and export controls in certain territories. There is therefore a need for readily available and less-toxic alternatives.

There is, therefore, a need for further improved light emitting devices that avoid the use of QDs and overcome the drawbacks associated with conventional approaches.

The present invention was devised with the foregoing in mind.

SUMMARY OF THE INVENTION

According to a first aspect of the present invention there is provided a resin suitable for use in the fabrication of a light emitting device, the resin comprising a plurality of nanoparticles dispersed in an encapsulation medium, wherein the nanoparticles are photoluminescent conjugated polymer nanoparticles formed from a π-conjugated cross-linked polymer, the π-conjugated cross-linked polymer comprising
  a) 80-99.9 mol. % of π-conjugated monomers, and
  b) 0.1-20 mol. % of a cross-linker having the formula I shown below:

wherein
$Z_1$ and $Z_2$ are monomeric moieties, and
Y is absent, a bond, or a linking group.

The nanoparticles may be dispersed in the resin as discrete particles or, alternatively, the particles may be formulated into a carrier or incorporated into a larger bead or particle prior to dispersion within the resin.

According to a second aspect of the invention there is provided a light emitting device comprising a resin as defined herein and a primary light source configured to illuminate the resin.

According to a third aspect of the present invention, there is provided a method of forming a resin as defined herein, the method comprising the steps of:
  (i) dispersing the nanoparticles within a precursor encapsulation medium;
  (ii) curing or extruding the precursor encapsulation medium to form the transparent encapsulation medium.

According to a fourth aspect of the present invention, there is provided a resin as defined herein or a light emitting device as defined herein obtainable, obtained, or directly obtained, by any method defined herein.

According to a fifth aspect of the present invention, there is provided a use of a resin as defined herein in the fabrication of a light emitting device.

DETAILED DESCRIPTION OF THE INVENTION

Definitions

Unless otherwise stated, the following terms used in the specification and claims have the following meanings set out below.

References herein to the "Stille reaction" (also known as Stille coupling) refer to a well-known chemical reaction coupling involving an organotin compound with an sp²-hybridized organic halide catalyzed by palladium. The reaction is widely used in organic synthesis. The use of Stille polymerisation reactions for the production of conjugated polymer systems is described in, for example, Chem. Rev. 2011, 111, 1493-1528. The general reaction scheme is shown below:

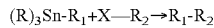

wherein

R is a hydrocarbyl substituent group, such as (1-6C)alkyl;
$R_1$ and $R_2$ are both monomeric units to be coupled; and
X is reactive group, typically a halide, such as Cl, Br, I, or a pseudohalide, such as a triflate, $CF_3SO_3-$.

References to the "Suzuki reaction" refer to the well-known organic reaction of an aryl- or vinyl-boronic acid with an aryl- or vinyl-halide. Suzuki reactions are typically catalyzed by a palladium(0) complex catalyst. This reaction is well known in the chemical field and follows the general reaction scheme shown below:

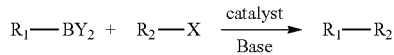

The reaction also works with pseudohalides, such as triflates (OTf), instead of halides. Boronic esters and organotrifluoroborate salts may be used instead of boronic acids. For polymer synthesis, $R_1$ and $R_2$ will represent monomeric units.

The term "hydrocarbyl" includes both straight and branched chain alkyl, alkenyl and alkynyl groups.

The term "alkylene" includes both straight and branched chain alkylene groups. References to individual alkylene groups such as "propylene" are specific for the straight chain version only and references to individual branched chain alkylene groups such as "isopropylene" are specific for the branched chain version only. For example, "(1-20C)alkylene" includes (1-14C)alkylene, (1-12C)alkylene, propylene, isopropylene and t-butylene. A similar convention applies to other radicals mentioned herein.

The terms "alkenylene" and "alkynylene" include both straight and branched chain alkenyl and alkynyl groups.

The term "aryl" is used herein to denote phenyl, naphthalene or anthracene ring. In an embodiment, an "aryl" is phenyl or naphthalene, and particularly is phenyl.

The term "heteroaryl" or "heteroaromatic" means an aromatic mono-, bi-, or tricyclic ring incorporating one or more (for example 1-4, particularly 1, 2 or 3) heteroatoms (for example N, O, P, S, Si, Ge, As or Se). Examples of heteroaryl groups are monocyclic, bicyclic and tricyclic groups containing from five to eighteen ring members. The heteroaryl group can be, for example, a 5- or 6-membered monocyclic ring, a 8-, 9- or 10-membered bicyclic ring or a 15-, 16-, 17- or 18-membered tricyclic ring. Suitably each ring in a bicyclic or tricyclic ring system comprises five or six ring atoms.

The term "cross-linked" used herein in relation to polymers does not encompass linear or hyperbranched polymers. The polymeric "branches" of hyperbranched polymers all emanate from a single focal point. In contrast, the polymeric strands of the cross-linked polymers forming part of the invention do not all converge to a single focal point. Rather, the strands of the cross-linked polymers forming part of the invention are randomly cross-linked to one another throughout polymer, with none of the cross-linking sites representing a single focal point in the sense of hyperbranched polymers. Furthermore, 4 or more polymeric chains emanate from a given cross-linking site within the polymers forming part of the invention, whereas the single focal point (or other branch points) within a hyperbranched polymer is only 3 coordinate. Moreover, the cross-linked polymers forming part of the invention are cross-linked to the extent that they are insoluble in all solvents (including aqueous, organic, polar and non-polar solvents), whereas hyperbranched polymers are commonly soluble.

The Formulations of the Invention

As discussed hereinbefore, the present invention provides a resin suitable for use in the fabrication of a light emitting device, the resin comprising a plurality of nanoparticles dispersed in a transparent encapsulation medium, wherein the nanoparticles are photoluminescent conjugated polymer nanoparticles formed from a π-conjugated cross-linked polymer, the π-conjugated cross-linked polymer comprising/consisting essentially of/consisting of:

a) 80-99.9 mol. % of π-conjugated monomers, and
b) 0.1-20 mol. % of a cross-linker having the formula I shown below:

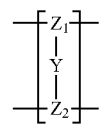

(I)

wherein $Z_1$ and $Z_2$ are monomeric moieties, and
Y is absent, a bond, or a linking group.

The resin of the present invention can be incorporated into a light emitting device, such as, for example, a LED or optoelectronic display, in place of the fluorescent and/or phosphorescent materials that are currently used to absorb primary light and re-emit secondary light of different wavelengths. The nanoparticles present in the resin absorb primary light from a primary light source (or a proportion thereof), which is typically a UV or blue light source, and re-emit secondary light of varying wavelengths. The amount and nature of the nanoparticles incorporated into the resin can be selected so as to control the colour and intensity of the secondary light emitted.

It will be appreciated by those skilled in the art that light of different colours can be prepared by the selection of the relative amounts of visible light of different wavelengths that is emitted from the nanoparticles of the present invention. For example, the nanoparticles may emit red, green and/or blue light in different proportions from the device.

It will also be appreciated that the overall light emitted from the light emitting device may consist of just the light emitted from the nanoparticles, i.e. just the secondary light, or it may consist of a mixture of light emitted from the nanoparticles and light emitted from the primary light source, i.e. it is a mixture of the primary and secondary light.

Colour mixing can be achieved by either blending nanoparticles together that emit visible light of different desired wavelengths, or by varying the monomeric composition of the polymeric nanoparticles such that a single nanoparticle can emit more than one wavelength of light, optionally in different proportions.

In a particular embodiment of the invention, the nanoparticles absorb the primary light from a primary light source and re-emit white light. The white light may be formed in a number of ways. For example, the nanoparticles may absorb all of the primary light and emit a mixture of red, green and blue light (which collectively forms the perception of white light), or the nanoparticles may emit yellow and blue light (which collectively forms the perception of white light), or nanoparticles may emit white light (i.e. a broad spectrum of visible light wavelengths, which collectively form the perception of white light). Alternatively, when the primary light is blue light, some of which transmits through the resin, and the nanoparticles may either emit: (i) red and green light (which collectively forms the perception of white light from the device when mixed with the primary blue light); (ii) yellow light (which collectively forms the perception of white light from the device when mixed with the primary blue light); or (iii) the particles may emit a range of visible wavelengths which, collectively with the primary light, form white light.

In the some of the aforementioned alternatives, the nanoparticles may need to emit white, red, green, blue and/or yellow light or a broad range of visible light wavelengths. This can be achieved by blending different polymeric nanoparticles that emit different coloured light together (e.g. nanoparticles that emit red, green, blue, yellow or white light (i.e. a broad range visible wavelengths which collectively form the perception of white light) in the resin in appropriate quantities, or by using a single nanoparticle formed from a π-conjugated cross-linked polymer in which the monomers are selected to provide nanoparticles that emit light of different wavelengths (e.g. red, green, blue, yellow or white light emission as the case may be) from a single nanoparticle.

In embodiments where the primary light source emits blue light, a proportion of the blue light may transmit through the resin in the light emitting device and the "primary" blue light that transmits through can be combined with either: (i) red, green and optionally some additional blue light from nanoparticles dispersed within the resin to collectively form white light or (ii) yellow light which again forms the perception of white light together with the blue light transmitted through the resin. In such embodiments, the emission of white light can be achieved by blending red, green, yellow and/or optionally blue light emitting nanoparticles into the resin in appropriate quantities, or by using a single nanoparticle formed from a π-conjugated cross-linked polymer in which the monomers are selected to provide a balance of red, green, yellow and/or optionally blue light emission (from a single nanoparticle).

The Nanoparticles

As indicated above, the nanoparticle is formed from a π-conjugated cross-linked polymer, the π-conjugated cross-linked polymer comprising/consisting essentially of/consisting of:
a) 80-99.9 mol. % of π-conjugated monomers, and
b) 0.1-20 mol. % of a cross-linker having the formula I shown below:

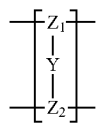

(I)

wherein
$Z_1$ and $Z_2$ are monomeric moieties, and
Y is absent, a bond, or a linking group.

The nanoparticles utilised in the conjugates of the present invention offer a number of advantages when compared with the state of the art. Principally, the nanoparticles are formed from π-conjugated cross-linked polymers. The π-conjugated cross-linked polymers themselves comprise a backbone of π-conjugated monomeric units, with cross-linking moieties interspersed along the π-conjugated backbone. The structure of the cross-linking moieties is such that one monomer spans two polymeric backbone chains. Therefore, during assembly of the polymer, the incorporation of the cross-linking moieties into the π-conjugated backbone chain provides a direct site for the propagation of a further π-conjugated backbone chain on both sides of the cross-linking moiety. Hence, the cross-links in the polymers forming the present nanoparticle compositions are formed in-situ during linking of the monomer units, meaning that the degree of cross-linking can be readily adjusted simply by varying the concentration of cross-linker. In contrast to this direct, in-situ formation of cross-links discussed above, prior art CPNs have focused on the preparation of polymers formed from monomers having specially-modified pendant side chains that are amenable to cross-linking under certain conditions. Whilst being a viable method, such an approach necessarily requires the initial step of forming the polymer backbone chains prior to placing the backbone chains under suitable conditions to induce cross-linking between them. This multi-step approach is more complex than that used to prepare the polymers forming the present compositions, and the degree of cross-linking between the polymeric chains is notably more difficult to control.

Aside from manufacturing simplicity and tunability, the π-conjugated cross-linked polymers forming part of the invention lend themselves to obtaining nanoparticle compositions exhibiting significantly higher levels of purity. The insoluble cross-linker renders the nanoparticle composition insoluble in water and organic solvents, such that the π-conjugated cross-linked polymers exhibit swelling when brought into contact with a solvating solvent. Swelling the polymers in this manner allows impurities trapped within the polymeric network, such as catalysts and other reagents, to be easily removed by washing. Unlike prior art compositions, the resulting high purity photoluminescent nanoparticle compositions are therefore highly suitable for use in light emitting devices.

Having regard to formula I, $Z_1$ is able to polymerise with π-conjugated polymer and aromatic monomers so as to form a first polymeric chain. $Z_2$ is able to polymerise with π-conjugated polymer and aromatic monomers so as to form a second polymeric chain, adjacent to the first polymeric chain, thereby linking together two adjacent polymeric chains. Accordingly, $Z_1$ and $Z_2$ may independently be selected from any of the examples of the moieties forming part or all of the monomers that are defined herein. In an embodiment, $Z_1$ and $Z_2$ are π-conjugated. In another embodiment, $Z_1$ and $Z_2$ are aromatic.

Still having regard to formula I, it will be appreciated that $Z_1$ and/or $Z_2$ may have more than 2 covalent attachment points (for attaching to the π-conjugated monomers). For example $Z_1$ and/or $Z_2$ may have 3 covalent attachment points.

Still having regard to formula I, Y may be any suitable linker group, and may be π-conjugated or non-π-conjugated. Exemplary linker groups include an atom (e.g. O, S), a metal (e.g. Ir, Pt, Rh, Re, Ru, Os, Cr, Cu, Pd, Au) or other group (e.g. —SiR$_2$—, —CH=CH—, —C$_6$H$_4$—). When Y is a bond, it may be a single or double bond. When Y is absent, $Z_1$ is directly linked to $Z_2$, e.g. $Z_1$ is fused to $Z_2$ or is connected thereto by a common (shared) spiro carbon atom.

The cross-linker of formula (I) may take a variety of forms. In particular, Y may be absent, a bond, or a linking group.

Where Y is absent (and $Z_1$ and $Z_2$ are linked directly to each other), the cross-linker may have a structure according for formula (Ia) below:

(Ia)

Examples of such cross-linkers include, but are not limited

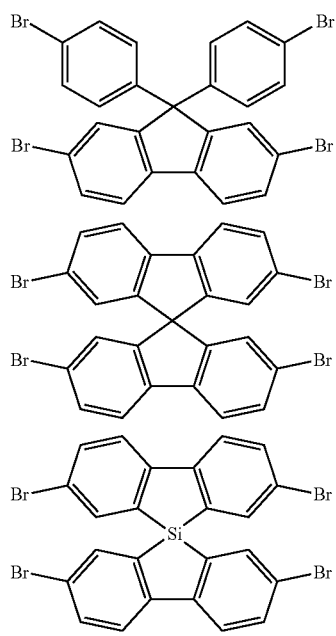

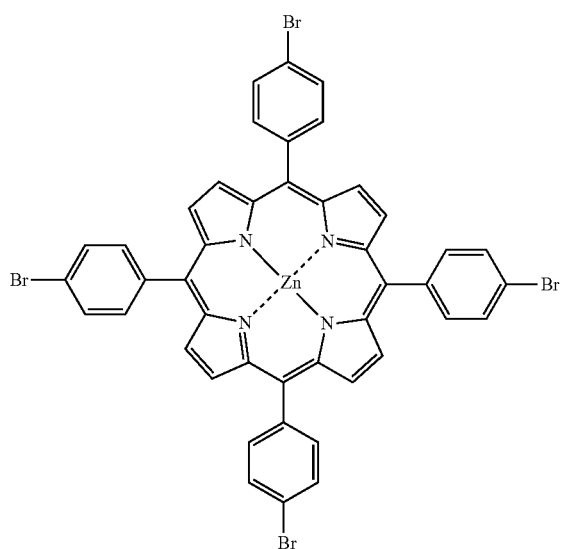

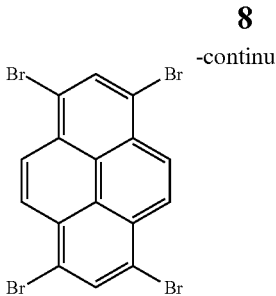
-continued

In such embodiments, $Z_1$ may be directed connected to $Z_2$ in the sense that $Z_1$ is fused to $Z_2$, or $Z_1$ and $Z_2$ share one or more common atoms.

Where Y is a bond (single or double), the cross-linker may have a structure according for formula (Ib) below:

(Ib)

Examples of such cross-linkers include, but are not limited to:

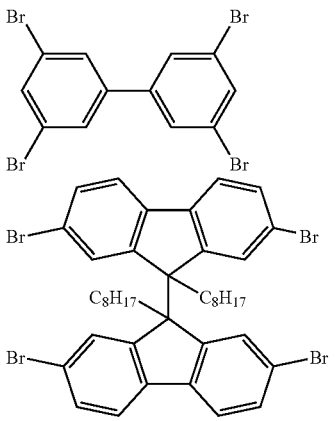

Where Y is a linking group, the linking group may be π-conjugated or non-π-conjugated. Examples of cross-linkers having π-conjugated linking groups include, but are not limited to:

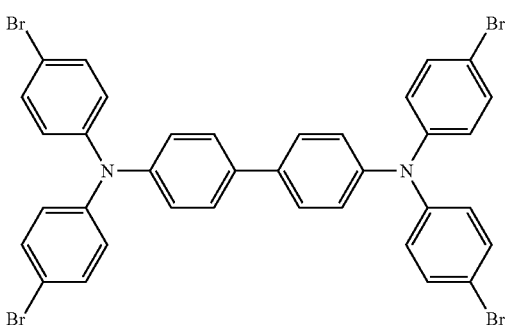 [SMILES: Brc1ccc(N(c2ccc(Br)cc2)c2ccc(-c3ccc(N(c4ccc(Br)cc4)c4ccc(Br)cc4)cc3)cc2)cc1]

Examples of cross-linkers having non-π-conjugated linking groups include, but are not limited to:

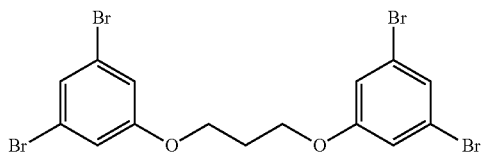

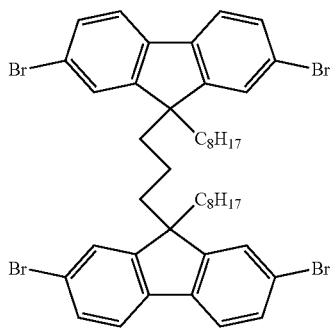

In certain embodiments, where Y is a linking group, the linking group may comprise additional monomeric moieties, $Z_n$. In such embodiments, Y may have a structure according to formula (A) below:

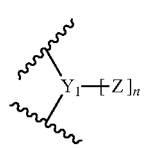

(A)

wherein $Y_1$ is a linking group as defined herein;
Z is a monomeric moiety and is as defined for $Z_1$ or $Z_2$ defined herein; and
n is 1 or more (e.g. 1 or 2).
In an embodiment, n is 1, and the cross-linker may have a structure according to formula (Ic) below:

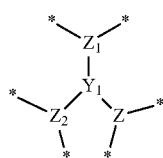

(Ic)

Where $Y_1$ is a π-conjugated linking group, exemplary cross-linkers of this type include, but are not limited to:

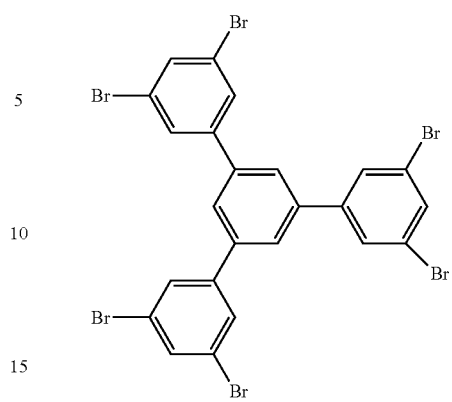

Alternatively, where $Y_1$ is an atomic linking group, exemplary cross-linkers of this type include, but are not limited to:

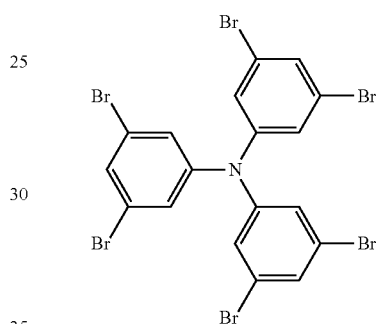

Alternatively, the cross-linker of formula (Ic) may have a different number of covalent attachment points (for attaching to the π-conjugated monomers). For example, the cross-linker may contain 5, 7, 8 or 9 covalent attachment points, as illustrated below:

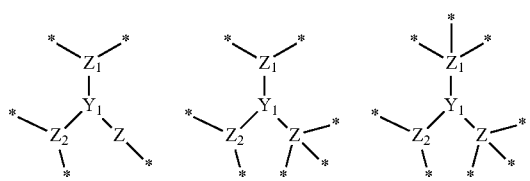

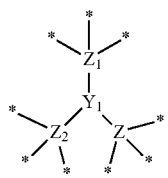

In another embodiment, each of monomeric moieties $Z_1$ and $Z_2$ may be bonded to Y by two separate bonds. Cross-linkers of this type may have a structure according to formula (Id) shown below:

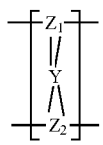
(Id)

In an embodiment, where Y is as defined in formula A, the cross-linker may have a structure according to formula (Id') below:

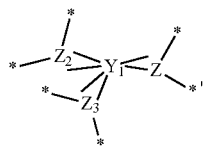
(Id')

wherein $Y_1$ is a linking group as defined herein; and
Z is a monomeric moiety and is as defined for $Z_1$ or $Z_2$ defined herein.

Where $Y_1$ is an atomic linking group, exemplary cross-linkers of this type include, but are not limited to:

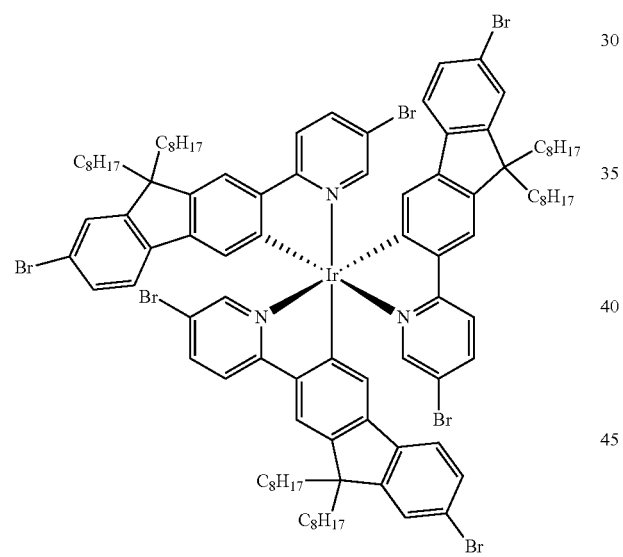

Alternatively, the cross-linker of formula (Id') may have a different number of covalent attachment points (for attaching to the π-conjugated monomers). For example, the cross-linker may contain 4 (wherein Z carries no covalent attachment points), 5, 7, 8 or 9 covalent attachment points.

In an embodiment, Y is as defined in formula (A) and n is 2. In such embodiments, the cross-linker may have a structure according to formula (Ie) below:

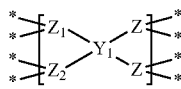
(Ie)

wherein $Y_1$ is a linking group as defined herein; and
each Z is independently a monomeric moiety and is as defined for $Z_1$ or $Z_2$ defined herein.

Where $Y_1$ is a non-π-conjugated linking group, examples of such cross-linkers include, but are not limited to:

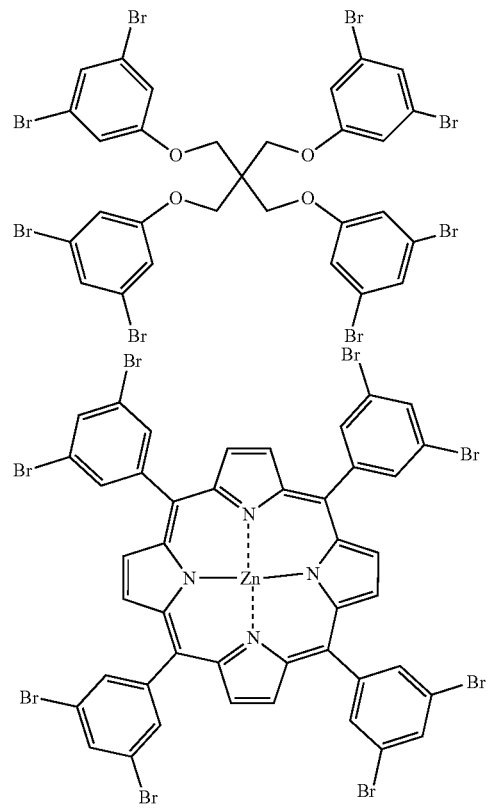

In an embodiment, the nanoparticles comprise identical cross-linkers, or a plurality of different cross-linkers.

In another embodiment, when Y is a linking group, said linking group does not comprise additional monomeric moieties Z. In such embodiments, $Z_1$ and $Z_2$ are the only monomeric moieties present within the cross-linker.

In another embodiment, the cross-linker has the formula II shown below:

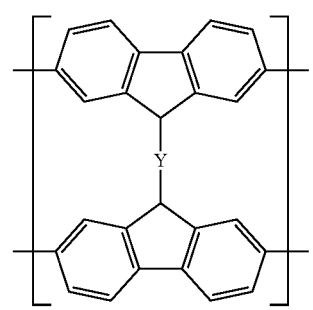
(II)

wherein
Y is absent, a bond, or a linking group.

In an embodiment, Y is absent, such that $Z_1$ is directly linked to $Z_2$, e.g. $Z_1$ is fused to $Z_2$ or is connected thereto by one or more common (shared) atoms (e.g. a spiro carbon atom). Suitably, $Z_1$, is connected to $Z_2$ by a common spiro carbon atom.

In another embodiment, the cross-linker has the formula III shown below:

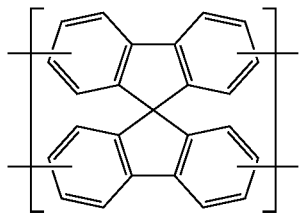

(III)

Suitably, the cross-linker has the following structure:

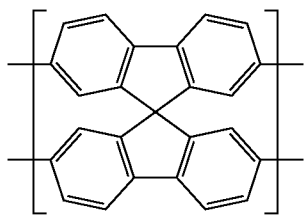

The nanoparticle composition comprises 80-99.9 mol. % of one or more π-conjugated monomers. Any suitable π-conjugated monomers capable of polymerising to form nanoparticles with desirable photoluminescent properties may be used.

In one embodiment, the π-conjugated polymers of the present invention do not comprise any carbon-carbon triple bonds. Thus, in one aspect, the present invention relates to π-conjugated cross-linked polymers that do not comprise any carbon-carbon triple bonds. The electrons in a carbon-carbon triple bond give rise to conformations in which the π-electrons are not fully delocalised.

It will be appreciated by those skilled in the art that the monomeric units used to form the cross-linked π-conjugated polymers may comprise a selection of different chemical moieties that either alone or in combination provide a monomer having a π-conjugated ring system.

It will also be appreciated by those skilled in the art that the π-conjugated polymer used to form the nanoparticles may further comprise one or more functional groups (e.g. hydroxyl, amino, carboxy or thiol groups).

Examples of suitable π-conjugated ring systems that may be present in the monomer units, either alone or in any suitable combination, include mono-cyclic aryl groups (e.g. phenyl rings), polycyclic aryl ring systems (e.g. fluorene ring systems, naphthyl rings), mono-cyclic heteroaryl rings (e.g. thiophene rings) or polycyclic heteroaryl ring systems (e.g. benzothiazole, benzodiazathazole rings, thieno[3,2-b]thiophene, or pyrrolo[3,4-c]pyrrole) or other conjugated heterocyclic rings systems (e.g. pyrrolo-pyrrole-1,4-dione rings), and wherein each moiety is optionally substituted by one or more organic groups, e.g. hydrocarbyl substituent groups optionally comprising 1 to 30 carbon atoms and optionally comprising one or more heteroatoms (e.g. N, O, P, S, Si, Ge, As or Se), and, where two or more of such moieties are present, they may be linked together by a bond or via an atom linkage (e.g. such as in a bi-arylamine or tri-arylamine group).

Further examples of particular moieties that may form part or all of the π-conjugated monomers include:

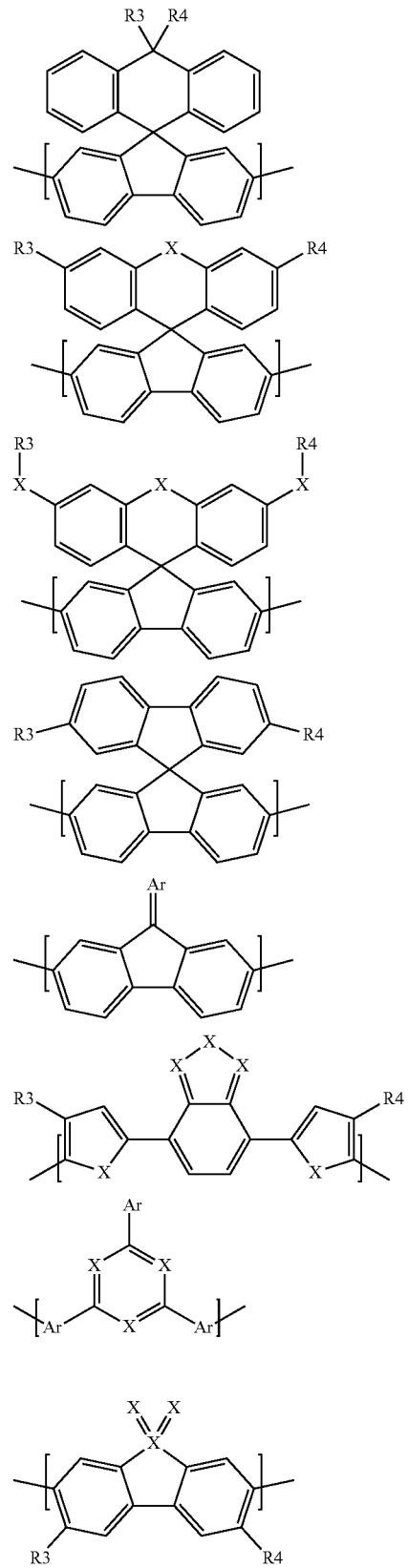

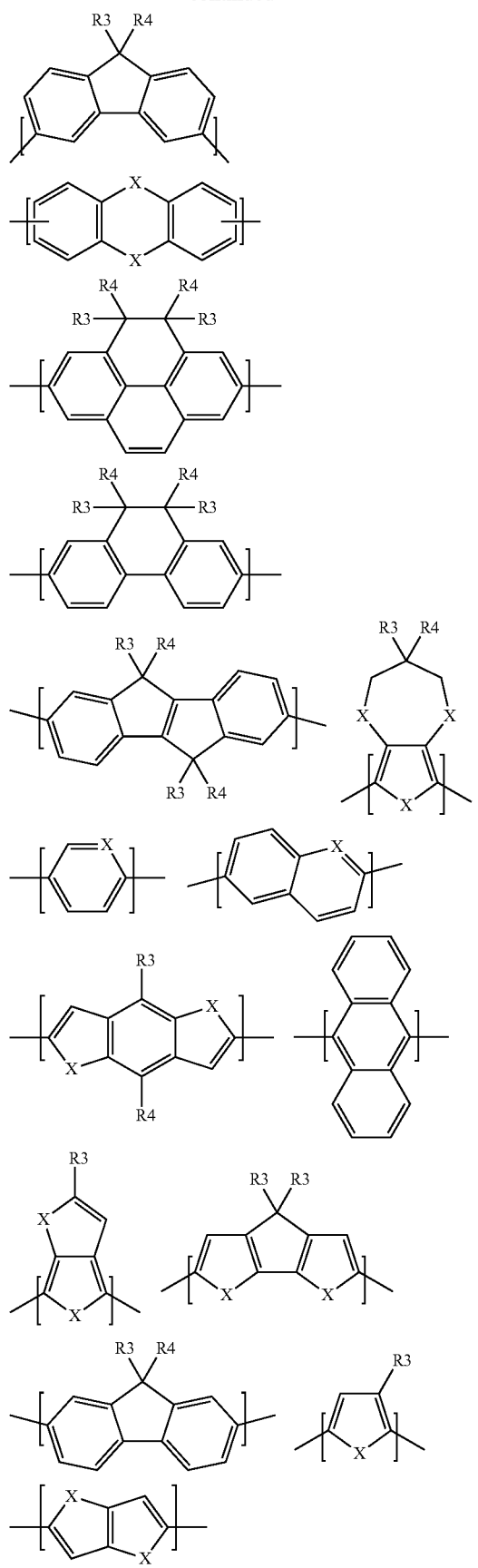
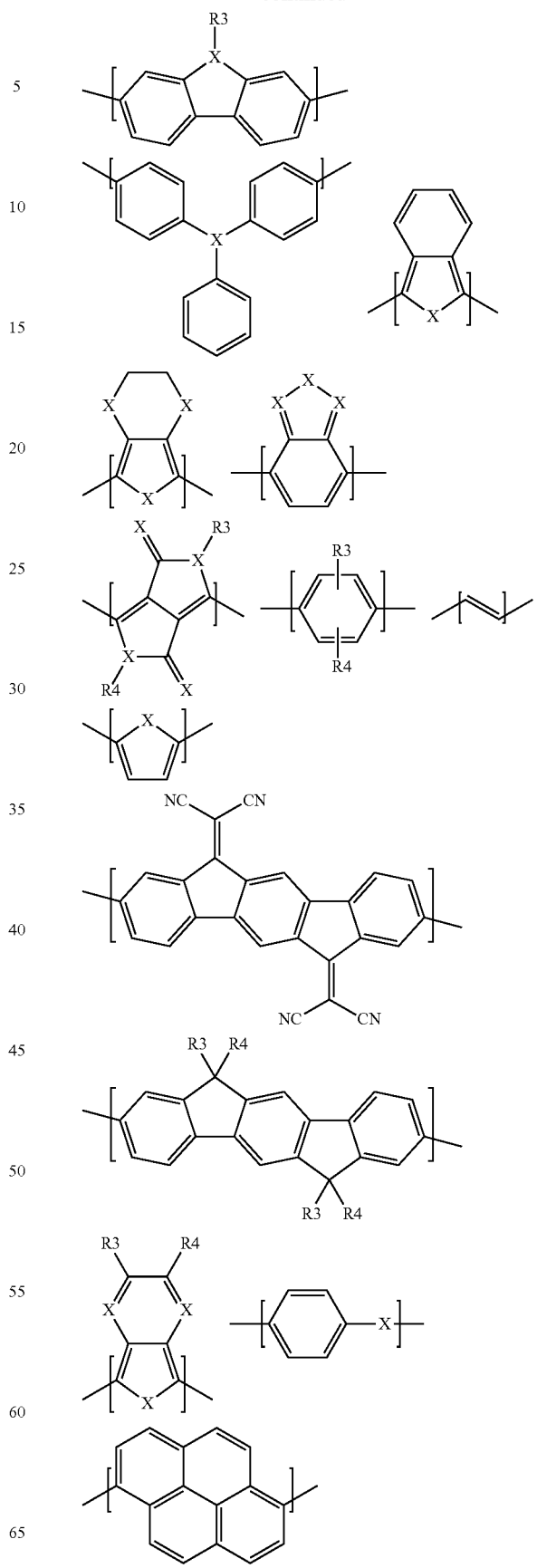

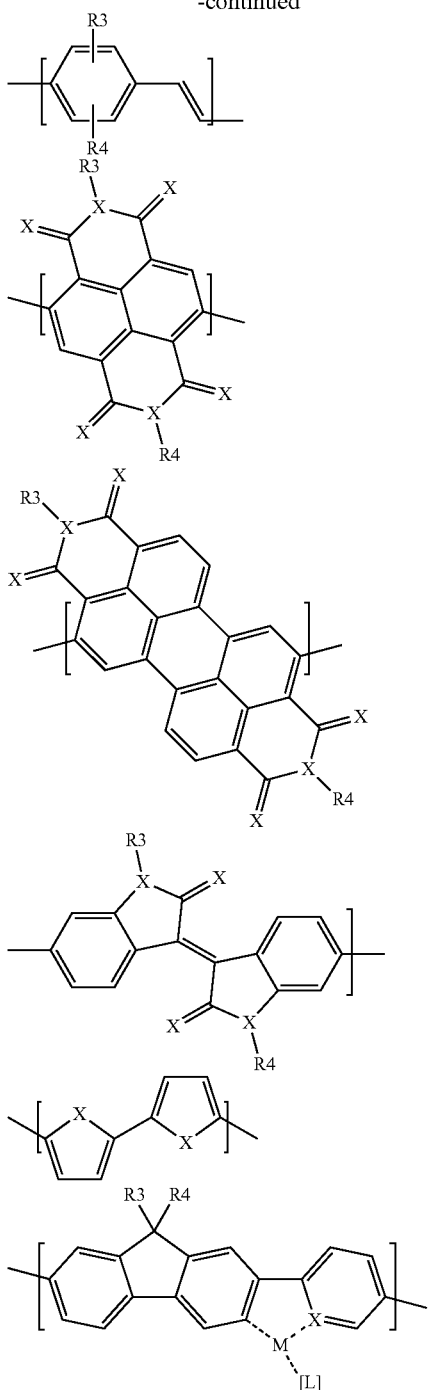

wherein
X is a heteroatom selected from N, O, P, S, Si, Ge, As or Se (especially N, O or S)
Ar is a cyclic or polycyclic group which is optionally a π-conjugated (e.g. fluorene);
$R_3$ and $R_4$ are each independently hydrogen or an organic substituent group (e.g. an optionally substituted hydrocarbyl substituent group optionally comprising 1 to 30 carbon atoms and optionally comprising one or more heteroatoms (e.g. N, O, P, S, Si, Ge, As or Se), or an optionally substituted aromatic or heteroaromatic group or a group $R_1$ or $R_2$ as defined herein);

M is a metal (e.g. Ir, Pt, Rh, Re, Ru, Os, Cr, Cu, Pd, or Au);
L is a ligand (e.g. a halide or a hydrocarbyl substituent group optionally comprising 1 to 30 carbon atoms and optionally comprising one or more heteroatoms (e.g. N, O, S, Si, or P) or an aromatic or heteroaromatic group);
and wherein each of the above structures is optionally further substituted with one or more organic substituent groups (e.g. a hydrocarbyl substituent groups optionally comprising 1 to 30 carbon atoms and optionally comprising one or more heteroatoms (e.g. N, O, P, S, Si, Ge, As or Se) or an aromatic or heteroaromatic group).

A particular example of the group $>X(=X)_2$ in the structures above is $>SO_2$.

In an embodiment, particular moieties that may form part or all of the π-conjugated monomers include any one of the following:

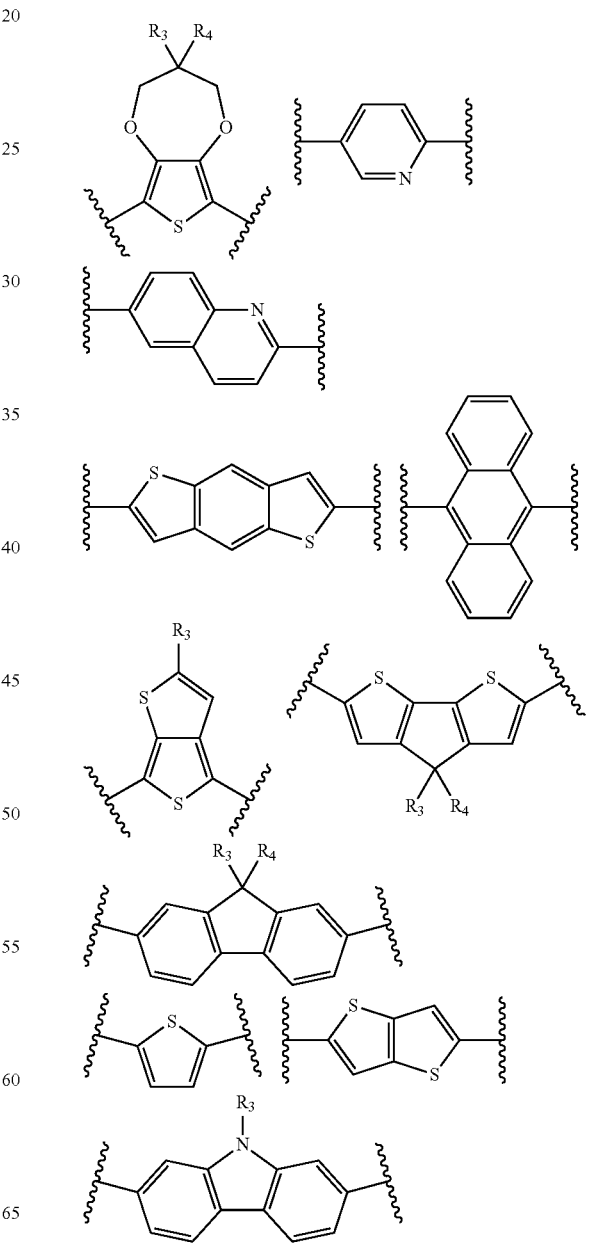

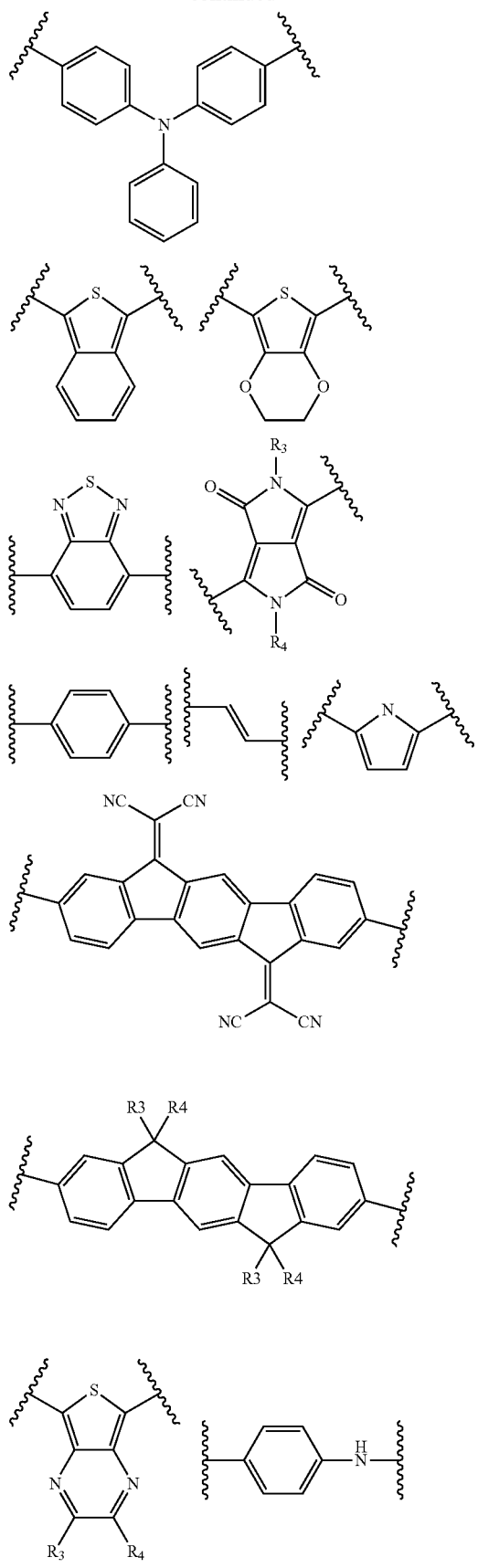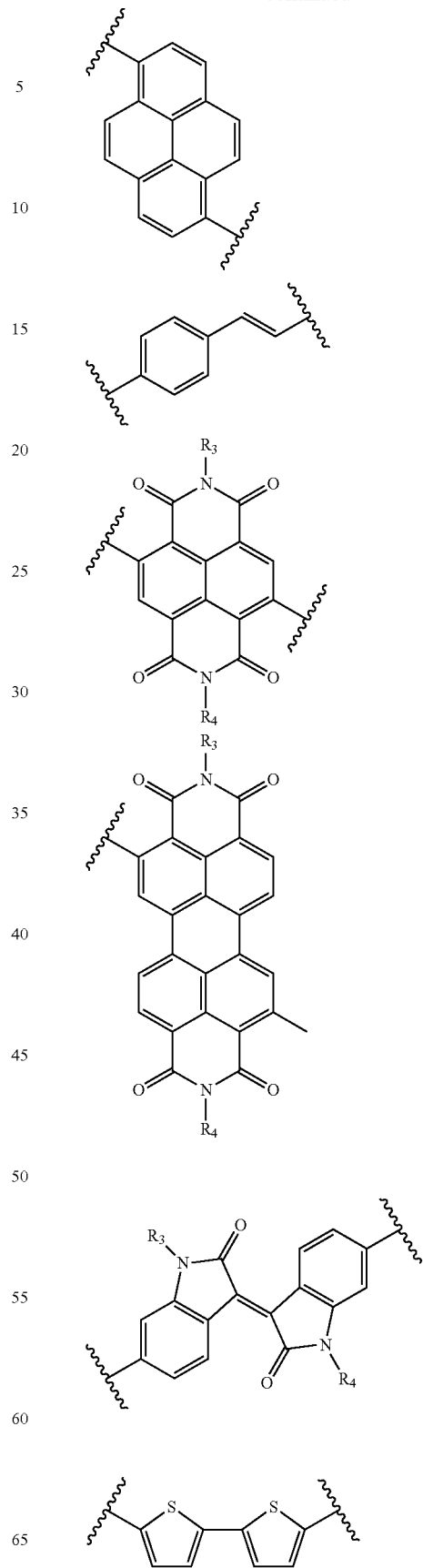

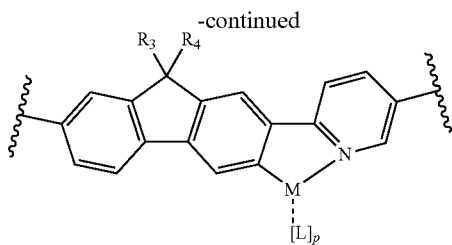

wherein M, L, p, R$_3$ and R$_4$ are as defined above.

In an embodiment, the π-conjugated monomers each independently comprise a moiety having the formula IV shown below:

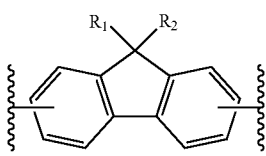

(IV)

wherein
R$_1$ and R$_2$ are each independently hydrogen or a group:

—X-Q wherein
X is absent selected from the group consisting of (1-30C)alkylene, —O-(1-30C)alkylene, —S-(1-30C)alkylene, —NH-(1-30C)alkylene, —N-[(1-30C)alkylene], (2-30C)alkenylene, (2-30C)alkynylene, —[(CH$_2$)$_2$—O]$_n$—, —[O—(CH$_2$)$_2$]$_n$— —[O—CH$_2$MeCH$_2$]$_n$—, —[CH$_2$MeCH$_2$—O]$_n$— and —[O—Si(R$_z$)$_2$]$_n$ (wherein R$_z$ is (1-4C)alkyl and n is 1 to 30), —[(CH$_2$)$_{n'}$—(CF$_2$)$_{m'}$]— (wherein n' is 0-20 and m' is 1 to 30) and Q is a terminal group selected from hydrogen, halogen, methyl, hydroxyl, carboxy, (1-4C)alkoxycarbonyl, amino, —C=CH$_2$, —C≡CH, —SH, —CF$_3$, OSO$_3$H, —SO$_3$H, —OPO$_2$OH and zwitterions (e.g. betaine), and a polymerisable group selected from acrylates, epoxy and styrene, or a salt thereof, or R$_1$ and R$_2$ are aryl or heteroaryl groups optionally substituted with a substituent group (e.g. one or more groups of formula —X-Q above);

or R$_1$ and R$_2$ are linked so that, together with the carbon atom to which they are attached, they form ring system (e.g. a phenyl or fluorene ring) optionally substituted with a substituent group (e.g. a group —X-Q defined above).

In another embodiment, π-conjugated monomers each independently have a structure defined by formula V shown below:

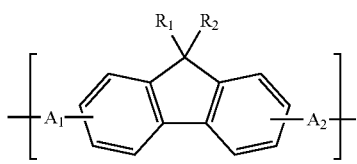

(V)

wherein
R$_1$ and R$_2$ are as defined hereinbefore;
A$_1$ and A$_2$ are absent or independently absent or selected from any one of the following moieties:

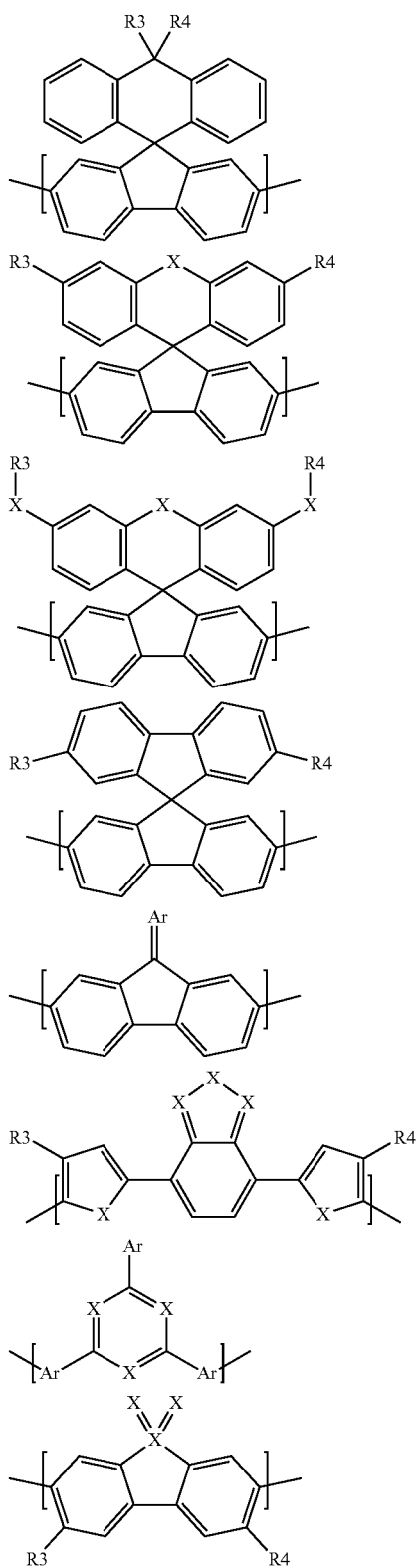

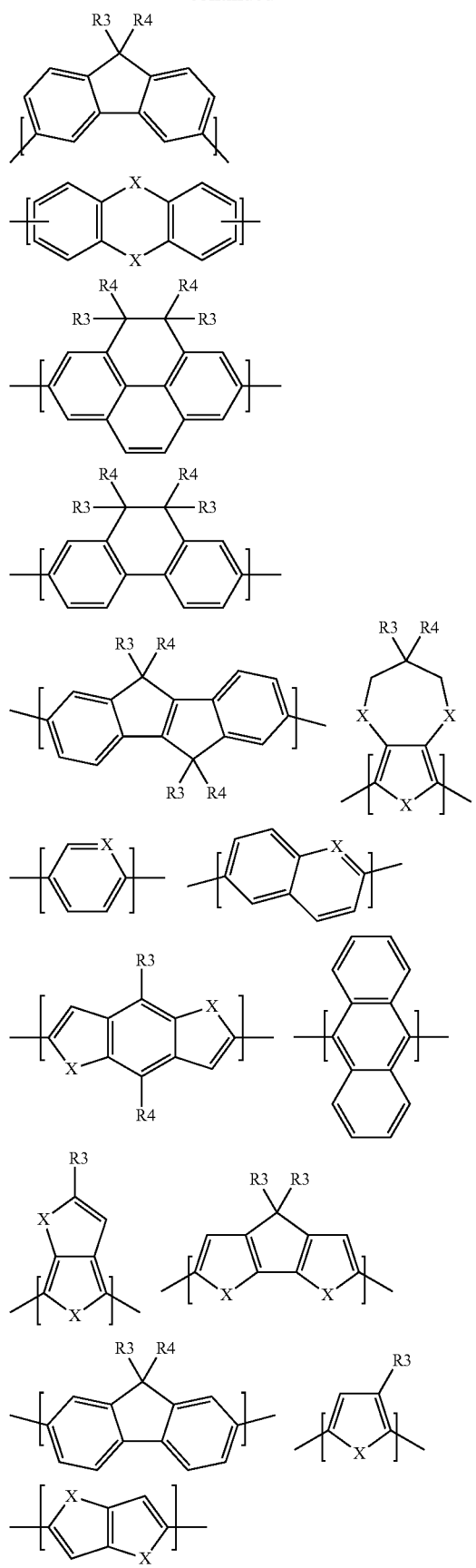
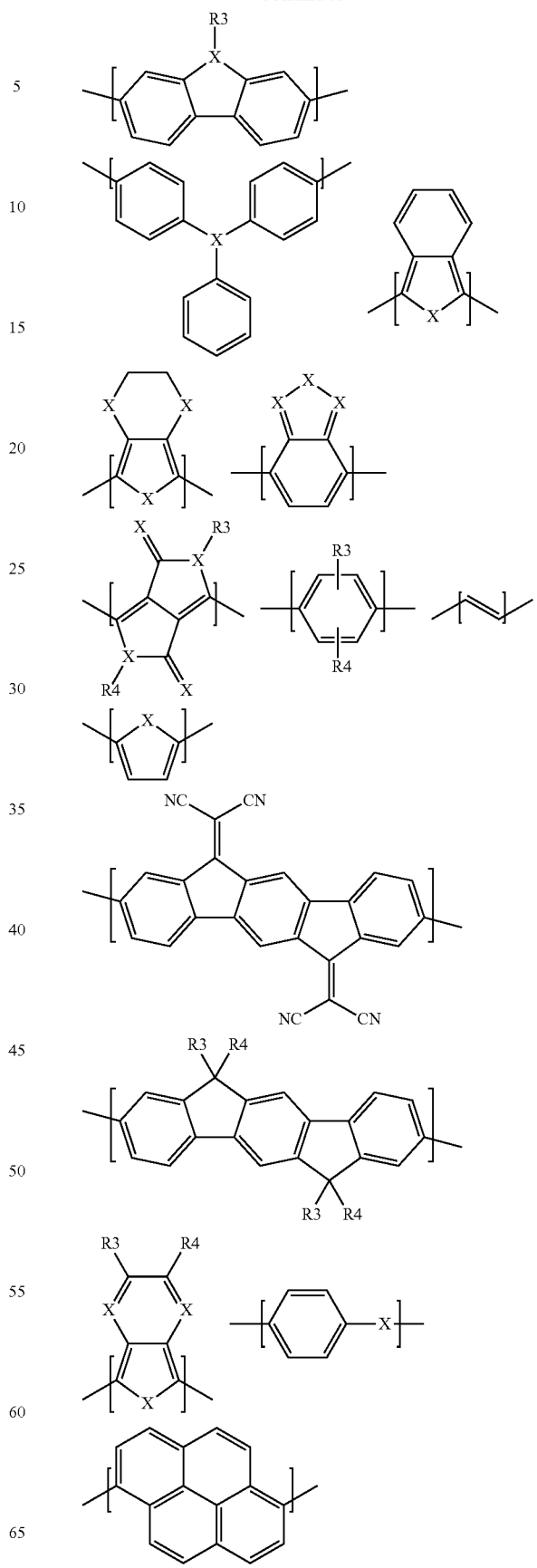

-continued

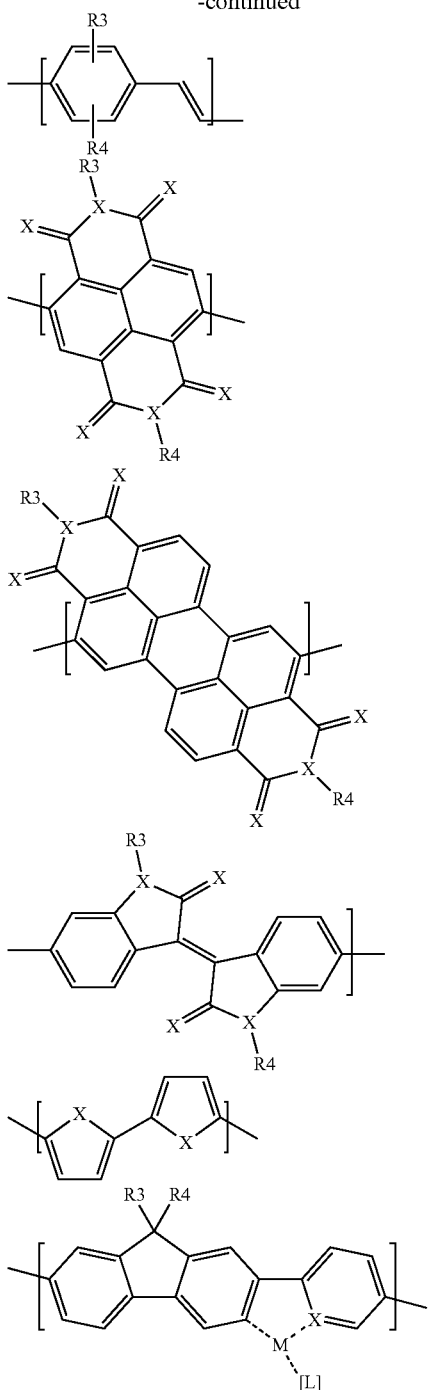

and wherein R₃ and R₄ are each as defined hereinbefore, or are groups R₁ and R₂ as defined herein, or are each independently hydrogen or a group:

—X¹-Q¹ wherein
X¹ is selected from the group consisting of (1-30C) alkylene, (2-30C)alkenylene, (2-30C)alkynylene, —[(CH₂)₂—O]ₙ—, —[O—(CH₂)₂]ₙ—, —[O—CH₂MeCH₂]ₙ—, —[CH₂MeCH₂—O]ₙ— and —[O—Si(Rz)₂]ₙ— (wherein Rz is (1-4C)alkyl and n is 1 to 30), —[(CH₂)ₙ′—(CF₂)ₘ′]— (wherein n' is 0-20 and m' is 1 to 30)

Q¹ is a terminal group selected from hydrogen, halogen, methyl, hydroxyl, carboxy, (1-4C)alkoxycarbonyl, amino, —C=CH₂, —C≡CH, —SH, —CF₃, OSO₃H, —SO₃H, —OPO₂OH and zwitterions (e.g. betaine) and a polymerisable group selected from acrylates, epoxy, silane, siloxane, alkene or styrene, or a salt thereof;

M is a metal selected from Ir, Pt, Rh, Re, Ru, Os, Cr, Cu, Pd and Au; L is a ligand independently selected from the group consisting of halo, (1-30C)hydrocarbyl optionally comprising one or more heteroatoms selected from N, O, S, Si, Ge, As or P, or an aryl or heteroaryl group optionally substituted with one or more substituents selected from (1-4C)alkyl, halo, aryl or heteroaryl;

X is a heteroatom selected from N, O, P, S, Si, Ge, As or Se (especially N, O or S)

Ar is a cyclic or polycyclic group which is optionally a π-conjugated (e.g. fluorene);

p is 1 to 4.

In another embodiment, A₁ and A₂ are absent or independently selected from any one of the following:

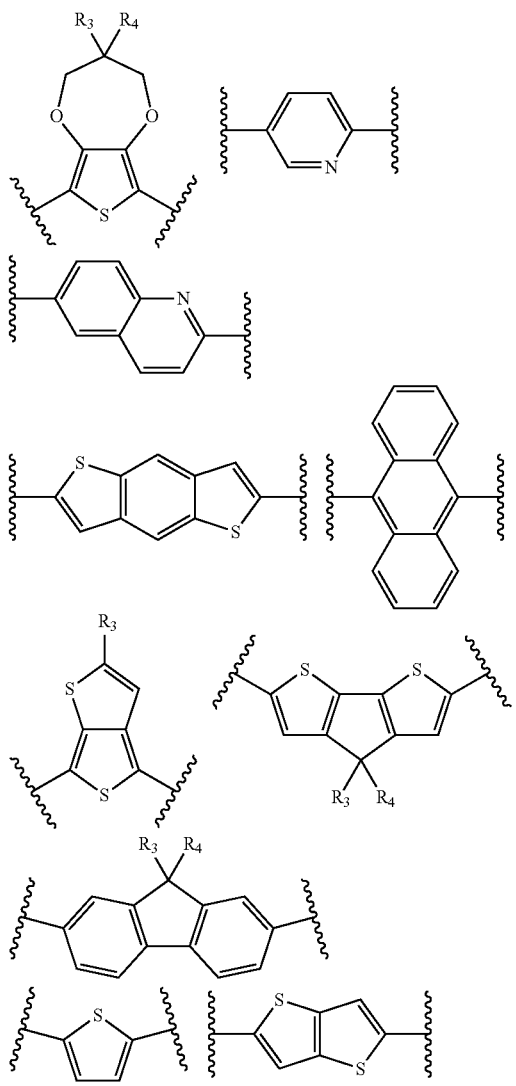

27
-continued
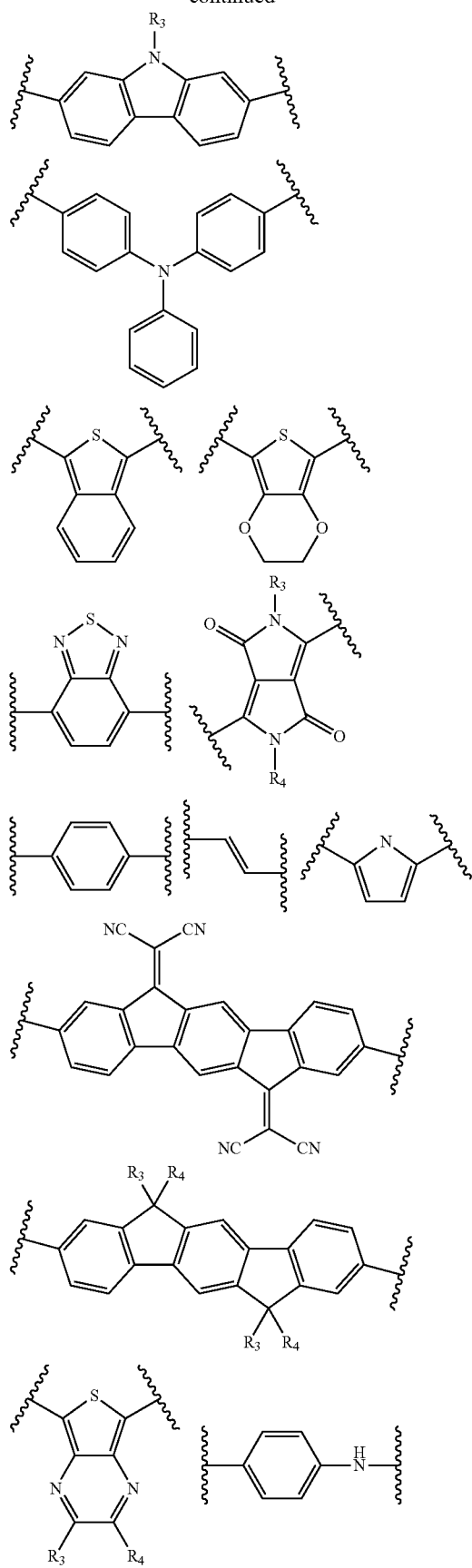
28
-continued
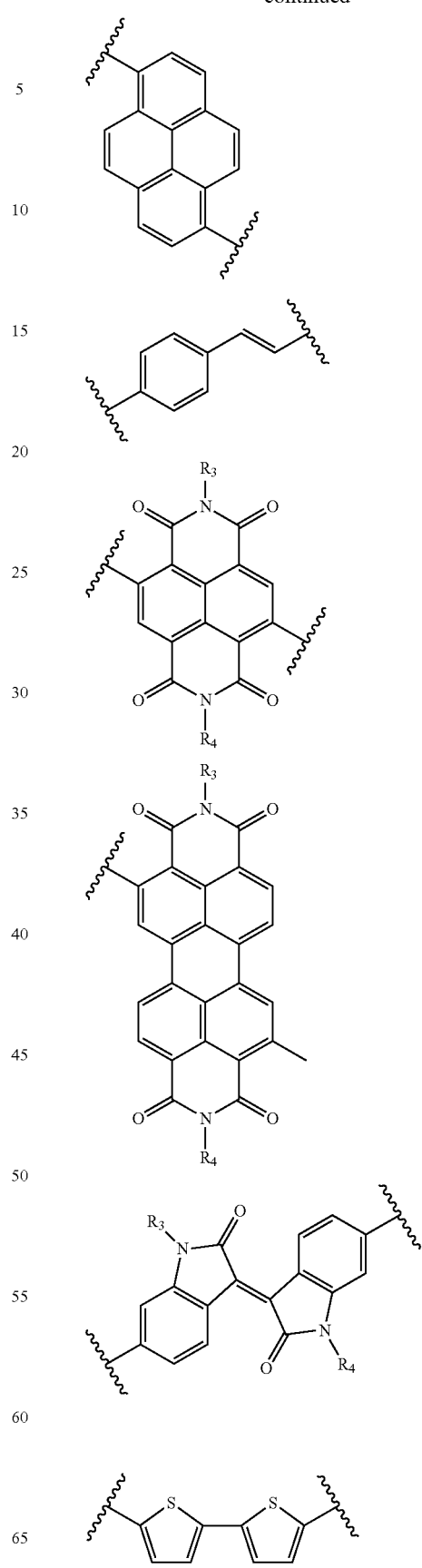

-continued

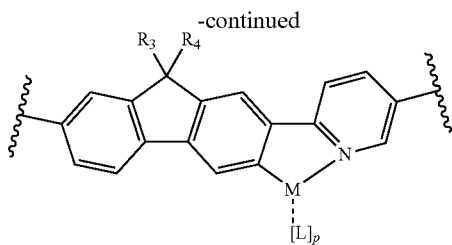

wherein M, L, p, $R_3$ and $R_4$ are each as defined above.

In another embodiment, the π-conjugated monomers each independently have a structure defined by formula VI below:

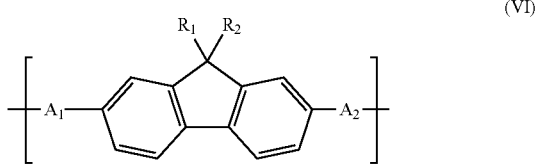

(VI)

$R_1$, $R_2$, $A_1$ and $A_2$ are as defined hereinbefore.

In another embodiment, $A_1$ and $A_2$ are independently absent or selected from any one of the following moieties:

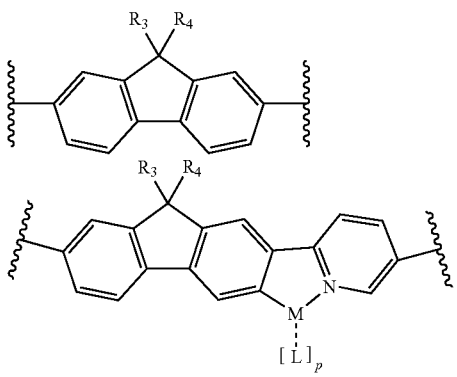

wherein $R_3$, $R_4$, M, L and p are as defined hereinbefore.

In another embodiment both $A_1$ and $A_2$ are absent.

In another embodiment, when present:

X and $X^1$ are independently selected from the group consisting of (1-30C)alkylene, (2-30C)alkenylene, (2-30C)alkynylene, —[(CH$_2$)$_2$—O]$_n$—, —[O—(CH$_2$)$_2$]$_n$—, —[O—CH$_2$MeCH$_2$]$_n$—, —[CH$_2$MeCH$_2$—O]$_n$— and —[O—Si(R$_z$)$_2$]$_n$— (wherein R$_z$ is methyl and n is 1 to 30);

Q and $Q^1$ are independently a terminal group selected from hydrogen, methyl, hydroxyl, carboxy, (1-4C)alkoxycarbonyl, amino, —C=CH$_2$, —C≡CH,—and a polymerisable group selected from acrylates, epoxy, silane, siloxane, alkene and styrene;

M is a metal selected from Ir, Pt, Rh, Re, Ru, Os, Cr, Cu, Pd and Au;

L is a ligand independently selected from the group consisting of halo, (1-30C)hydrocarbyl optionally comprising one or more heteroatoms selected from N, O, S, Si or P, or an aryl or heteroaryl group optionally substituted with one or more substituents selected from (1-4C)alkyl, halo, aryl or heteroaryl; and p is 1 to 4.

In another embodiment, when present:
X and $X^1$ are independently selected from the group consisting of (1-20C)alkylene, (2-20C)alkenylene, (2-20C)alkynylene, —[(CH$_2$)$_2$—O]$_n$— and —[O—(CH$_2$)$_2$]$_n$—, —[OSi(R$_2$)$_2$]$_n$ (wherein n is 1 to 20);

Q and $Q^1$ are independently a terminal group selected from hydrogen, methyl, hydroxyl, carboxy, (1-4C)alkoxycarbonyl, silane, siloxane, acrylate, epoxy, styrene or amino;

M is a metal selected from Ir, Pt, Cr, Cu, Pd and Au;

L is a ligand independently selected from the group consisting of halo, (1-20C)hydrocarbyl optionally comprising one or more heteroatoms selected from N, O, or S, or an aryl or heteroaryl group optionally substituted with one or more substituents selected from (1-4C)alkyl, halo, aryl or heteroaryl; and p is 1 to 4.

In another embodiment, when present:
X and $X^1$ are independently selected from the group consisting of (1-20C)alkylene, —[(CH$_2$)$_2$—O]$_n$—, —[OSi(R$_2$)$_2$]$_n$— and —[O—(CH$_2$)$_2$]$_n$— (wherein n is 1 to 20);

Q and $Q^1$ are independently a terminal group selected from hydrogen, methyl, hydroxyl, carboxy, (1-4C)alkoxycarbonyl, silane, siloxane, acrylate, epoxy, styrene or amino;

M is a metal selected from Ir, Pt, Cr, Cu, Pd and Au;

L is a ligand independently selected from the group consisting of aryl or heteroaryl, optionally substituted with one or more substituents selected from (1-4C)alkyl, halo, aryl or heteroaryl; and p is 1 to 4.

In another embodiment, when present:
X and $X^1$ are independently selected from the group consisting of (1-20C)alkylene, —[(CH$_2$)$_2$—O]$_n$—, —[OSi(R$_2$)$_2$]$_n$— and —[O—(CH$_2$)$_2$]$_n$— (wherein n is 1 to 20);

Q and $Q^1$ are independently a terminal group selected from hydrogen, methyl, hydroxyl, carboxy, silane, siloxane, acrylate, epoxy, styrene or amino;

M is Ir;

L is a ligand independently selected from the group consisting of aryl or heteroaryl, optionally substituted with one or more substituents selected from aryl or heteroaryl; and p is 1 to 2.

In another embodiment, when present:
X and $X^1$ are independently selected from the group consisting of (4-12C)alkylene, —[(CH$_2$)$_2$—O]$_n$—, —[OSi(R$_2$)$_2$]$_n$— and —[O—(CH$_2$)$_2$]$_n$— (wherein n is 1 to 15);

Q and $Q^1$ are independently a terminal group selected from hydrogen, methyl, hydroxyl, carboxy, silane, siloxane, acrylate, epoxy, styrene or amino;

M is Ir;

L is a ligand independently selected from the group consisting of phenyl or 6-membered heteroaryl, optionally substituted with one or more substituents selected from phenyl or 6-membered heteroaryl; and p is 1 to 2.

In another embodiment, when present:
X and $X^1$ are independently selected from the group consisting of (4-12C)alkylene and —[(CH$_2$)$_2$—O]$_n$— (wherein n is 1 to 15);

Q and $Q^1$ are independently a terminal group selected from hydrogen, methyl, hydroxyl, carboxy, or amino;

M is Ir;

L is a ligand independently selected from the group consisting of phenyl or 6-membered heteroaryl, optionally substituted with one or more substituents selected from phenyl or 6-membered heteroaryl; and p is 1 to 2.

In any of the embodiments mentioned hereinbefore, X and/or $X^1$ may also be —$(CH_2)_m(CF_2)_n$— (wherein m is 0 to 30 and n is 1 to 30) and Q and/or $Q^1$ may also be —$CF_3$.

In another embodiment, the π-conjugated monomers are each independently selected from any of the following structures:

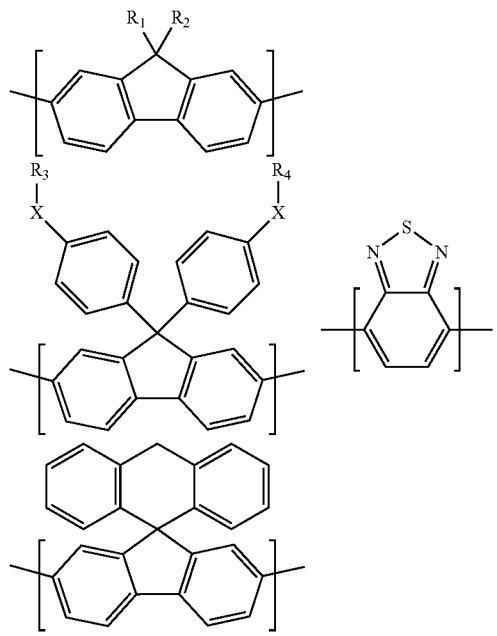

wherein $R_1$, $R_2$, $R_3$ and $R_4$ are each independently selected from: —$(CH_2)_nR_{50}$ and —$(CH_2CH_2O)_nR_{50}$;
wherein n is 1 to 15 and $R_{50}$ is selected from H, (1-15C) alkyl, —$CO_2H$, —$CO_2$(1-6C)alkyl, —$CO_2Na$, —$CH=CH_2$, and —$OSO_3Na$;
and X is O.

In another embodiment, $R_1$ and $R_2$ are both selected from —$(CH_2)_7CH_3$, —$(CH_2)_5CO_2Et$, —$(CH_2)_{10}CO_2H$, —$(CH_2)_4CH=CH_2$, —$(CH_2)_{11}OSO_3Na$, —$(CH_2)_5CO_2Et$, —$(CH_2)_{10}CO_2Na$, —$(CH_2CH_2O)_3CH_3$, and —$(CH_2CH_2O)_{12}CH_3$; $R_3$ and $R_4$ are selected from 2-ethylhexyl, —$(CH_2)_{11}OSO_3Na$, —$(CH_2CH_2O)_nCH_3$ and —$(CH_2)_{10}CO_2Na$.

In an embodiment, the π-conjugated monomers are each independently selected from any of the following structures:

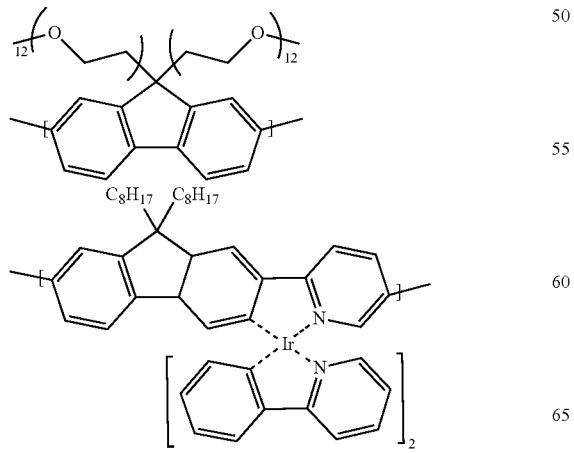

In another embodiment, the π-conjugated monomers are each independently selected from any of the following structures:

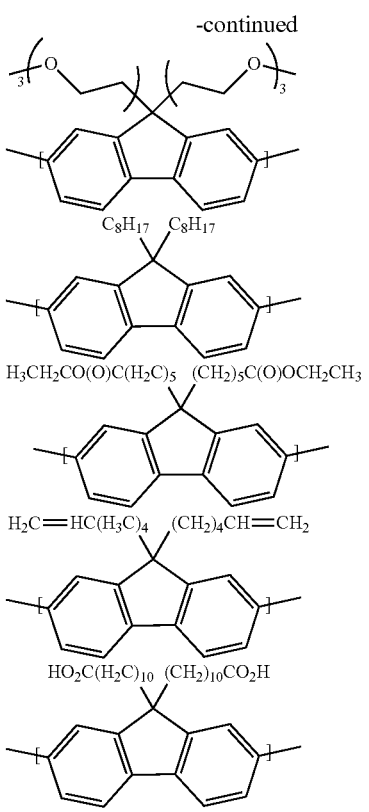

In another embodiment, the π-conjugated monomers are each independently selected from any of the following structures:

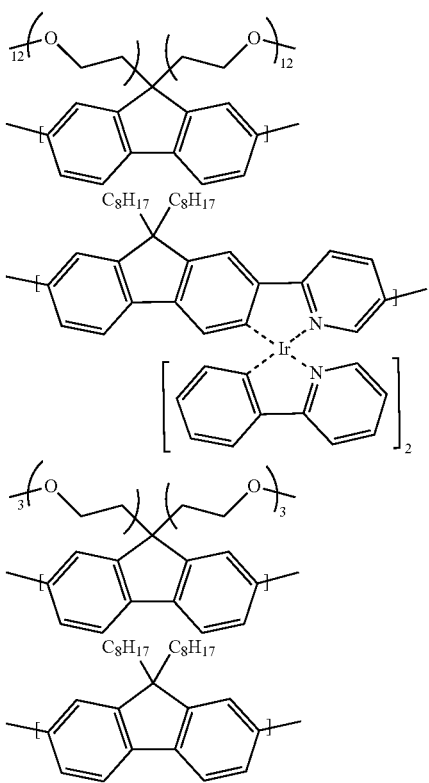

-continued

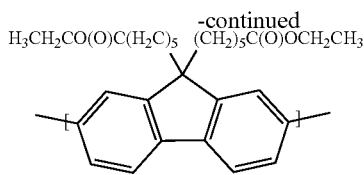

A person skilled in the art will be able to select suitable monomers to form the polymeric nanoparticles of the present invention that emit light of different desired wavelengths. Examples of nanoparticles emitting light of different wavelengths are provided in the accompanying example section herein.

Suitably, the resins of the present invention comprise 0.005 to 5 wt. % of the nanoparticles of the present invention. In an embodiment, the resins comprise 0.01 to 5 wt. % of the nanoparticles. In a further embodiment, the loading of the nanoparticles is 0.04 to 4 wt. %.

In an embodiment, there are three populations of nanoparticles present in the resin which are configured to emit blue, green and red light respectively. The loading of the particles may be 0.005 to 5 wt. % (e.g. 0.1 wt. %) with a blue:green:red ratio of 90 to 100:1 to 20:1 to 20 (e.g. 100:5:2.5). The particles may be loaded into a resin films of 0.1 to 5 mm thickness (e.g. 1 mm thickness).

In a further embodiment, and with reference to Example 8 herein, nanoparticles with blue monomers w=0.5, x=0.3994, green monomers y=0.0004 and red monomers z=0.0002 where prepared and provided a white light emitting nanoparticle. The loading of the particles may be 0.005 to 5 wt. % (e.g. 0.1 wt. %). The particles may be loaded into a resin films of 0.1 to 5 mm thickness (e.g. 1 mm thickness).

In another embodiment, the nanoparticle has a particle size (Z-average, measured by DLS) of 20-400 nm. Suitably, the nanoparticle has a particle size of 30-400 nm. More suitably, the nanoparticle has a particle size of less than 30-300 nm. Even more suitably, the nanoparticle has a particle size of less than 30-250 nm. Even more suitably, the nanoparticle has a particle size of less than 30-200 nm. Most suitably, the nanoparticle has a particle size of less than 30-100 nm.

In another embodiment, the nanoparticle has a particle size of 20-400 nm. More suitably, the nanoparticle has a particle size of less than 20-300 nm. Even more suitably, the nanoparticle has a particle size of less than 20-250 nm. Even more suitably, the nanoparticle has a particle size of less than 20-200 nm. Most suitably, the nanoparticle has a particle size of less than 20-100 nm.

In another embodiment, the nanoparticle has a particle size of 10-400 nm. More suitably, the nanoparticle has a particle size of less than 10-300 nm. Even more suitably, the nanoparticle has a particle size of less than 10-250 nm. Even more suitably, the nanoparticle has a particle size of less than 10-200 nm. Most suitably, the nanoparticle has a particle size of less than 10-100 nm.

In another embodiment, the polymers forming the nanoparticles of the present invention have a degree of polymerisation of 10 to 800, more suitably 20 to 600.

In another embodiment, the nanoparticle comprises 1-10 mol % of the cross linker. Suitably, the nanoparticle comprises 2-8 mol % of the cross linker. More suitably, the nanoparticle comprises 3-7 mol % of the cross linker. Most suitably, the nanoparticle comprises 4.5-5.5 mol % of the cross linker.

The Encapsulation Medium

Any suitable encapsulation medium may be utilised to prepare the resins of the present invention.

In an embodiment, the encapsulation medium is a transparent polymeric encapsulation medium.

Suitable media used in the art include siloxane-based media, polycarbonates, epoxy and acrylate polymers.

The siloxane polymers that can be used include methyl- and methylphenyl-substituted siloxane polymers that can be cured as a two pack system with hydrosiloxane polymers and a platinum catalyst (e.g. Dow Corning MS-1002).

The acrylate polymers that can be used include, but are not limited to, (meth)acrylate (e.g. Tensol®) and the (meth)acrylate polymers described in WO2012/164284. The poly (meth)acrylate may be selected from the group consisting of polylauryl (meth)acrylate, polystearyl (meth)acrylate, polytrimethylsilyl (meth)acrylate, polytrimethylsilyloxyalkyl (meth)acrylate (e.g. 2-(trimethylsilyloxy)ethyl methacrylate), polyglycidyl (meth)acrylate, methyl (meth)acrylate and combinations thereof. Each of the aforementioned acylates may be substituted or unsubstituted with one or more chemical groups, such as an alkyl group, for example a methyl, ethyl or propyl group.

In an embodiment, the polyacrylate encapsulation medium is derived from an acrylate monomer and/or polymer. Any suitable multivalent crosslinking agent may be used provided it is compatible with the acrylate monomer(s) being used and the reaction initiator (e.g. photoiniator) being used. For example, a trivalent crosslinking compound, such as trimethylolpropanetrimethacrylate, may be used.

The monomer and crosslinking compound reaction is initiated by chemical, thermal, photo initiation and/or catalysis. Any suitable initiation method may be used provided it is compatible with the acrylate monomer(s) and crosslinking compound being used. The photoinitiator may be dissolved in the crosslinker (e.g., trimethylolpropanetrimethacrylate). This may then be added to the acrylate monomer(s) to provide a precursor encapsulation mixture. An aliquot of the mixture is then added to a sample of the desired nanoparticles. The nanoparticle-containing mixture can then be used to fabricate the desired light emitting device. By way of example, an appropriate volume of the nanoparticle-containing mixture may be deposited into a cup of an LED or used to make a phosphor sheet using any appropriate technique for generating a nanoparticle film (e.g. inkjet printing, casting, doctor blade, roller coating, screen printing etc). The filled LED or phosphor sheet device may then be polymerised to provide a cured, optically transparent matrix that incorporates the desired type(s) of nanoparticles.

Alternatively, the encapsulation medium may an extrudable polymeric medium or a medium that may be 3D-printed. Suitable extrudable media are known in the art and include polymers, typically linear polymers, selected from polystyrene, polyacrylates and polycarbonates. The extrudable polymer is mixed with the nanoparticles and then extruded to form the phosphor material required. Similarly, the nanoparticles may be dispersed in a 3D printing medium and printed in the desired shape and form.

The resin of the present invention may include one or more additives to aid the preparation of the resin and/or to enhance the performance of the final light emitting device.

Exemplary additives may include one or more from the following group: polymerization enhancers (e.g. benzophenones, $BF_3$); wave-guiding materials (e.g. fumed silica and its derivatives, polymethylmethacrylate (PMMA)); agents for increasing viscosity (e.g. fumed silica, hydrophobic polymers, polylaurylmethacrylate (PLMA), dextrin palmitate); agents for enhancing light transmittance; and agents for improving the solubility or dispersibility of the nanoparticles in the resin precursor encapsulation mixture. The formulation may also include additives to enhance the mechanical and/or tensile properties or the finally cured resin material, and/or the weathering of the final light emitting device (e.g. $TiO_2$ nanopowders, silicone hydride containing siloxanes and siloxane polymers, fumed silica).

The nanoparticles of the present invention could be dispersed within the resin medium as discrete nanoparticles, or two or more nanoparticles may be bound together by a suitable binder (e.g. a polymeric binder or silica) to form a number of agglomerated particles or "microbeads". These microbeads can be prepared by techniques known in the art (see for example, WO2012/164284) and typically have diameters within the micron range. These microbeads may be dispersed in the resin or extruded in addition or instead of discrete nanoparticles of the present invention.

Methods of the Invention
Nanoparticle Preparation

The nanoparticles used in the present invention may be formed by emulsion polymerisation, mini-emulsion polymerisation or dispersion polymerisation techniques to provide a suspension of nanoparticles. Suitably, the polymerisation reaction is carried out in an aqueous medium to yield a suspension of nanoparticles in an aqueous medium.

Emulsion polymerisation, miniemulsion polymerisation and dispersion polymerisation techniques will be known to one of skill in the art.

In the case of emulsion polymerisation, the monomeric components are dissolved in a suitable organic solvent (e.g. chlorobenzene, toluene or xylenes) along with a catalyst (e.g. $Pd(PPh_3)_4$, $IPr*PdTEACl_2$ or $Pd_2(dba)_3/P(o-tol)_3$). This solution is then added to an aqueous medium of water, tetraethylammonium hydroxide solution (40% in water) and optionally with a suitable emulsifier. Any suitable emulsifier may be used, such as, for example, SDS, Triton X102, Brij L23 and/or Tween 20. The resultant emulsion may be stirred and/or ultrasonicated to form an emulsion, suitably a miniemulsion. The emulsion mixture may then be gently heated to a temperature of between 30 and 100° C. (for $Pd(PPh_3)_4$, $Pd_2(dba)_3/P(o-tol)_3$ suitably between 50 and 95° C., and more suitably between 50 and 80° C.; and for $IPr*PdTEACl_2$ ideally 30° C.) for period of time (e.g. from 1 hour to 2 days) to form the polymeric nanoparticles. A person skilled in the art will appreciate that the temperature of heating depends on catalyst system employed.

In an embodiment, the nanoparticles are formed by Suzuki coupling or Stille coupling reactions. Such coupling reactions are known in the art.

In another embodiment, the nanoparticles are formed by reacting π-monomeric moieties as defined herein with a pre-made cross-linking moiety as defined herein.

In another embodiment, the method further comprises the step of purifying the aqueous suspension of nanoparticles. Suitably, the aqueous suspension of nanoparticles is purified by contacting the aqueous suspension of nanoparticles with at least one organic solvent.

In another embodiment, contacting the aqueous suspension of nanoparticles with at least one suitable organic solvent causes precipitation of the nanoparticles. The precipitated nanoparticles may then be centrifuged, with the supernatant then decanted to leave the purified nanoparticles. Optionally, the purified nanoparticle may be re-suspended in water, and the purification process then repeated.

In another embodiment, when the nanoparticles are lipophilic, the at least one organic solvent is a polar solvent that is miscible with water (e.g. methanol,isopropanol).

In another embodiment, when the nanoparticles are hydrophilic, the at least one organic solvent is a non-polar solvent.

Resin Preparation

As indicated above, the present invention provides a method of forming a resin as defined herein, the method comprising the steps of:
(i) dispersing the nanoparticles within a precursor encapsulation medium;
(ii) curing the precursor encapsulation medium to form the encapsulation medium.

In an embodiment, the precursor encapsulation medium is a mixture of the nanoparticles, monomers, microbeads and/or polymers that form the encapsulation medium following curing. In addition, the precursor encapsulation medium may comprise one or more initiators (e.g. photoinitiators) and/or one or more cross-linking agents.

The precursor mixture may be cured in step (ii), for example by thermal curing or photocuring. Such procedures are well known in the art.

Once formed, the resin may be formed in any desired shape and form for use as a phosphor. In certain embodiments, the resin is in the form of a film. In other embodiments, the nanoparticles, or a composition comprising the nanoparticles dispersed in a transparent polymer, could be extruded or injection moulded to form a LED lens comprising the nanoparticles of the present invention.

The present invention further provides a method of forming a resin as defined herein, the method comprising the steps of:
(i) dispersing the nanoparticles within a precursor encapsulation medium/carrier;
(ii) injection moulding and/or extruding the precursor encapsulation medium to form the resin of the present invention.

The present invention further provides a resin obtainable, obtained, or directly obtained, by a method defined herein.

Light Emitting Devices

The present invention further provides a light emitting device comprising a resin as defined herein.

The resins may be incorporated into any suitable light emitting device.

Typically, the resins will be incorporated into light emitting devices, for example LEDs or optoelectronic displays, which comprise a primary light source to illuminate the resin and cause the nanoparticles within the resin to emit a secondary light source.

Thus, in one aspect, the invention provides a light emitting device comprising a resin as defined herein and a primary light source configured to illuminate the resin.

The present invention provides a light-emitting device comprising a resin which further comprises a population of nanoparticles as defined herein, incorporated into an encapsulation medium. Suitably, the encapsulation medium is optically transparent. The nanoparticles within the resin are illuminated by the primary light source (e.g. an LED, laser, arc lamp or black-body light source). The nanoparticles are excited by the primary light from the primary light source and emit secondary light of a desired wavelength. The required intensities and emission wavelengths of the light emitted from the device itself can be selected according to appropriate mixing of the colour of the primary light with that of the secondary light(s) produced from the down conversion of the primary light by the nanoparticles. Moreover, and number of each type of nanoparticle within the optically transparent encapsulation medium can be controlled, as can the size, morphology and constituency of the optically transparent encapsulation medium, such that subsequent mixing of the nanoparticle-containing media allows light of any particular colour and intensity to be produced.

The light emitted from the device may be solely secondary light from the resin, or it may a combination of light from the primary light source and the secondary light source.

The primary light source may be selected from the group consisting of a light emitting diode (e.g. a solid-state LED), a laser, an arc lamp and a black-body light source. In an embodiment, a LED is used as the primary light source. In an embodiment, the primary light source illuminates the resin with UV and/or blue light.

FIG. 29 is a schematic representation of an exemplary light emitting device according to an aspect of the present invention. The light emitting device (2) shown in FIG. 29 is a conventional "remote phosphor" LED assembly with a standard LED chip (3). Above the LED chip (3) is a LED well (4) which optionally comprises a volume of a commercially available resin (5) that covers and submerges the LED chip (3). A remote phosphor (6) of sufficient thickness and formed from the resin of the present invention is positioned at the opening of the well (4). The remote phosphor (6) may be formed by curing a precursor mixture which comprises the nanoparticles of the present invention and any other required reactants, e.g. by exposure to light, to form the resin layer of the remote phosphor (6) or it may be prefabricated by, for example, extrusion of nanoparticles of the present invention in the presence of an encapsulation medium to form the remote phosphor (6).

FIG. 30 is a further schematic representation of an exemplary light emitting device according to an aspect of the present invention. The light emitting device shown in FIG. 30 is a conventional "potted phosphor" LED assembly (2) with a standard LED chip (3). Above the LED chip (3) is a LED well (4) that optionally comprises a volume of a commercially available resin (5) that covers and submerges the LED chip (3), and a potted phosphor layer (6) present within the well (4). The potted phosphor layer (6) is formed from the resin of the present invention. The potted phosphor layer (6) may be formed by curing a precursor mixture which comprises the nanoparticles of the present invention and any other required reactants, e.g. by exposure to light, to form the resin layer of the potted phosphor (6) or it may be prefabricated by, for example, extrusion of nanoparticles of the present invention in the presence of an encapsulation medium to form the potted phosphor (6).

FIG. 31 is a schematic representation of an exemplary light emitting device according to an aspect of the present invention. The light emitting device shown in FIG. 31 is an "on chip" LED assembly (2) with a standard LED chip (3). Above the LED chip (3) is a LED well (4) that optionally comprises a volume of a commercially available resin (5) that covers and submerges the LED chip (3) that has a phosphor layer (6) present on the chip (3). The phosphor layer (6) may be formed by depositing phosphor or the phosphor in a precursor mixture on the chip (3) which optionally comprises other required reactants to form the resin layer or it may be prefabricated by, for example, extrusion of nanoparticles of the present invention in the presence of an encapsulation medium to form the "on chip" phosphor layer (6).

Colour rendering describes the ability of a light source to illuminate objects such that they appear the correct colour when compared to how they appear when illuminated by a reference light source. Usually the reference light source is a tungsten filament bulb which is assigned a colour rendering index (CRI) of 100. To be acceptable for general lighting, a white light emitting device source is required to have a CRI>80. The light emitting devices of the present invention enable light emitting devices having a colour rendering index of greater than 80 or 90 to be produced.

Uses of the Resins

The present invention further provides the use of a resin as defined herein in the fabrication of a light emitting device, such as, for example, a LED or optoelectronic display. Such devices may be used for a variety of lighting applications, including, but not limited to, household lighting, automobile lights, traffic signals, liquid crystal display (LCD) backlighting, display screens, photovoltaic films and for horticultural applications whereby the UV-component of sun-light is absorbed and remitted as visible-light of a desired wavelength that promotes plant growth (and increase photovoltaic solar cell efficiency).

EXAMPLES

Examples of the invention will now be described, for the purpose of reference and illustration only, with reference to the accompanying figures, in which.

Figure 7:
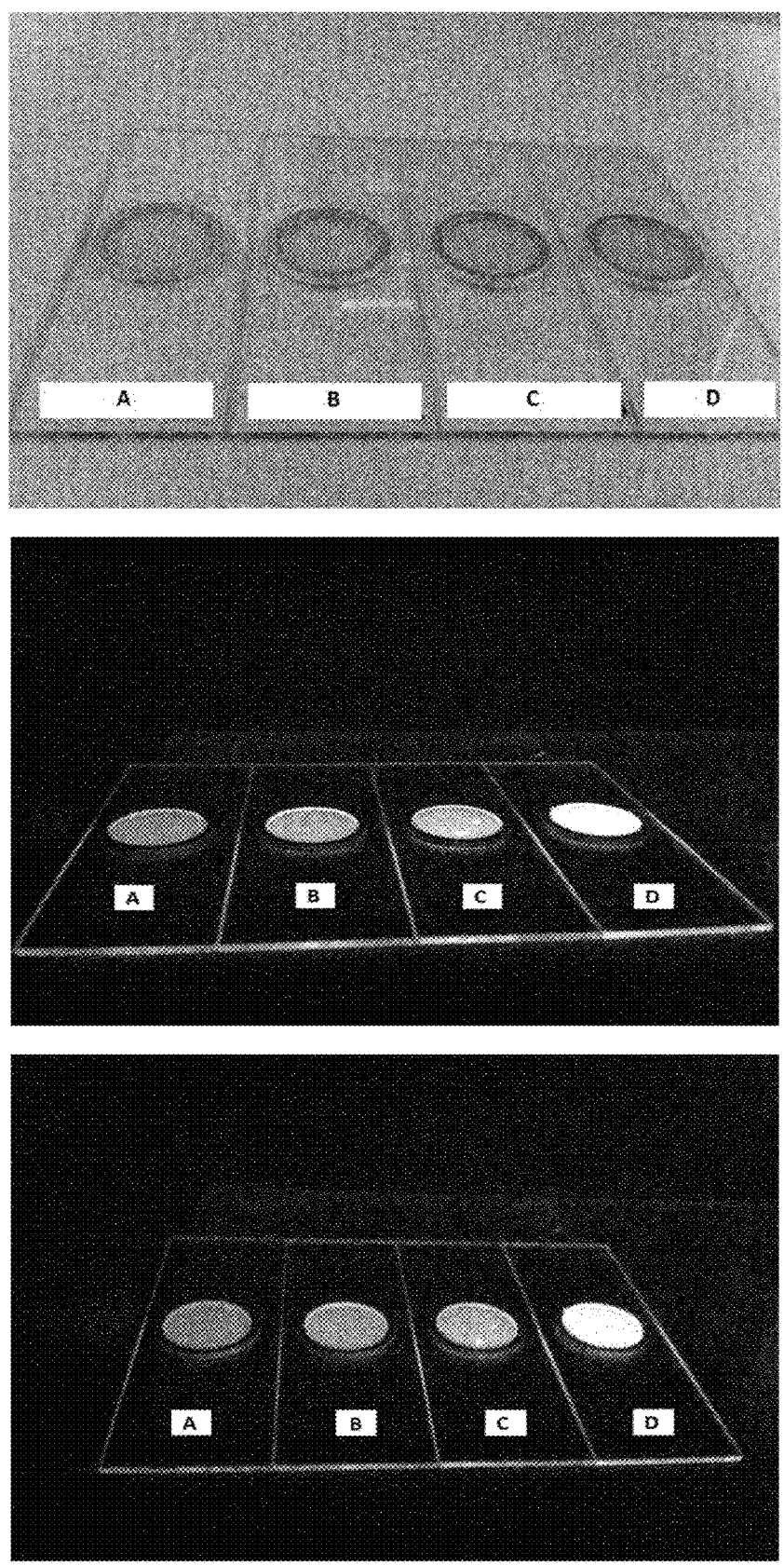

FIG. 7. Acrylic films containing cross-linked RGB CPNs (Films A-D) under ambient light (top) and under UV illumination (bottom) [Example 7].

Figure 8:
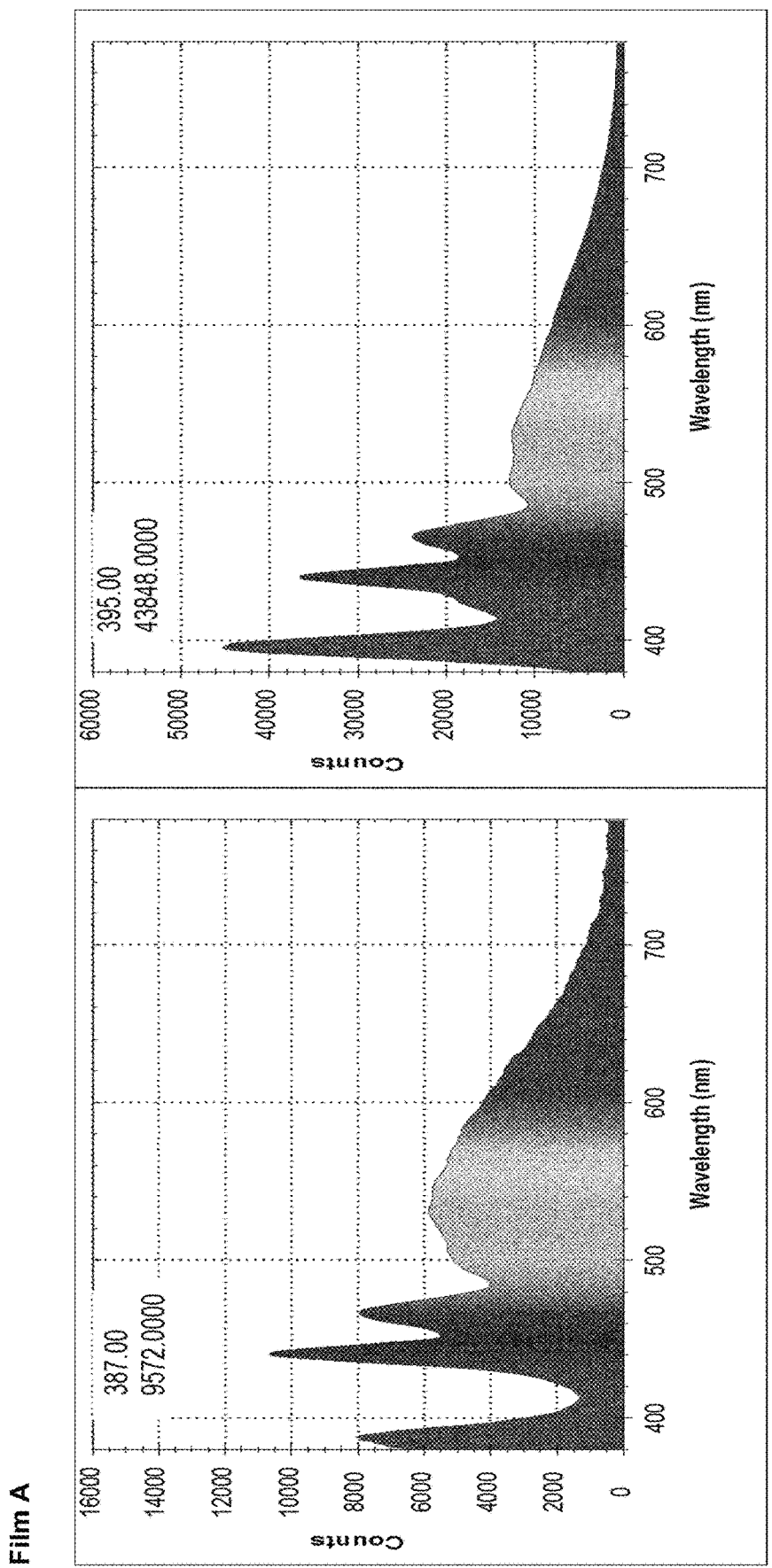

FIG. 8 shows emission spectra generated by Film A by down-conversion of UV-light at $\lambda_{exc}$=381 nm (left) and $\lambda_{exc}$=393 nm (right) [Example 7].

Figure 9:
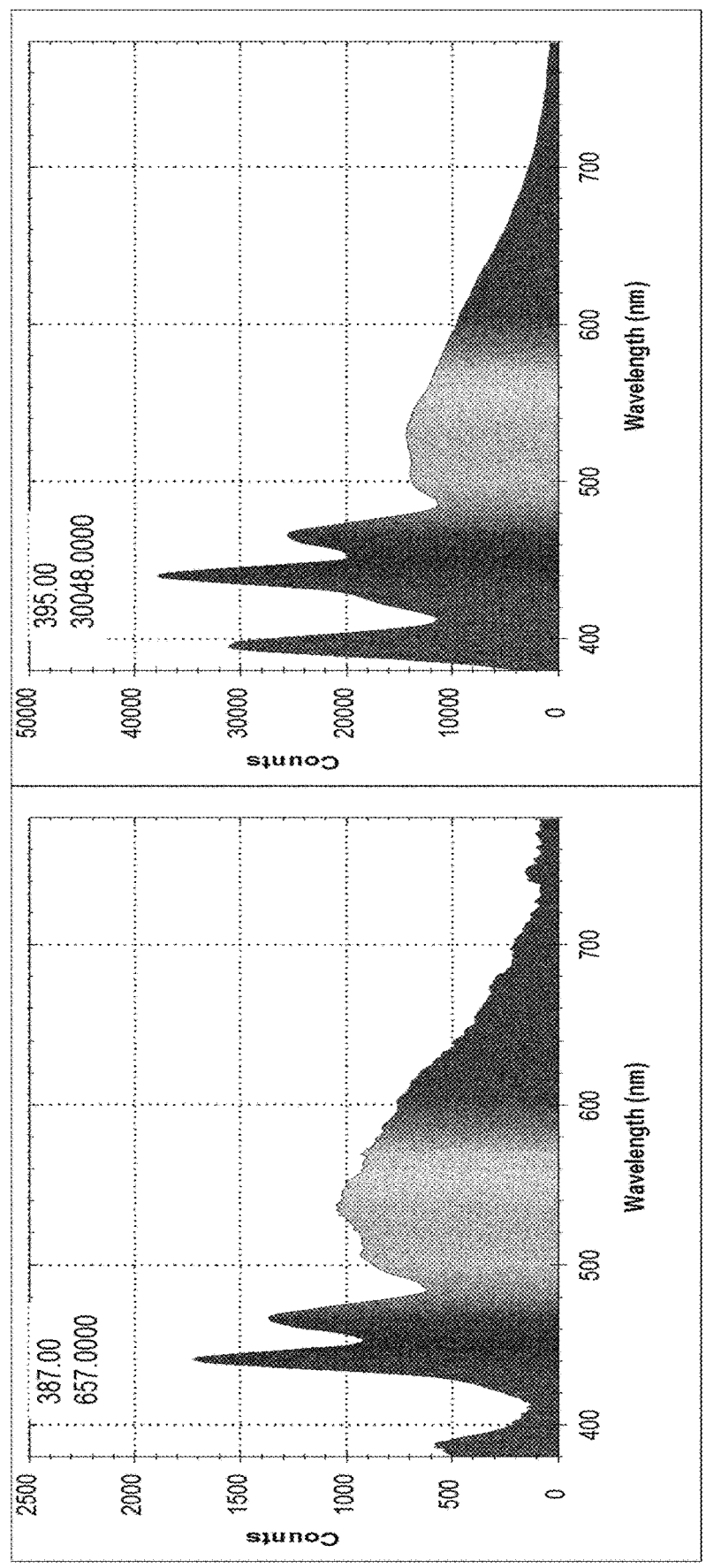

FIG. 9 shows emission spectra generated by Film B by down-conversion of UV-light at $\lambda_{exc}$=381 nm (left) and $\lambda_{exc}$=393 nm (right) [Example 7].

Figure 10:
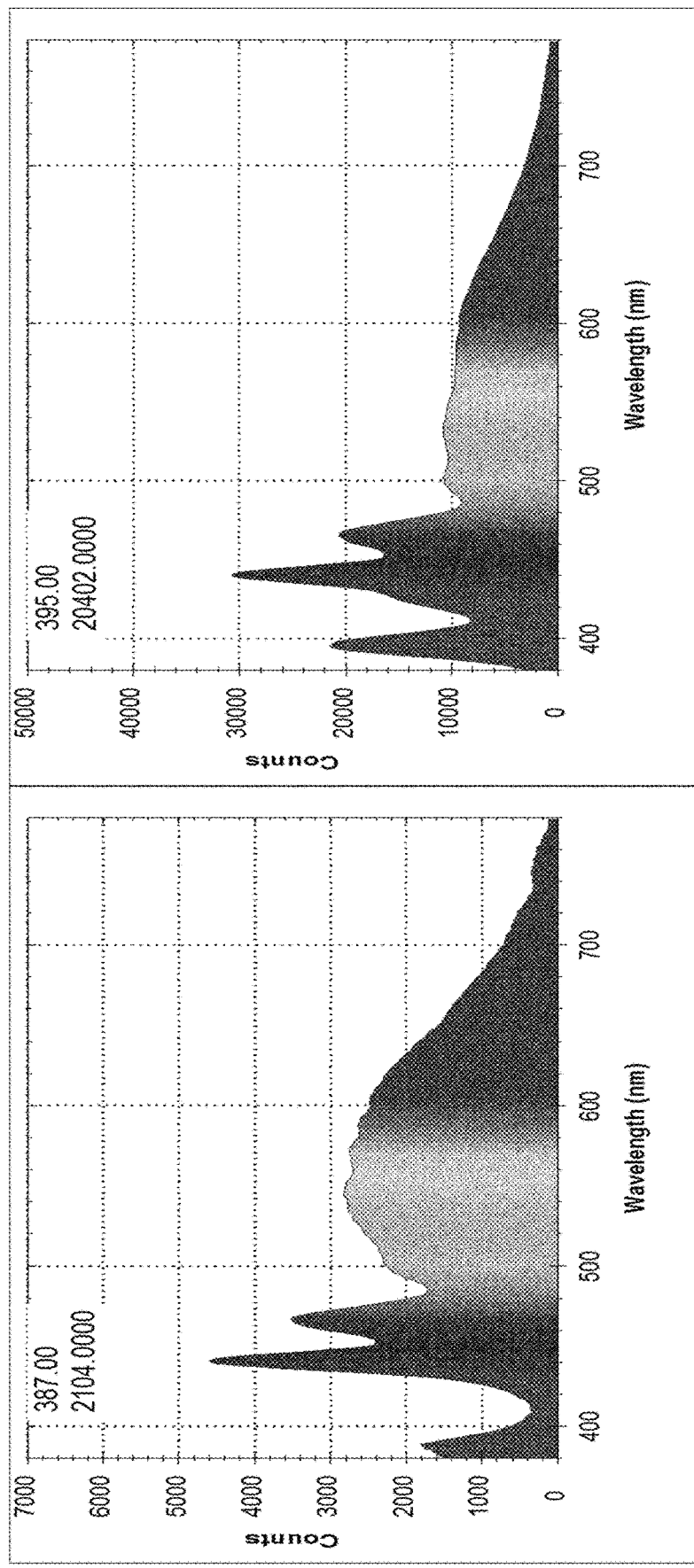

FIG. 10 shows emission spectra generated by Film C by down-conversion of UV-light at $\lambda_{exc}$=381 nm (left) and $\lambda_{exc}$=393 nm (right) [Example 7].

Figure 11:
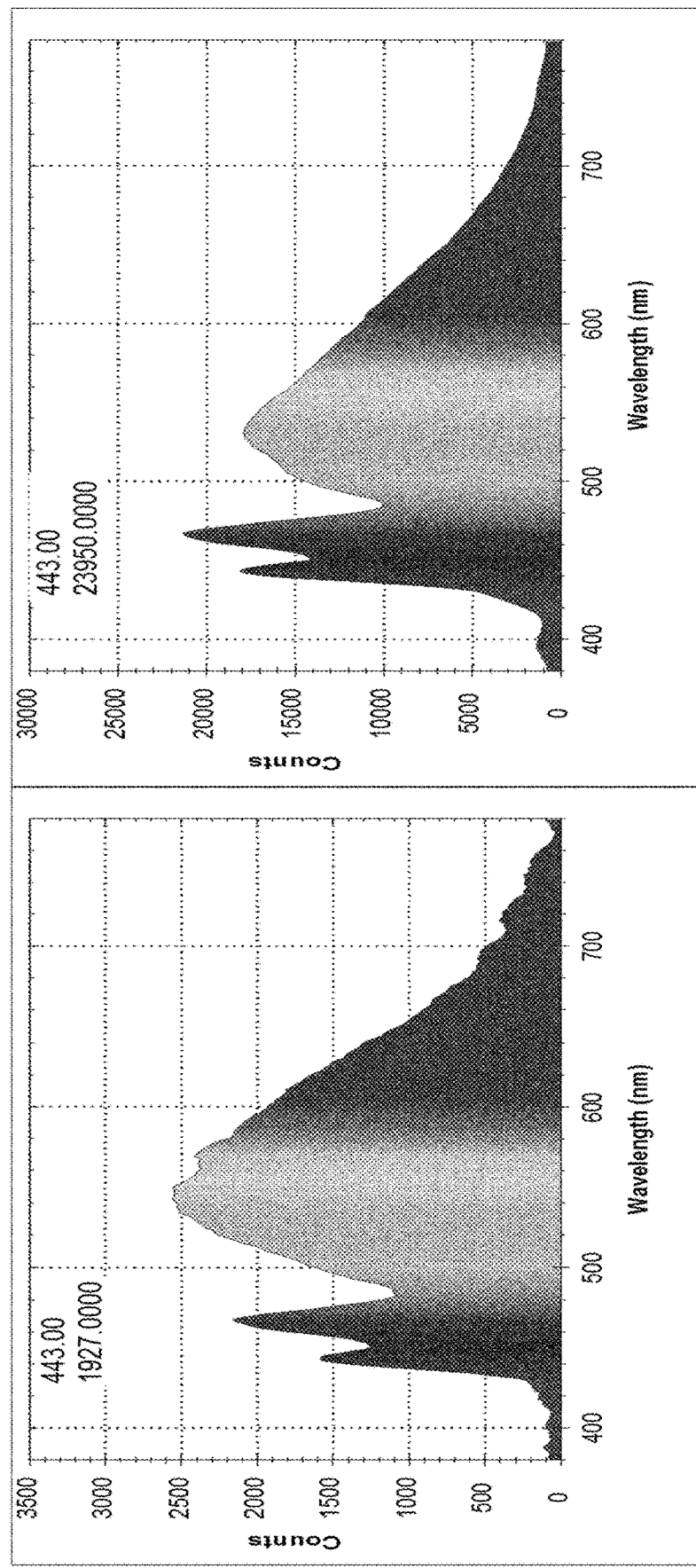

FIG. 11 shows emission spectra generated by Film D by down-conversion of UV-light at $\lambda_{exc}$=381 nm (left) and $\lambda_{exc}$=393 nm (right) [Example 7].

Figure 12:
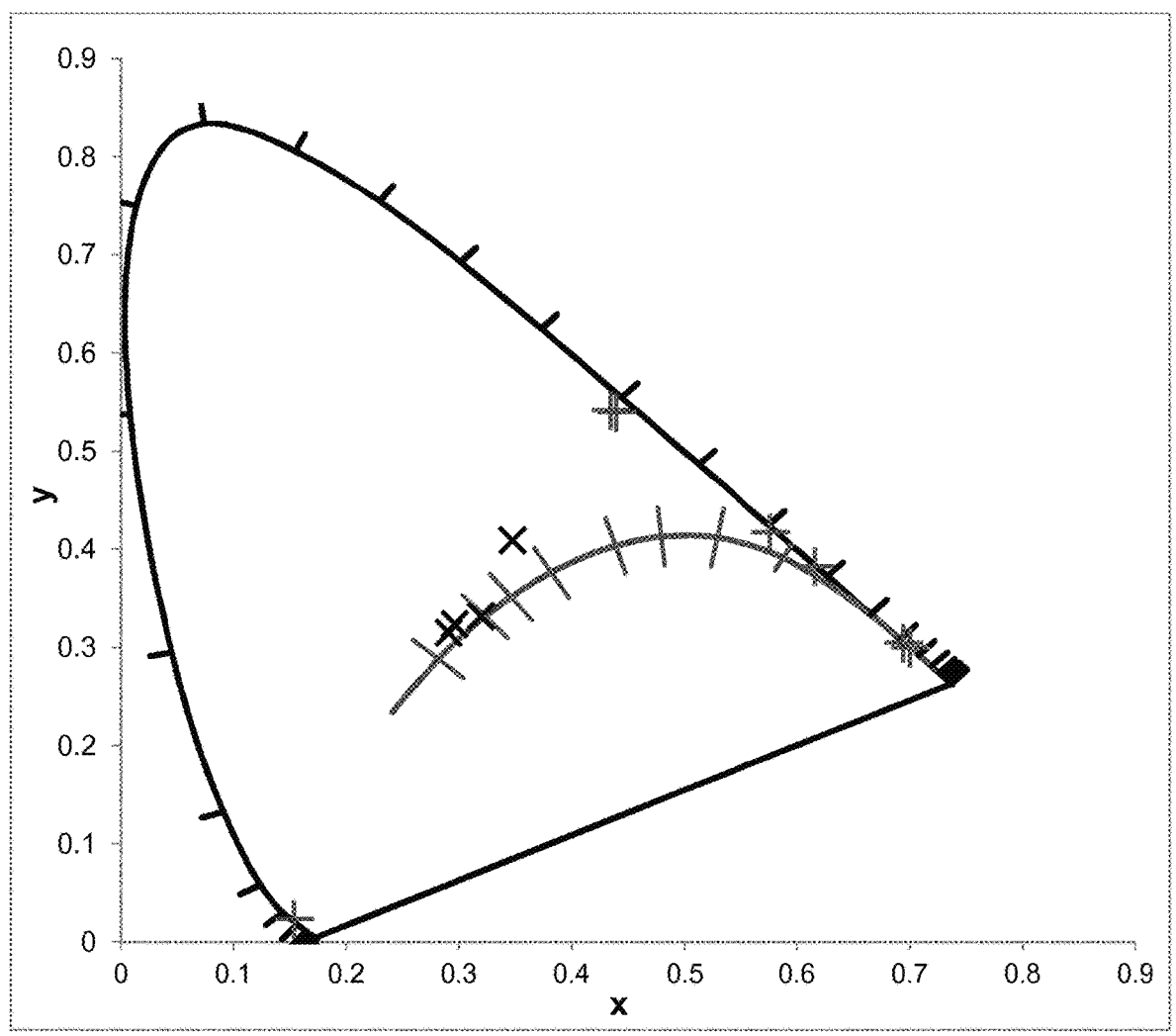

FIG. 12 shows position in the CIE 1931 chromaticity diagram of light emitted by Films A-D when irradiated in a remote phosphor LED array at $\lambda_{exc}$=381 nm [Example 7].

Figure 13:
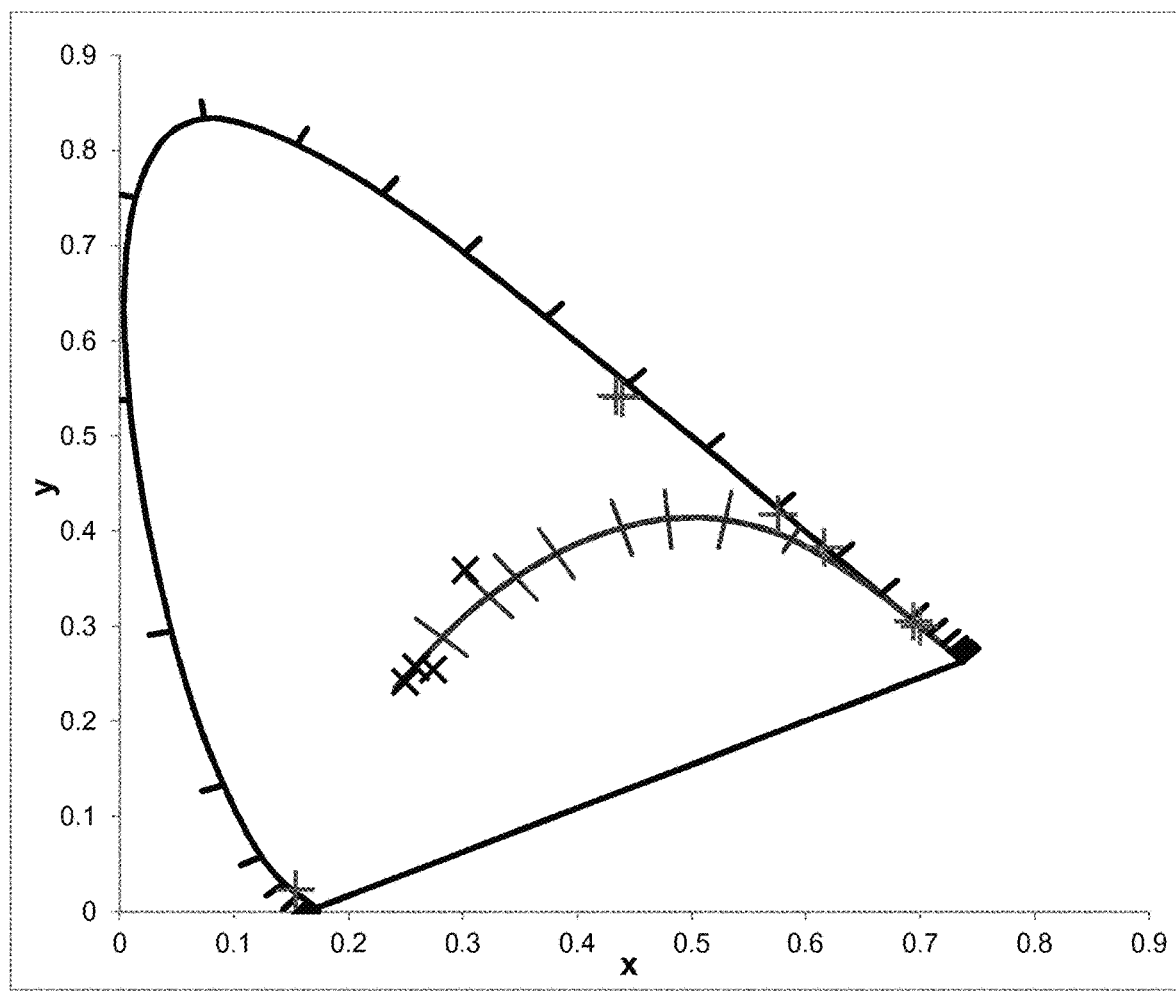

FIG. 13 shows position in the CIE 1931 chromaticity diagram of light emitted by Films A-D when irradiated in a remote phosphor LED array at $\lambda_{exc}$=393 nm [Example 7].

Figure 14:
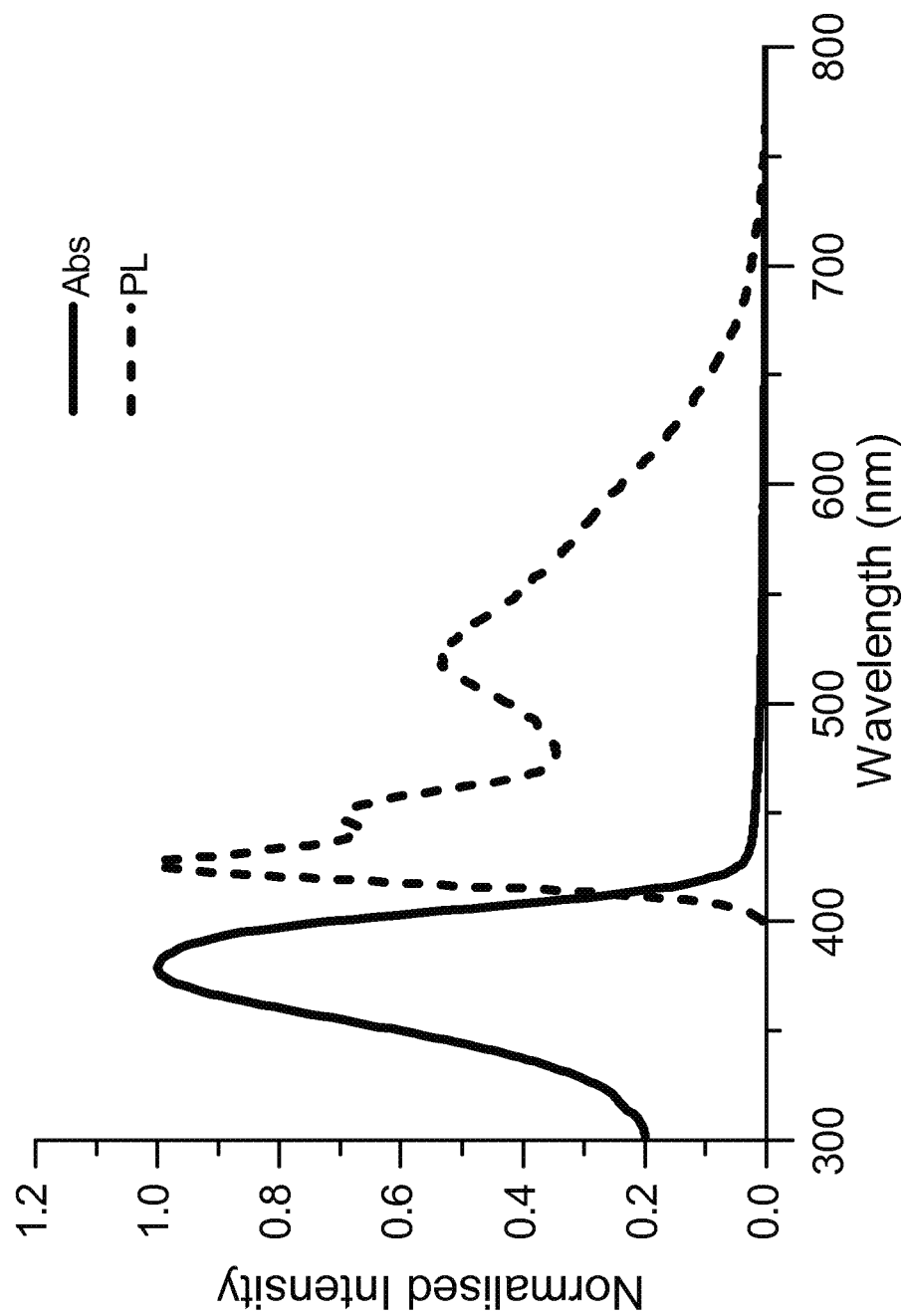

FIG. 14 shows normalised absorption and emission spectra ($\lambda_{exc}$=390 nm) of cross-linked white CPNs base on PFO in THF [Example 8].

Figure 15:
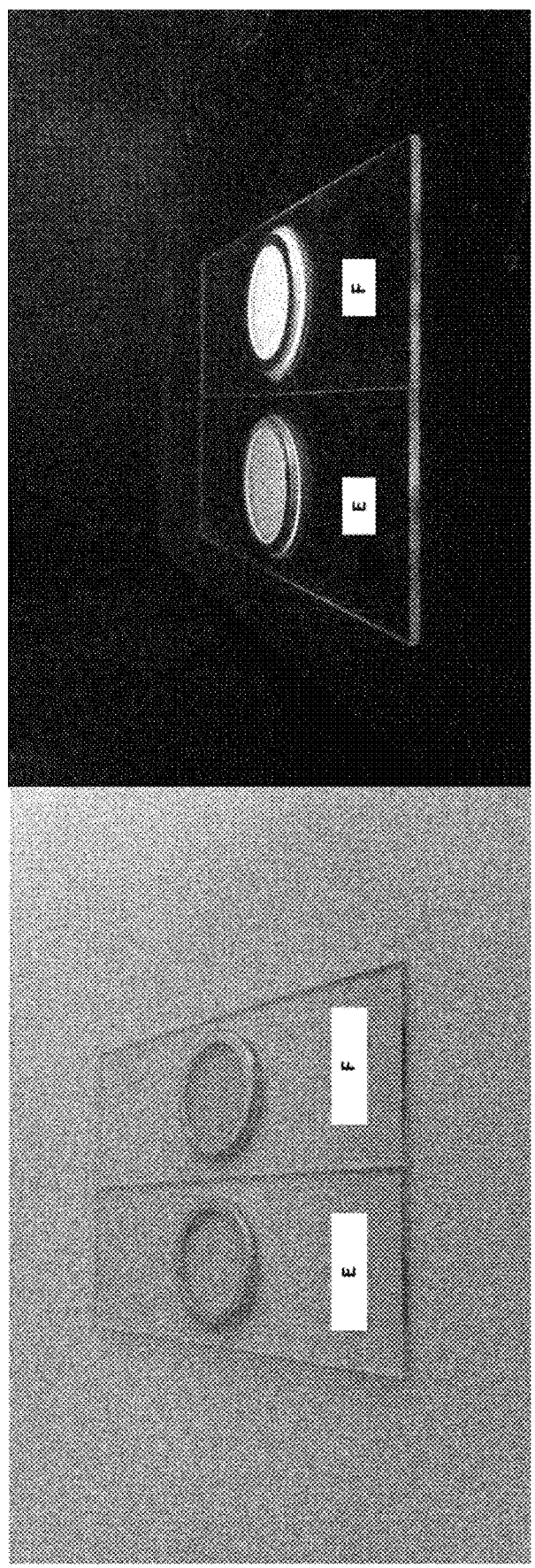

FIG. 15 shows silicone based films containing cross-linked RGB CPNs at 0.05 and 0.1 wt. % under ambient light (left) and under UV illumination (right) [Example 8].

Figure 16:
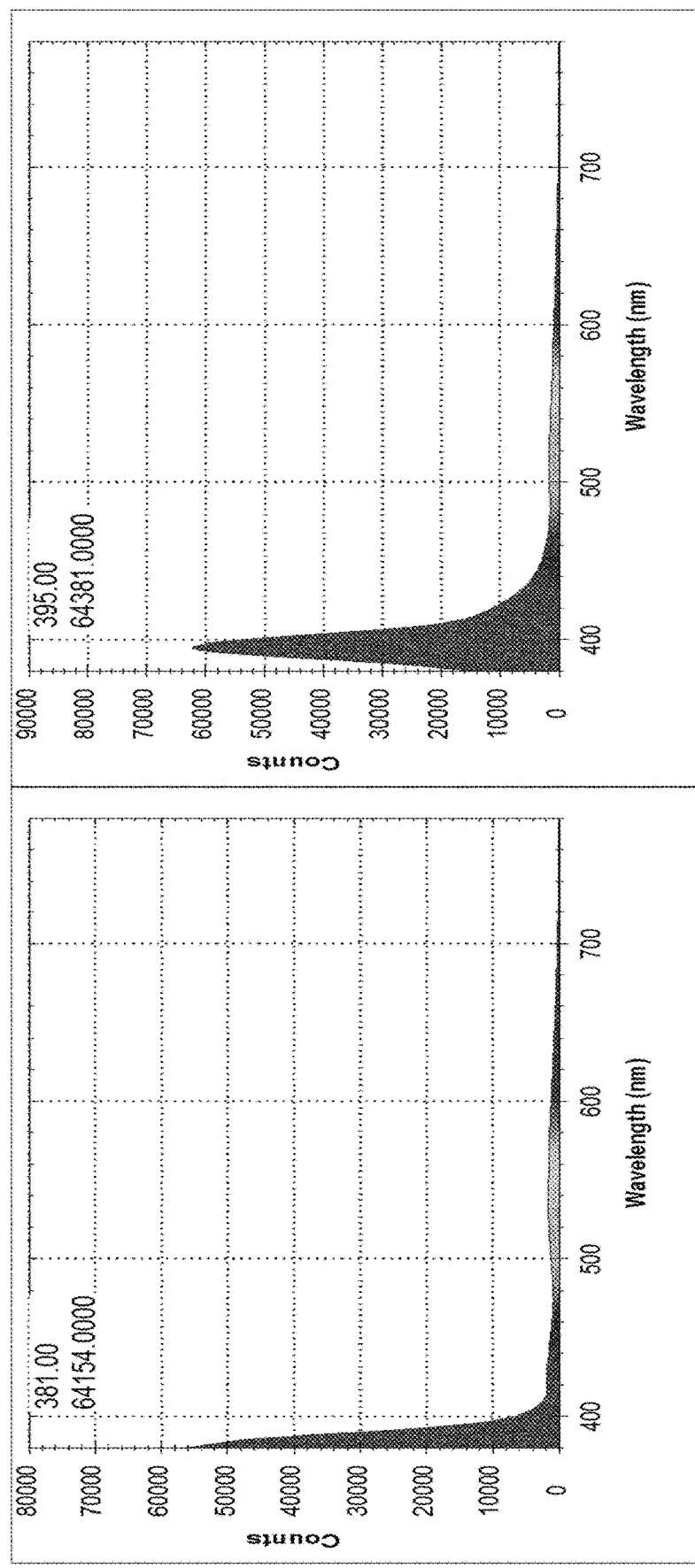

FIG. 16 shows emission spectra generated by Film E by down-conversion of UV-light at $\lambda_{exc}$=381 nm (left) and $\lambda_{exc}$=393 nm (right) [Example 8].

Figure 17:
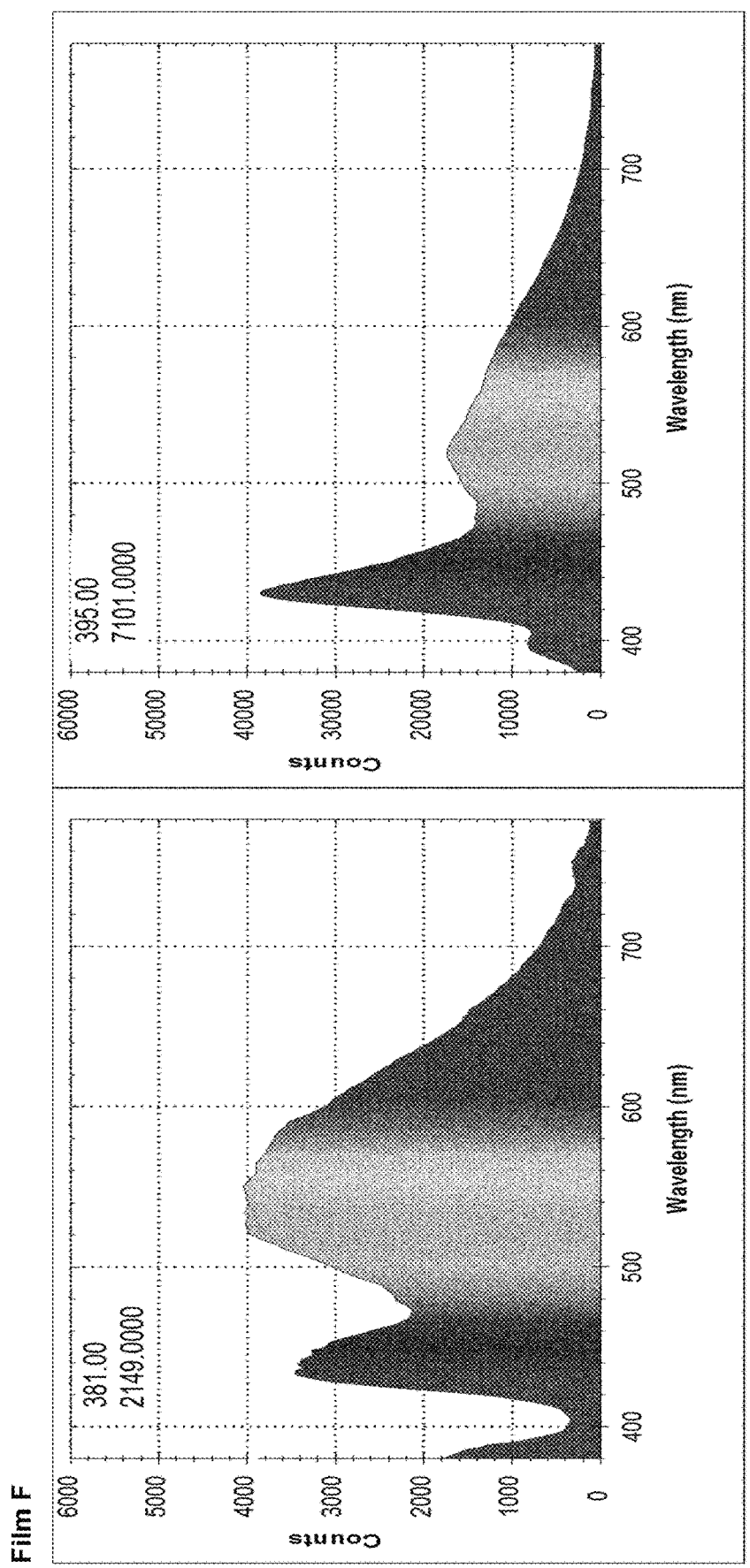

FIG. 17 shows emission spectra generated by Film F by down-conversion of UV-light at $\lambda_{exc}$=381 nm (left) and $\lambda_{exc}$=393 nm (right) [Example 8].

Figure 18:
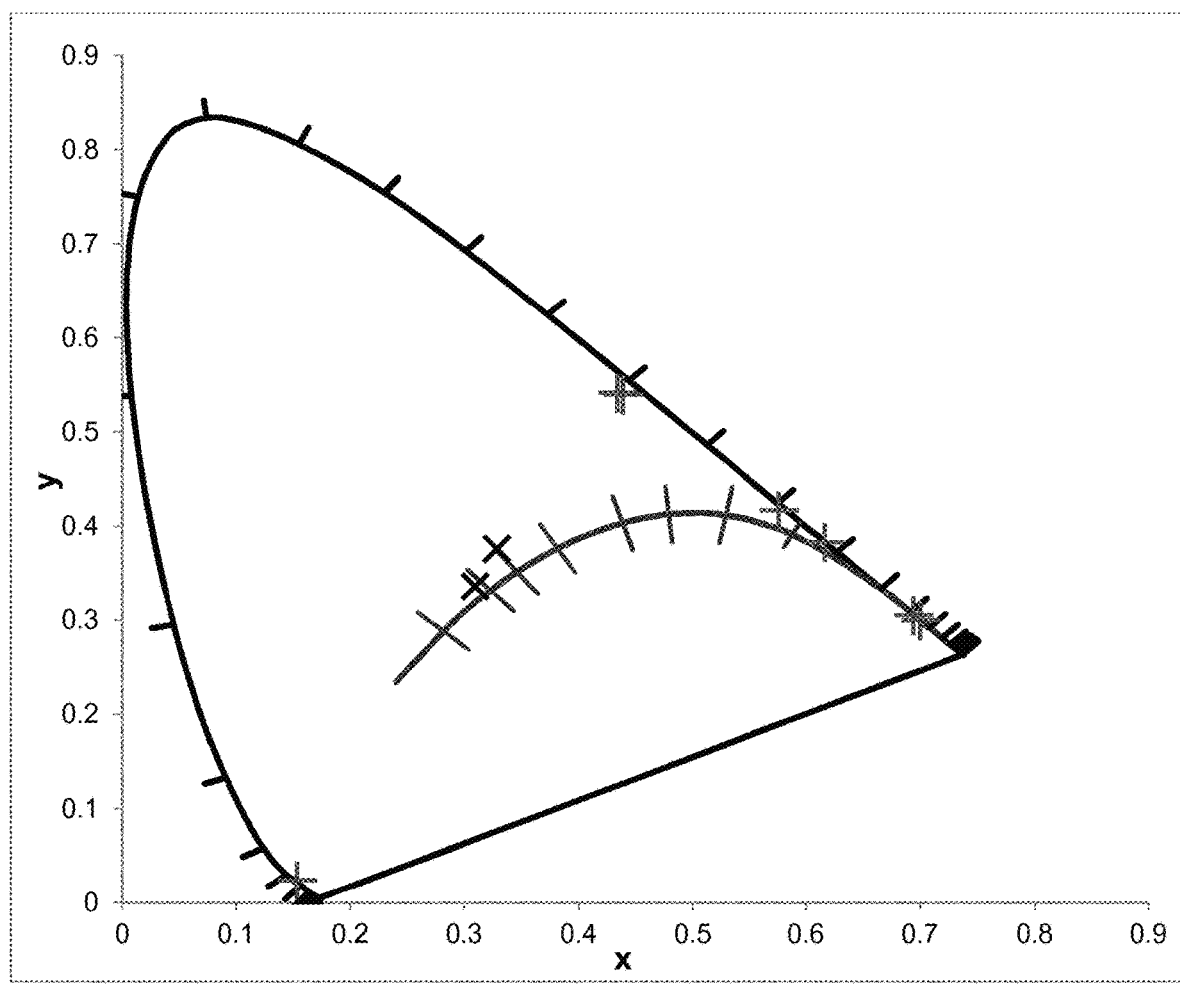

FIG. 18 shows position in the CIE 1931 chromaticity diagram of light emitted by Films E-F when irradiated in a remote phosphor LED array at $\lambda_{exc}$=381 nm [Example 8].

Figure 19:
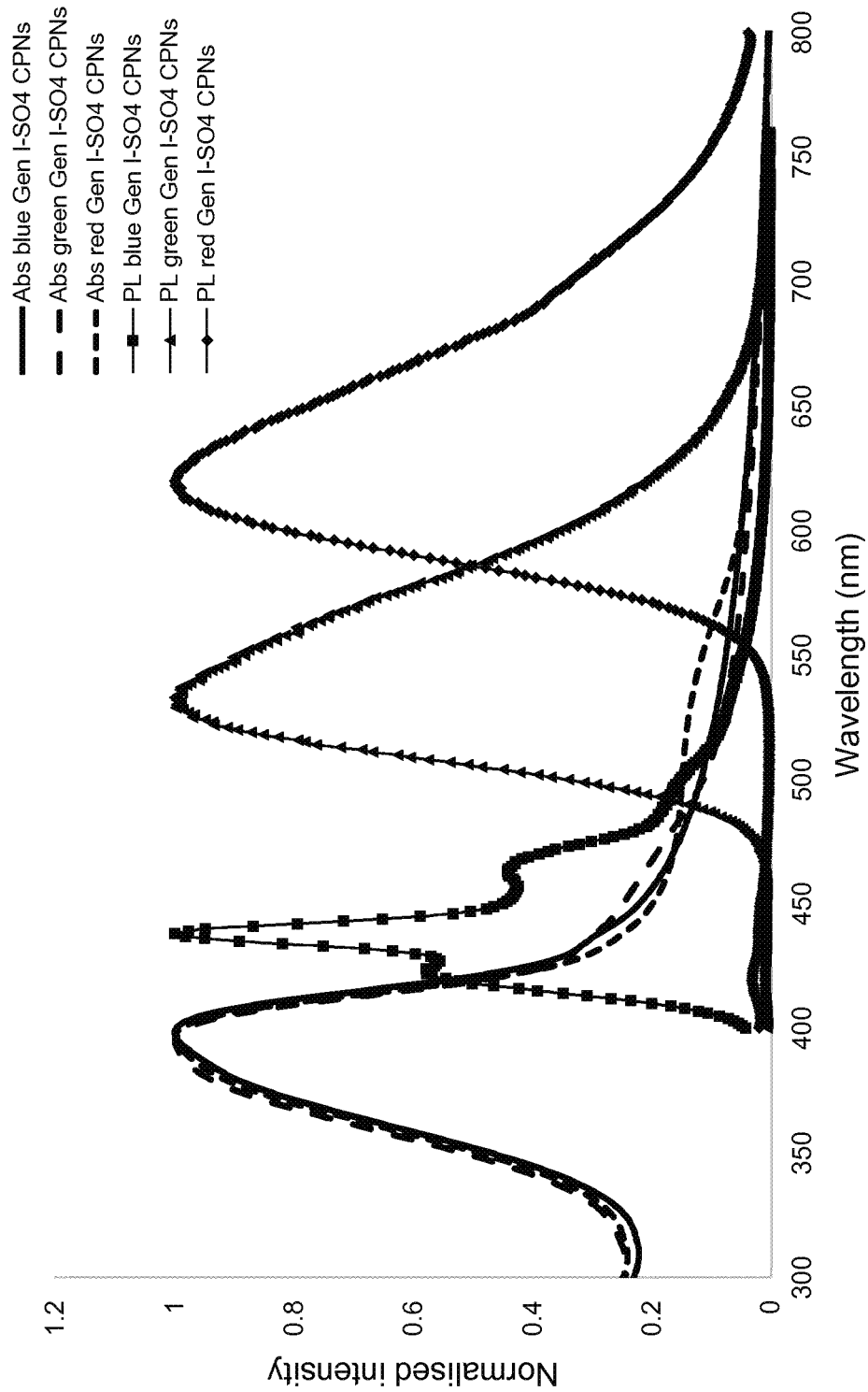

FIG. 19 shows normalised absorption & emission spectra ($\lambda_{exc}$=390 nm) of Examples 9-11 in water.

Figure 20:
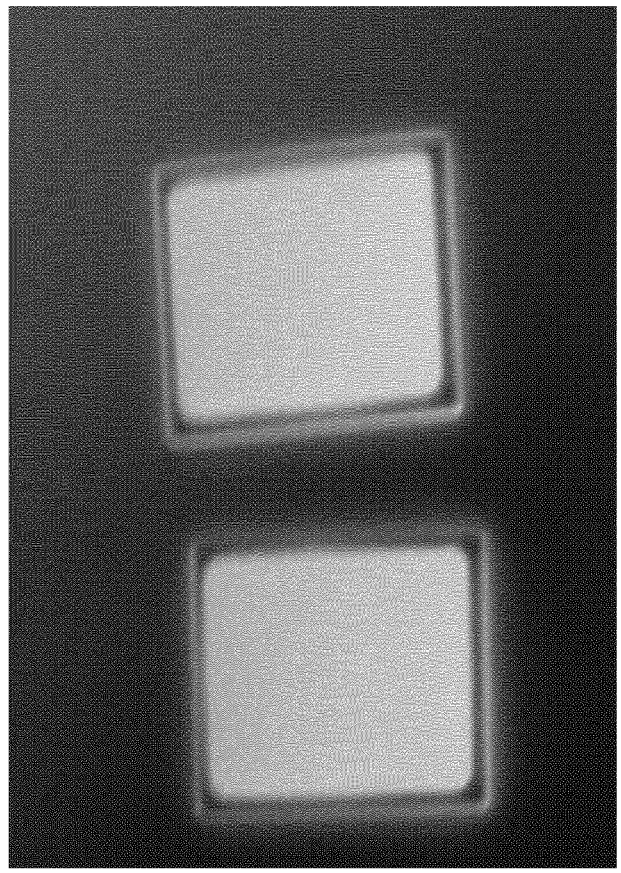
Figure 20:
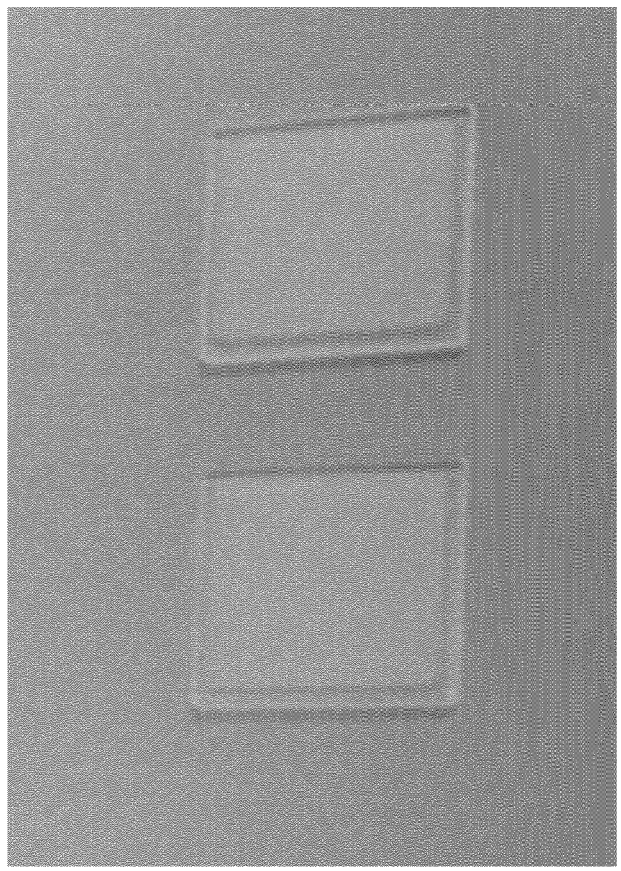

FIG. 20 shows silicone-based films (Film G) containing cross-linked green (Example 2) under ambient light (left) and under UV illumination (right) [Example 20].

Figure 21:
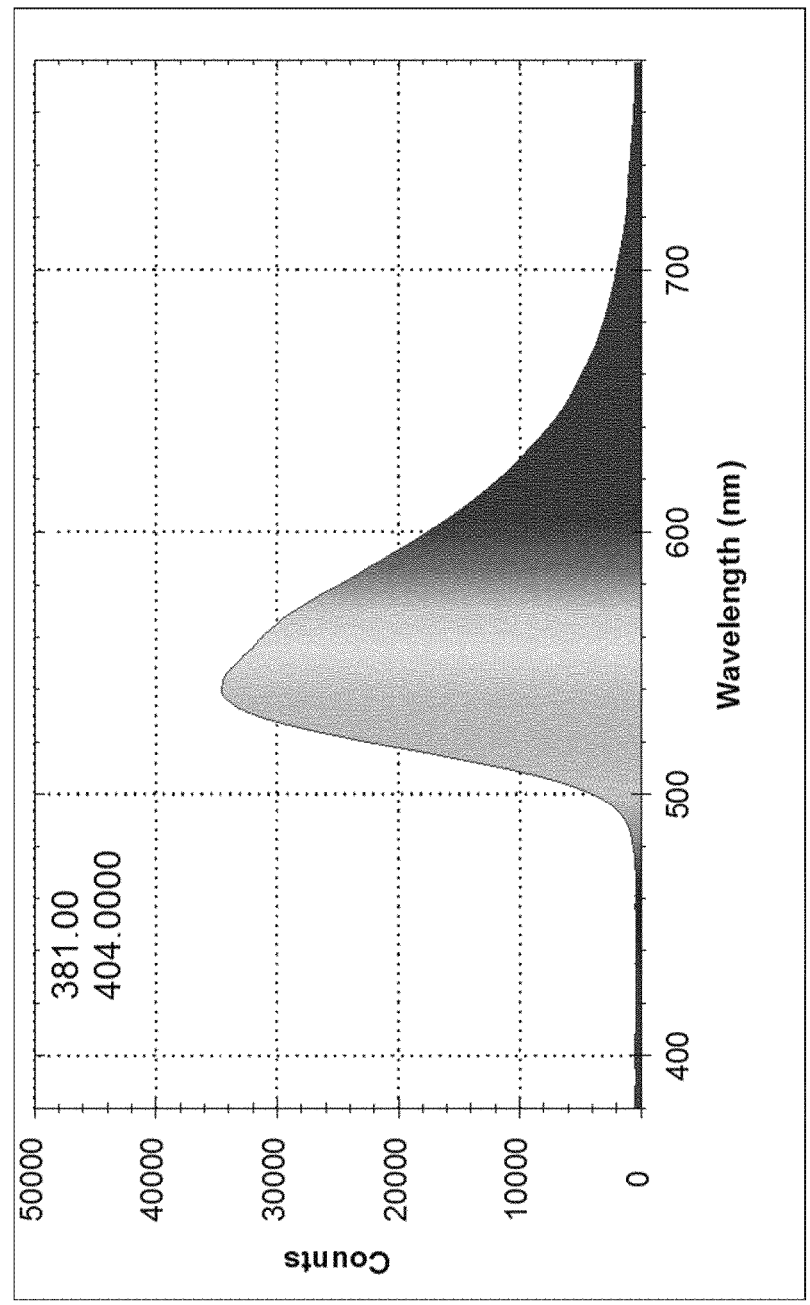

FIG. 21 shows the Emission spectra generated by Film G by down-conversion of UV-light $\lambda_{exc}$=385 nm [Example 20].

Figure 22:
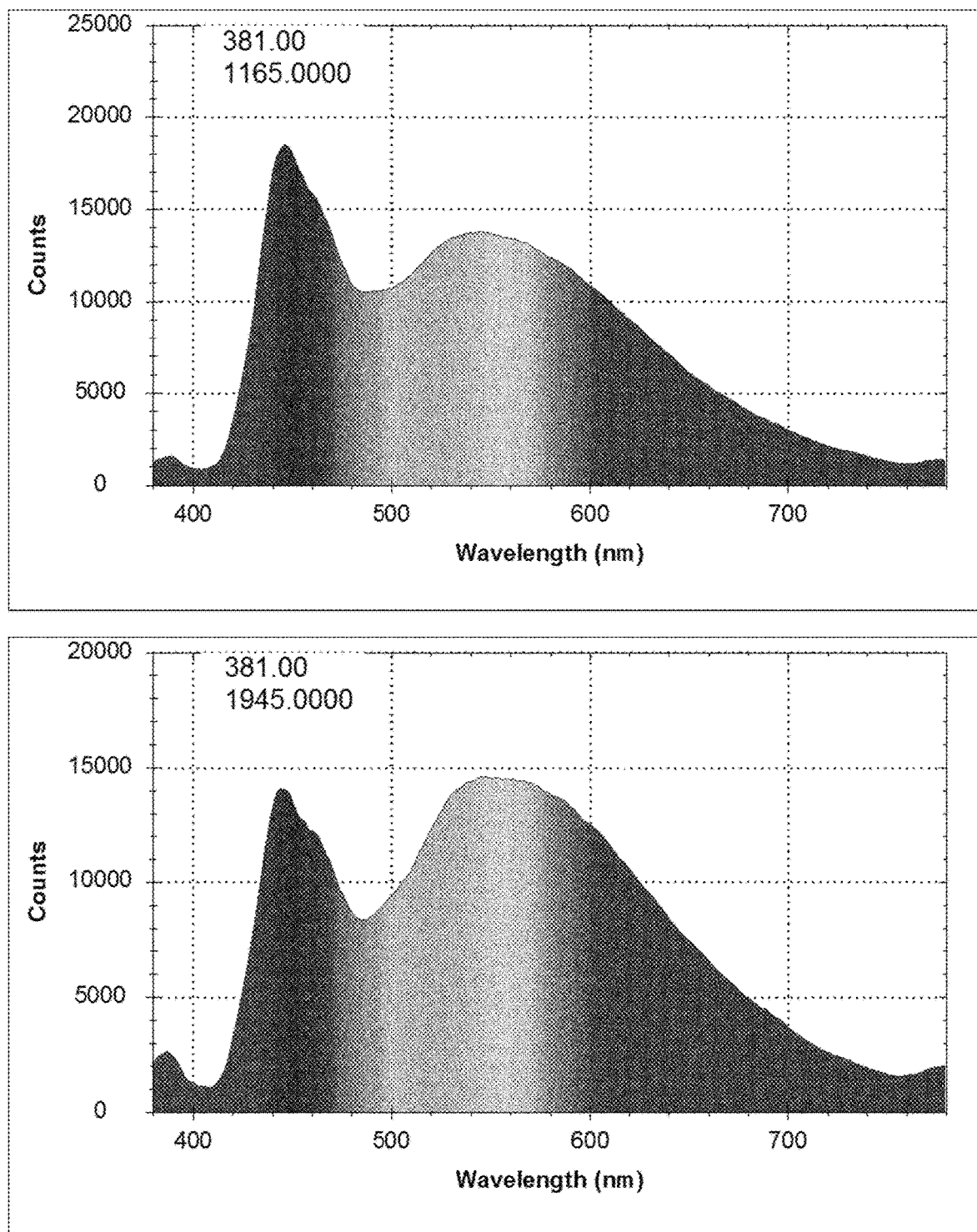

FIG. 22 shows the Emission spectra generated by Film J (left) and Film K (right) by down-conversion of UV-light at $\lambda_{exc}$=385 nm [Example 20].

Figure 23:
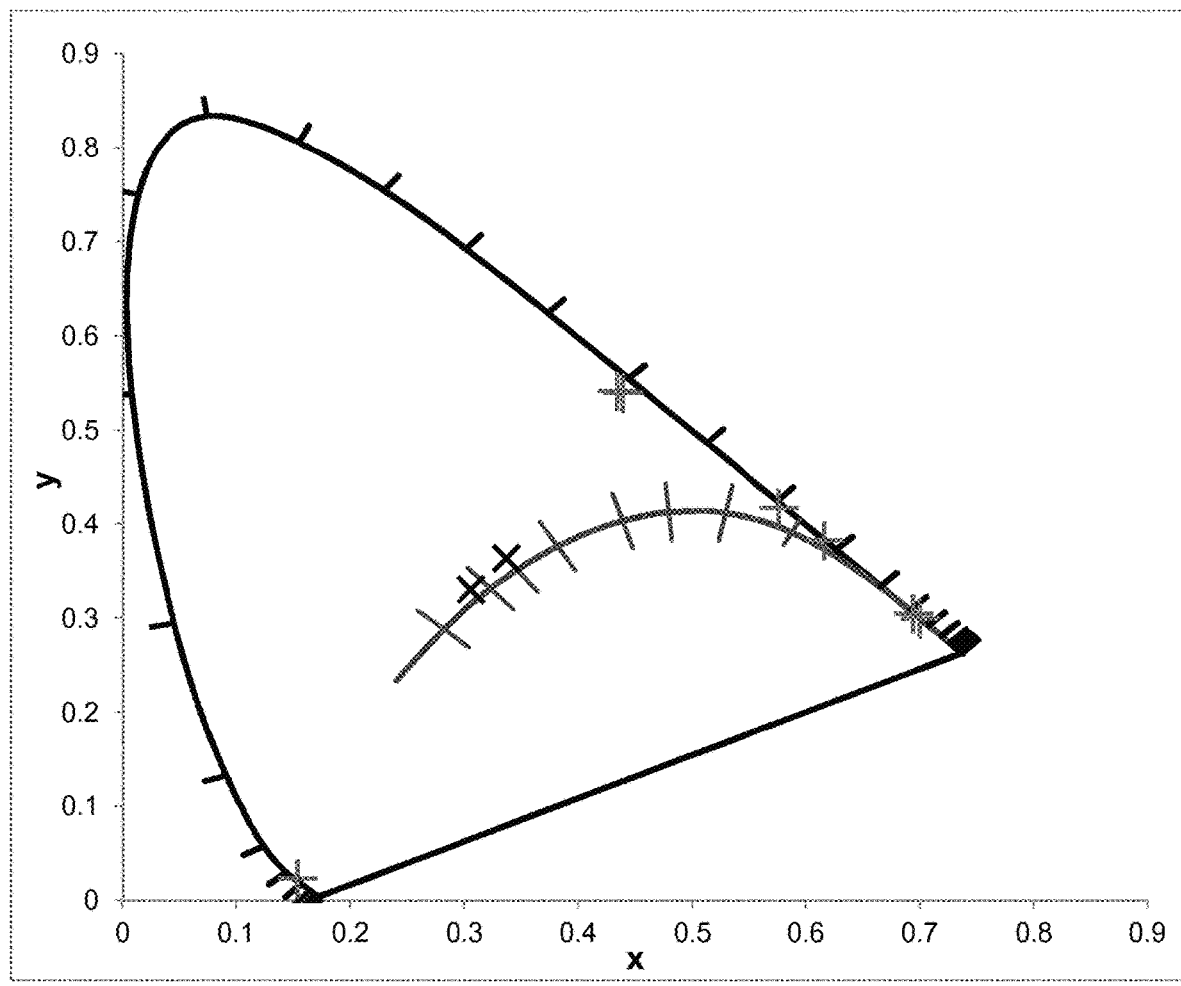

FIG. 23 shows the position in the CIE 1931 chromaticity diagram of light emitted by Film J and Film K when irradiated in a remote phosphor LED array at $\lambda_{exc}$=385 nm [Example 20].

Figure 24:
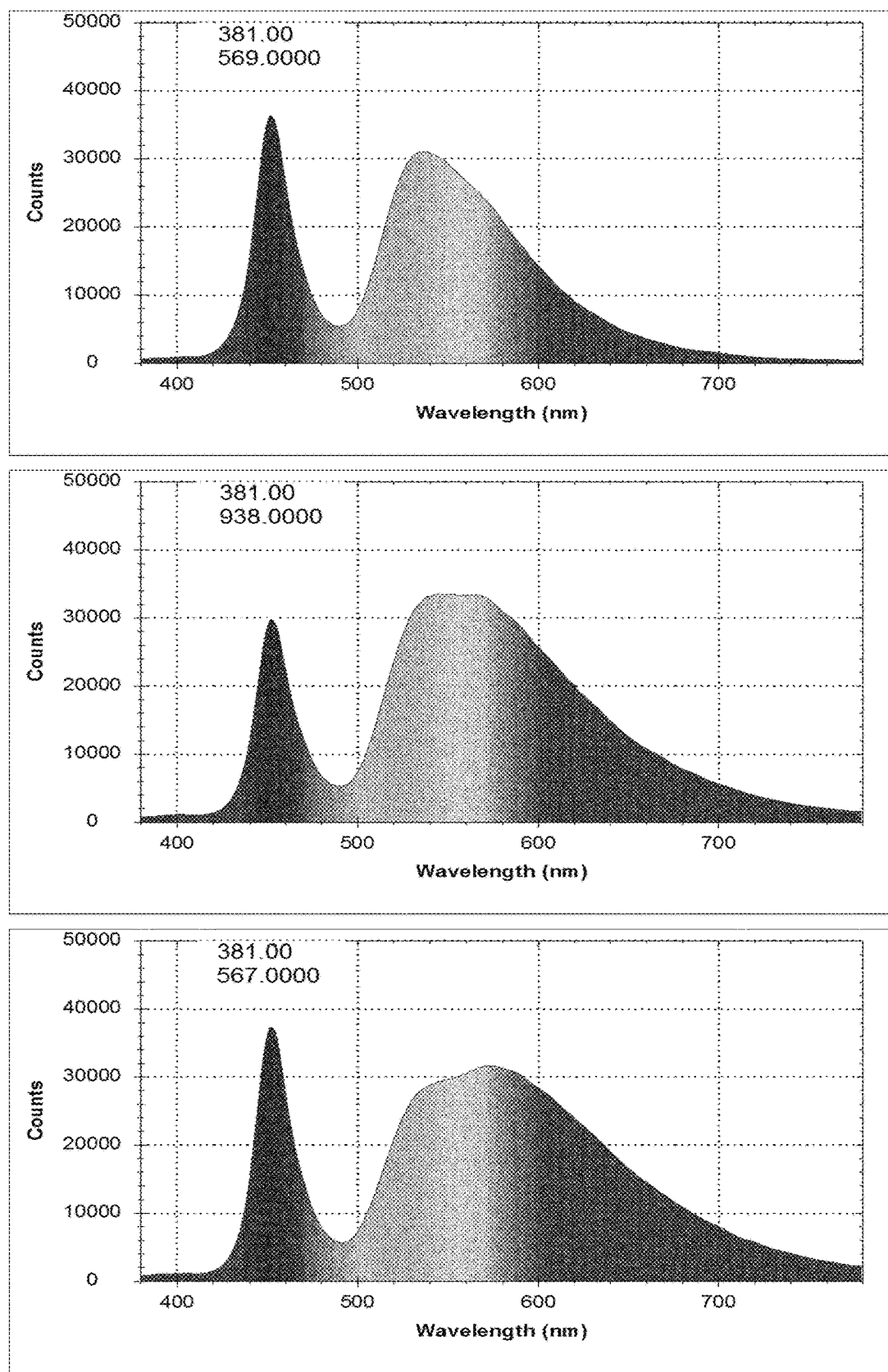

FIG. 24 shows the Emission spectra generated by Film L (top, left), Film M (top, right) and Film N (bottom) by down-conversion of blue light at $\lambda_{exc}$=450 nm [Example 20].

Figure 25:
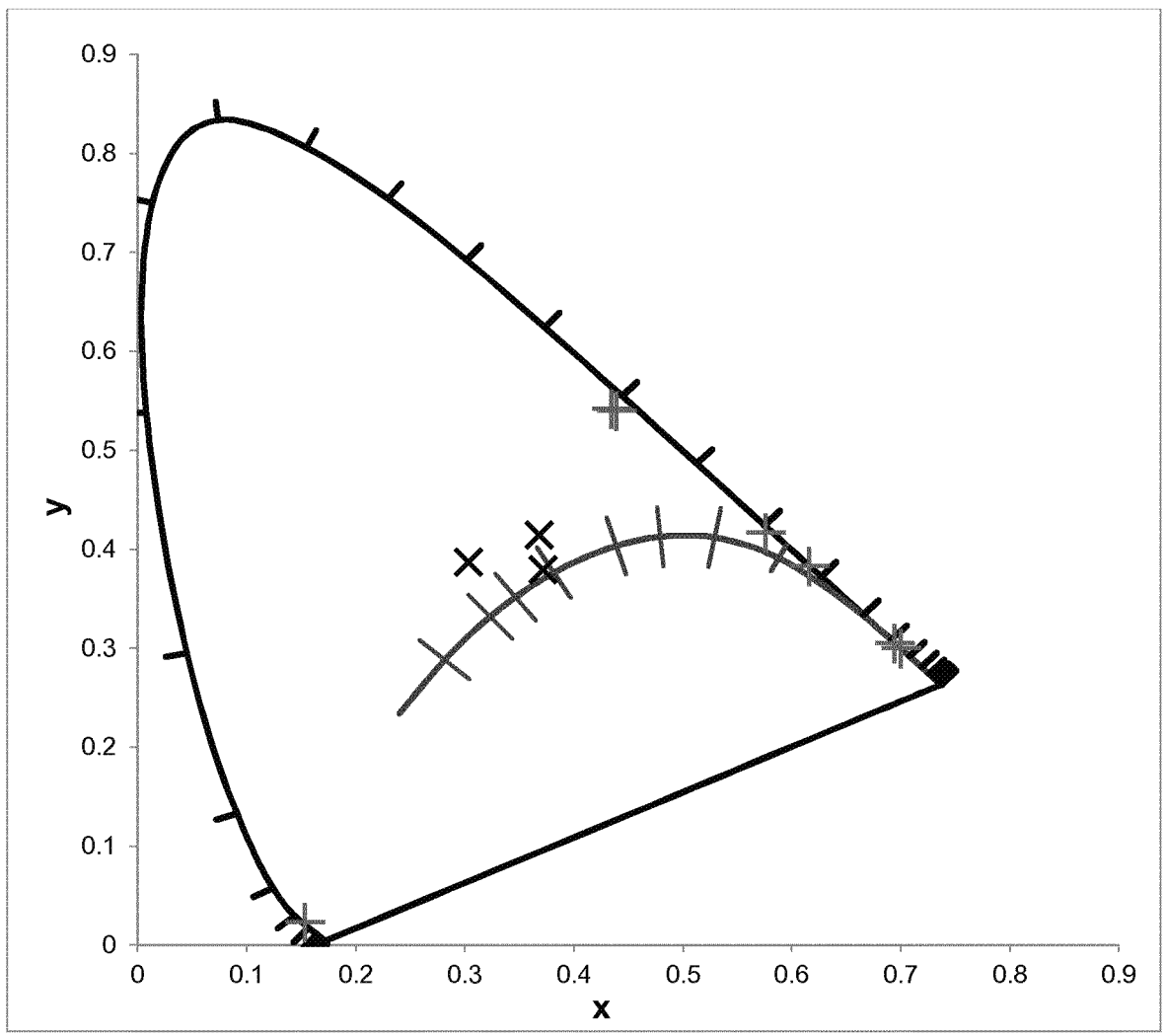

FIG. 25 shows the position in the CIE 1931 chromaticity diagram of light emitted by Films L-N when irradiated in a remote phosphor LED array at $\lambda_{exc}$=450 nm [Example 20].

Figure 26:
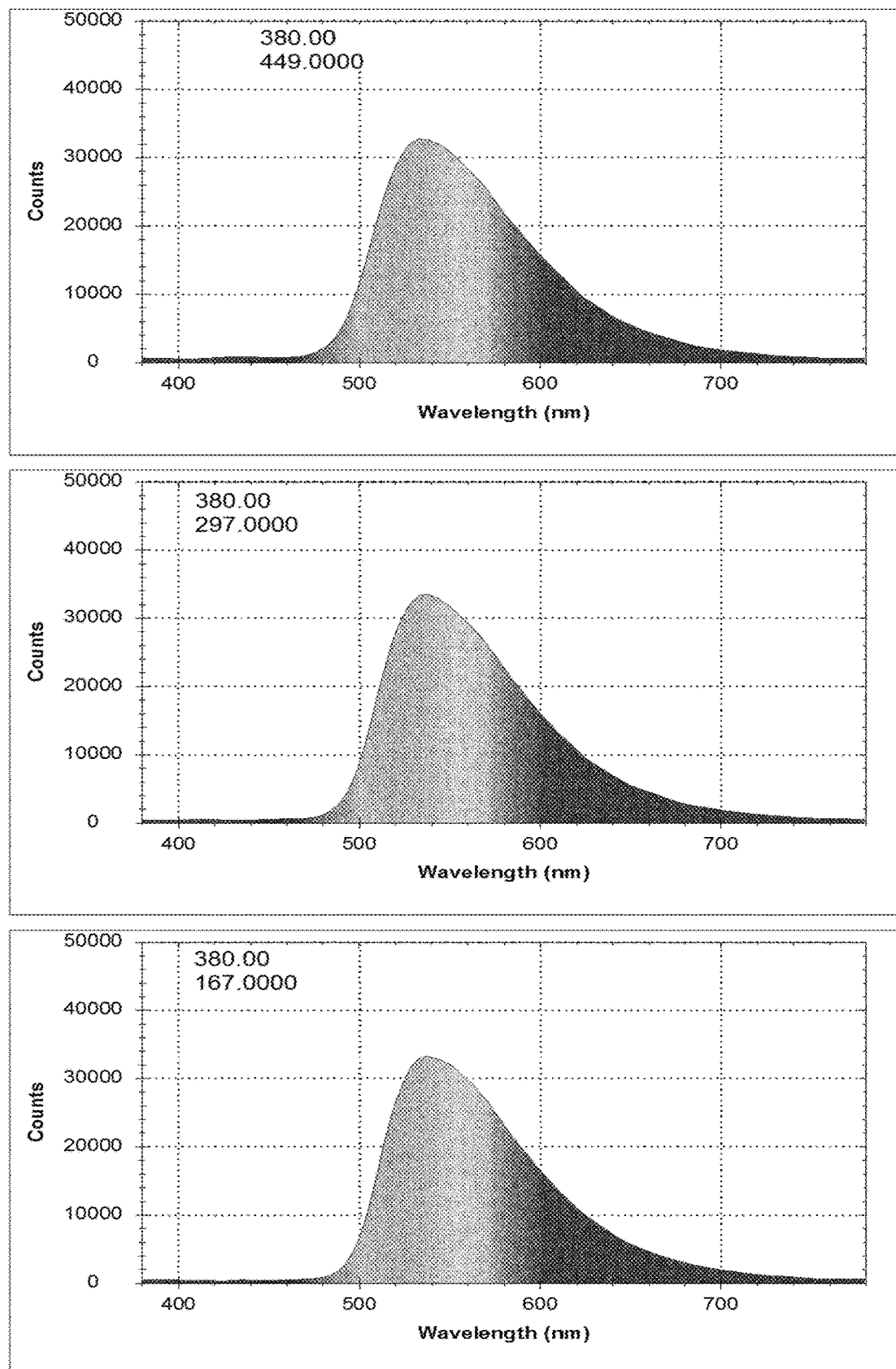

FIG. 26 shows the Emission spectra generated by Film O (top, left), Film P (top, right) and Film Q (bottom) by down-conversion of UV-light at $\lambda_{exc}$=385 nm (Example 21).

Figure 27:
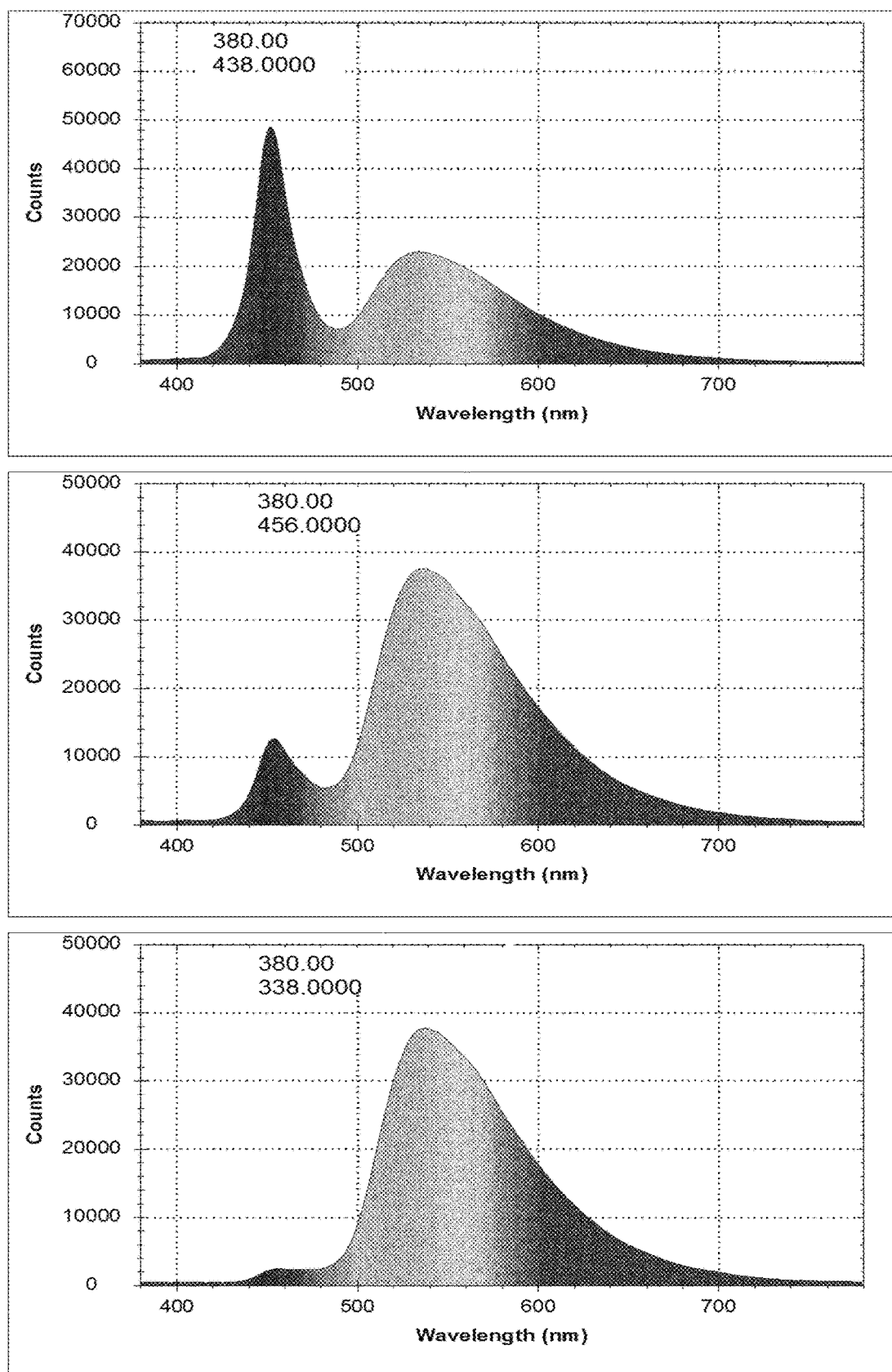

FIG. 27 shows the Emission spectra generated by Film O (top, left), Film P (top, right) and Film Q (bottom) by down-conversion of blue light at $\lambda_{exc}$=450 nm (Example 21).

Figure 28:
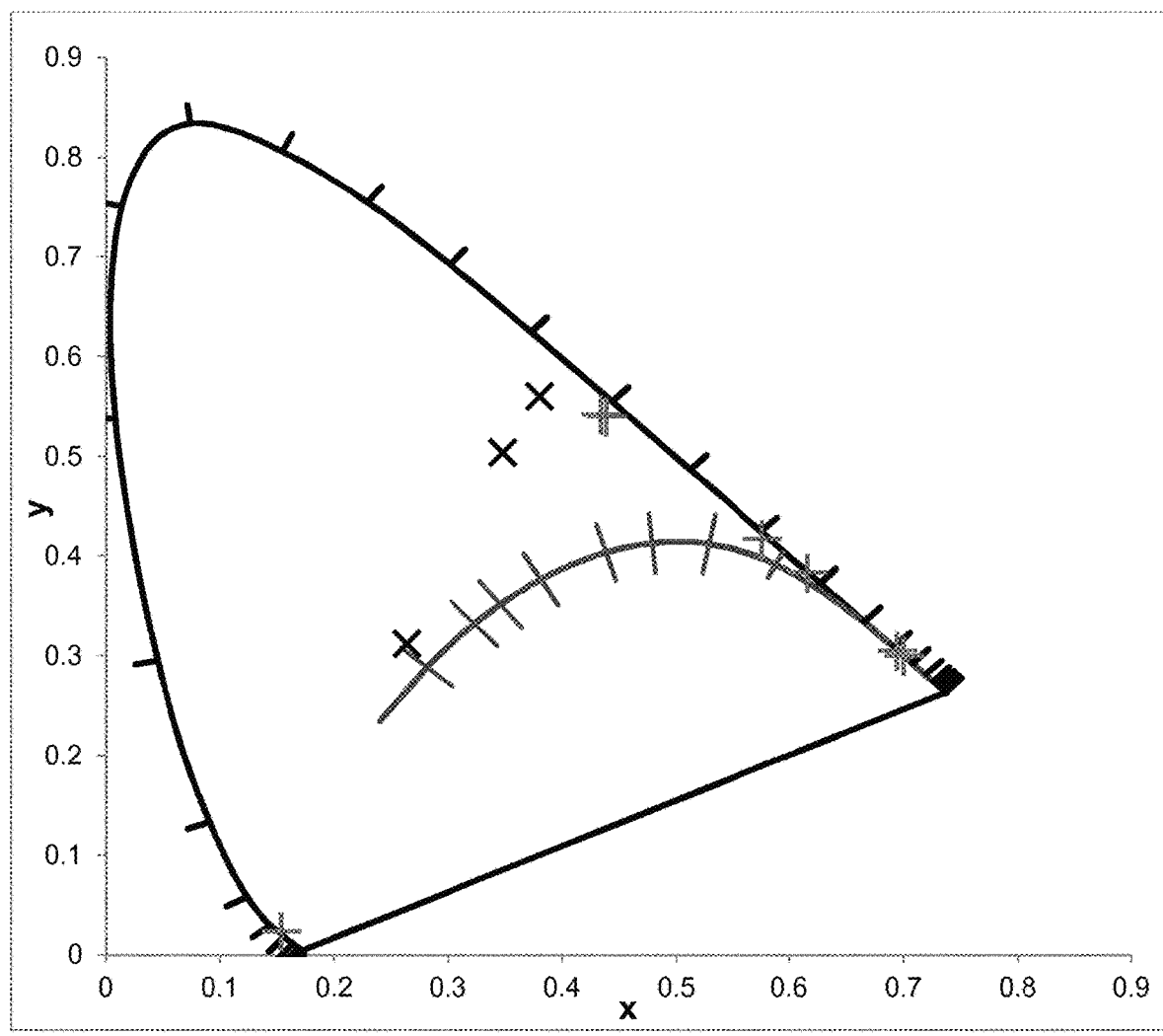

FIG. 28 shows the position in the CIE 1931 chromaticity diagram of light emitted by Films O-Q when irradiated in a remote phosphor LED array at $\lambda_{exc}$=450 nm (Example 21).

Figure 29:
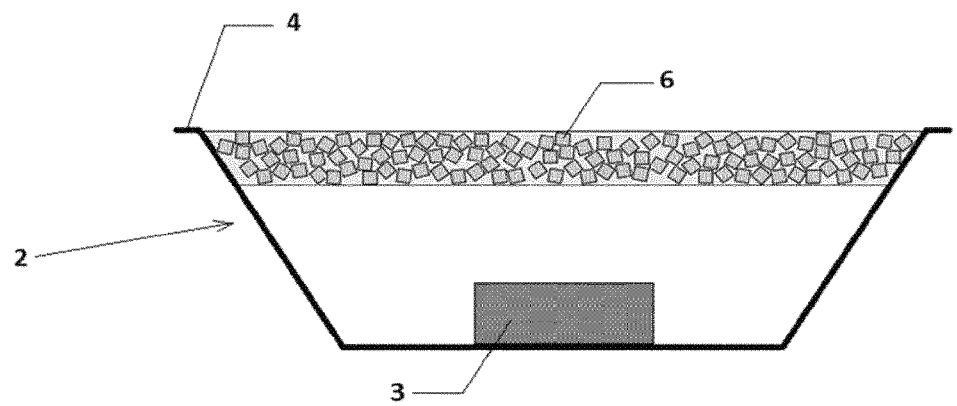

FIG. 29 shows a schematic representation of an exemplary light emitting device according to an aspect of the present invention. The light emitting device (2) shown in FIG. 29 is a conventional "remote phosphor" LED assembly with a standard LED chip (3). Above the LED chip (3) is a LED well (4) which optionally comprises a volume of a commercially available resin (5) that covers and submerges the LED chip (3). A remote phosphor (6) of sufficient thickness and formed from the resin of the present invention is positioned at the opening of the well (4). The remote phosphor (6) may be formed by curing a precursor mixture which comprises the nanoparticles of the present invention and any other required reactants, e.g. by exposure to light, to form the resin layer of the remote phosphor (6) or it may be prefabricated by, for example, extrusion of nanoparticles of the present invention in the presence of an encapsulation medium to form the remote phosphor (6).

Figure 30:
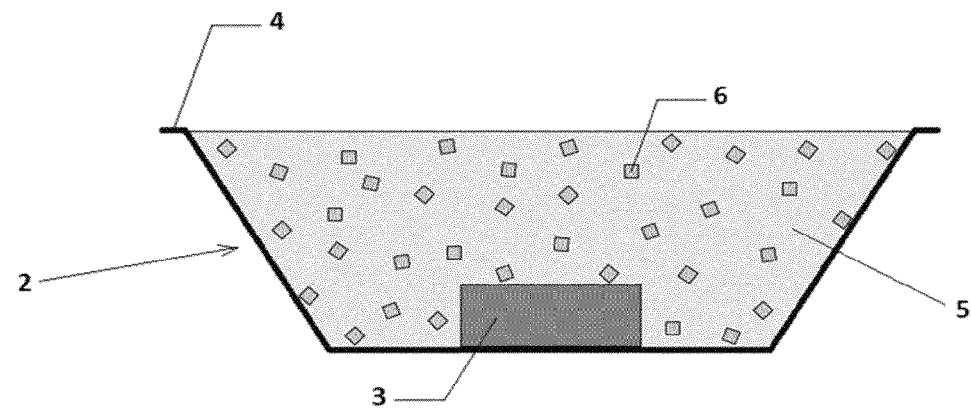

FIG. 30 shows a schematic representation of an exemplary light emitting device according to an aspect of the present invention. The light emitting device shown in FIG. 30 is a conventional "potted phosphor" LED assembly (2) with a standard LED chip (3). Above the LED chip (3) is a LED well (4) that optionally comprises a volume of a commercially available resin (5) that covers and submerges the LED chip (3), and a potted phosphor layer (6) present within the well (4). The potted phosphor layer (6) is formed from the resin of the present invention. The potted phosphor layer (6) may be formed by curing a precursor mixture which comprises the nanoparticles of the present invention and any other required reactants, e.g. by exposure to light, to form the resin layer of the potted phosphor (6) or it may be prefabricated by, for example, extrusion of nanoparticles of the present invention in the presence of an encapsulation medium to form the potted phosphor (6).

Figure 31:
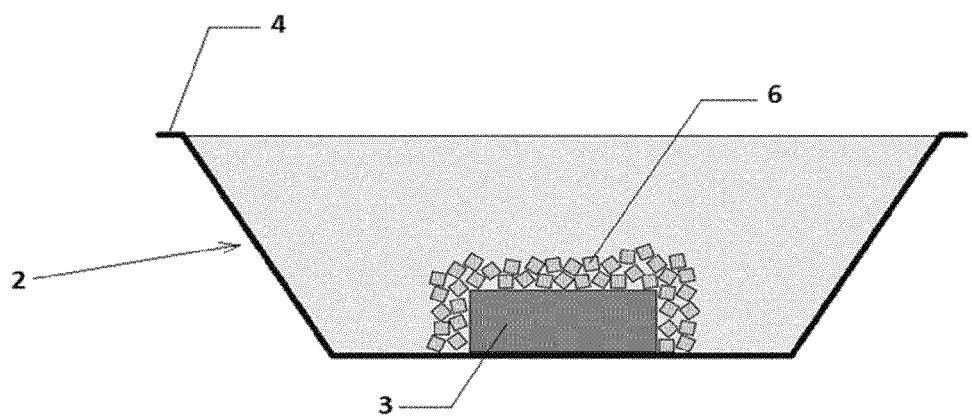

FIG. 31 shows a schematic representation of an exemplary light emitting device according to an aspect of the present invention. The light emitting device shown in FIG. 31 is an "on chip" LED assembly (2) with a standard LED chip (3). Above the LED chip (3) is a LED well (4) that optionally comprises a volume of a commercially available resin (5) that covers and submerges the LED chip (3) that has a phosphor layer (6) present on the chip (3). The phosphor layer (6) may be formed by depositing phosphor or the phosphor in a precursor mixture on the chip (3) which optionally comprises other required reactants to form the resin layer or it may be prefabricated by, for example, extrusion of nanoparticles of the present invention in the presence of an encapsulation medium to form the "on chip" phosphor layer (6).

Example 1—Cross-Linked PFO Nanoparticles (which are UV Absorbing and Emit Blue Light)

Synthesis

Referring to Scheme 1 and Table 1 shown below, sodium dodecyl sulfate (SDS) (50.0 mg) and deionised water (10 mL) were transferred to a Schlenk tube and the resultant solution was degassed by bubbling with argon for 20 minutes. Monomer A (see Table 1), crosslinker B (see Table 1) and monomer C (58.6 mg, 9.12×10² mmol) were dissolved in toluene (1 mL), to which hexadecane (78 μL) was also added, and this solution was degassed for 5 minutes in the same manner. Tetrakis(triphenylphosphine)palladium(0) (2.2 mg, 9.13×10⁴ mmol) was added to the monomer solution, which was then transferred to the reaction vessel. The reaction mixture was emulsified by ultrasonication (Cole Parmer 750 W ultasonicator, fitted with microtip, on 22% power) for 2 minutes while cooling with an ice bath. The Schlenk tube was resealed and the miniemulsion was heated to 72° C., followed by addition of 1M aqueous sodium hydroxide solution (365 μL), and the reaction mixture was stirred for 16 hours. After cooling to room temperature, the cap of the reaction vessel was removed and the emulsion was stirred for 5 hours to remove the residual toluene.

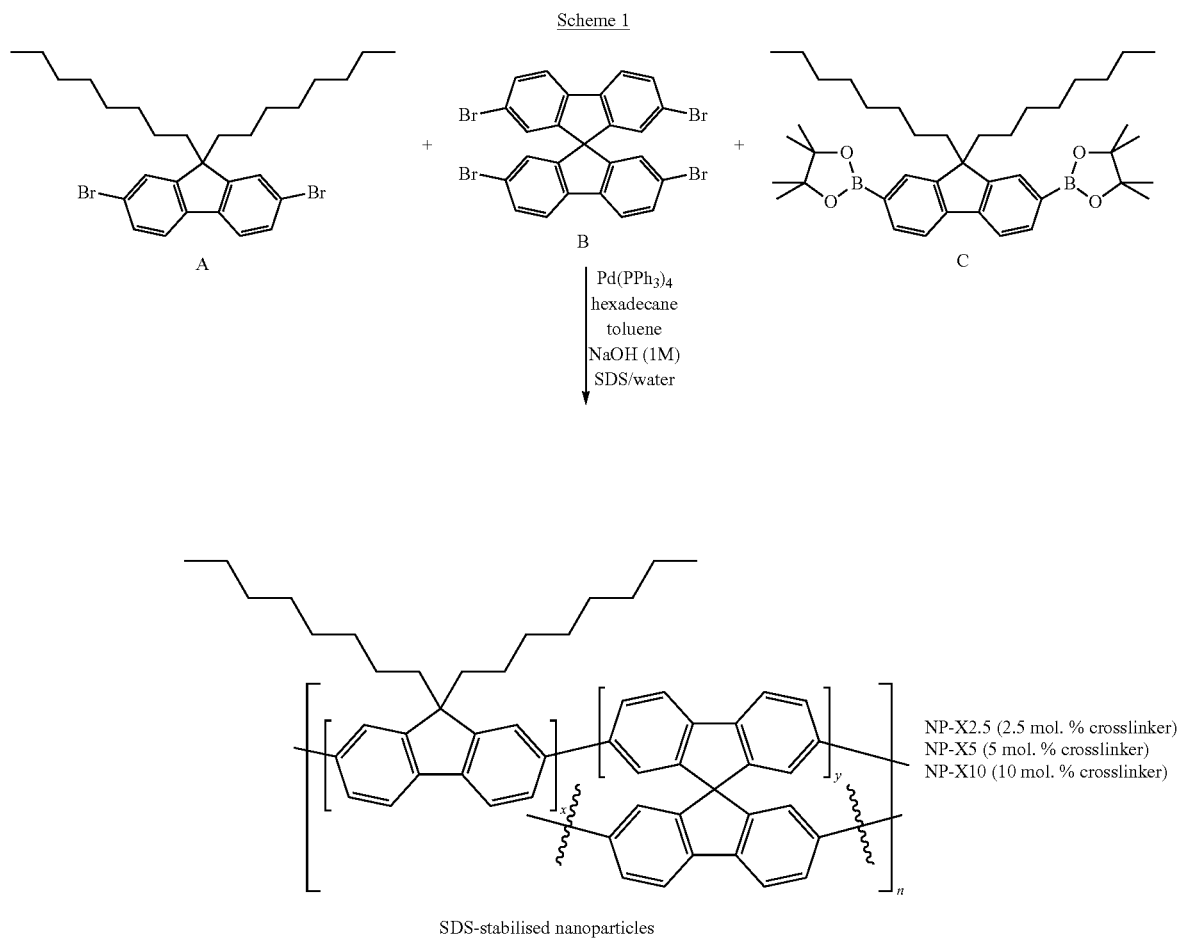

Scheme 1

SDS-stabilised nanoparticles

NP-X2.5 (2.5 mol. % crosslinker)
NP-X5 (5 mol. % crosslinker)
NP-X10 (10 mol. % crosslinker)

TABLE 1

Reaction variables for synthesis of cross-linked PFO nanoparticles

| Sample Name | Monomer A (mass, moles) | Crosslinker B (mass, moles) |
|---|---|---|
| NP-X2.5 | 45.0 mg<br>$8.21 \times 10^{-2}$ mmol | 2.9 mg<br>$4.6 \times 10^{-3}$ mmol |
| NP-X5 | 40.0 mg<br>$7.29 \times 10^{-2}$ mmol | 5.8 mg<br>$9.1 \times 10^{-3}$ mmol |
| NP-X10 | 30.0 mg<br>$5.47 \times 10^{-2}$ mmol | 11.6 mg<br>$1.82 \times 10^{-2}$ mmol |

Surfactant Removal and DLS Analysis (Nanoparticles in Water)

Figure 1:
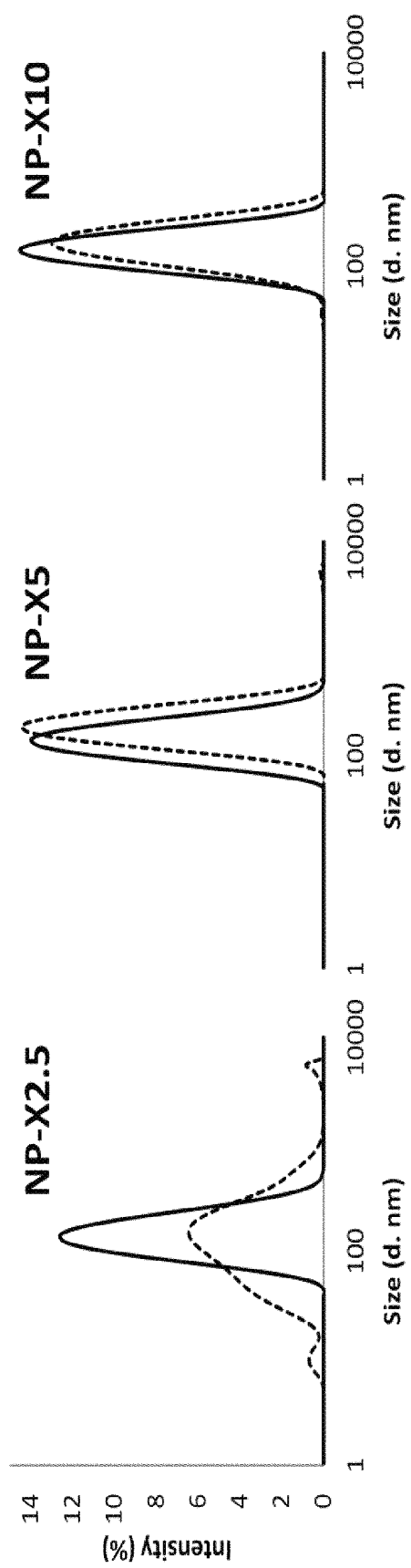
FIG. 1 shows DLS particle size histograms of the cross-linked nanoparticles of Example 1 in water (solid line) or THF (broken line).

A 400 μL aliquot of the crude nanoparticle suspension was diluted with 1.6 mL of deionised water, to which Amberlite XAD-2 resin (20 mg, pre-washed with 2×2 mL of water) was added. The suspension was shaken at room temperature for 15 minutes before decanting off the nanoparticle suspension. This Amberlite XAD-2 purification step was repeated, after which time the suspension no longer foamed upon shaking and was filtered through glass wool prior to dynamic light scattering (DLS) analysis of particle size using a Malvern Zetasizer Nano ZS. Results are shown in Table 2 and FIG. 1.

TABLE 2

DLS analysis of cross-linked PFO nanoparticles in water

| Sample Name | Z-Average (d. nm) | Size by Intensity (d. nm) | St. Dev. (nm) | PdI |
|---|---|---|---|---|
| NP-X2.5 | 128 | 154 | 69 | 0.16 |
| NP-X5 | 130 | 151 | 60 | 0.14 |
| NP-X10 | 129 | 150 | 56 | 0.13 |

DLS Analysis (Nanoparticles in THF)

A 200 μL aliquot of the crude nanoparticle suspension was flocculated through addition of 1.3 mL toluene and the polymer was isolated by centrifugation (14,000 rpm, 1 minute) and decantation of the supernatant. The polymer was dried in air to remove residual methanol before dissolving in tetrahydrofuran (THF, 1 mL). The resultant suspension was measured directly using a Malvern Zetasizer Nano ZS. Results are shown in Table 3 and FIG. 1.

TABLE 3

DLS analysis of cross-linked PFO nanoparticles in THF

| Sample name | Z-Average (d. nm) | Size by Intensity (d. nm) | St. Dev. (nm) | PdI |
|---|---|---|---|---|
| NP-X2.5 | — | — | — | n/a[a] |
| NP-X5 | 174 | 98 (99.6%) 4827 (0.4%) | 74 (99.6%) 711 (0.4%)[a] | 0.13 |
| NP-X10 | 147 | 175 | 73 | 0.15 |

[a]secondary peak likely to result from a small proportion of aggregated nanoparticles UV/Vis Analysis (Nanoparticles in Water or THF)

Figure 2:
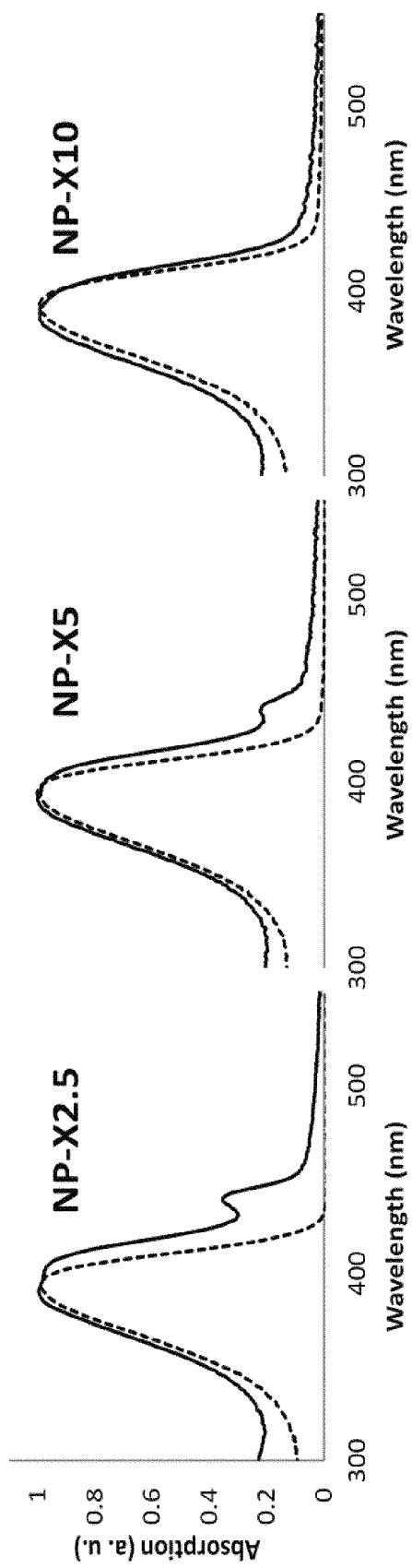
FIG. 2 shows UV/Vis spectra of the cross-linked nanoparticles of Example 1 in water (solid line) or THF (broken line).

Following surfactant removal via treatment with Amberlite XAD-2, 40 μL of the nanoparticle suspension was diluted with 3 mL of water. UV-Vis absorption spectra of the nanoparticles at this concentration were recorded on a Varian Cary 555000UV-Vis-NIR spectrophotometer at room temperature. FIG. 2 shows UV/Vis spectra of the cross-linked PFO nanoparticles.

Photoluminescence (PL) Analysis (Nanoparticles in Water or THF)

Figure 3:
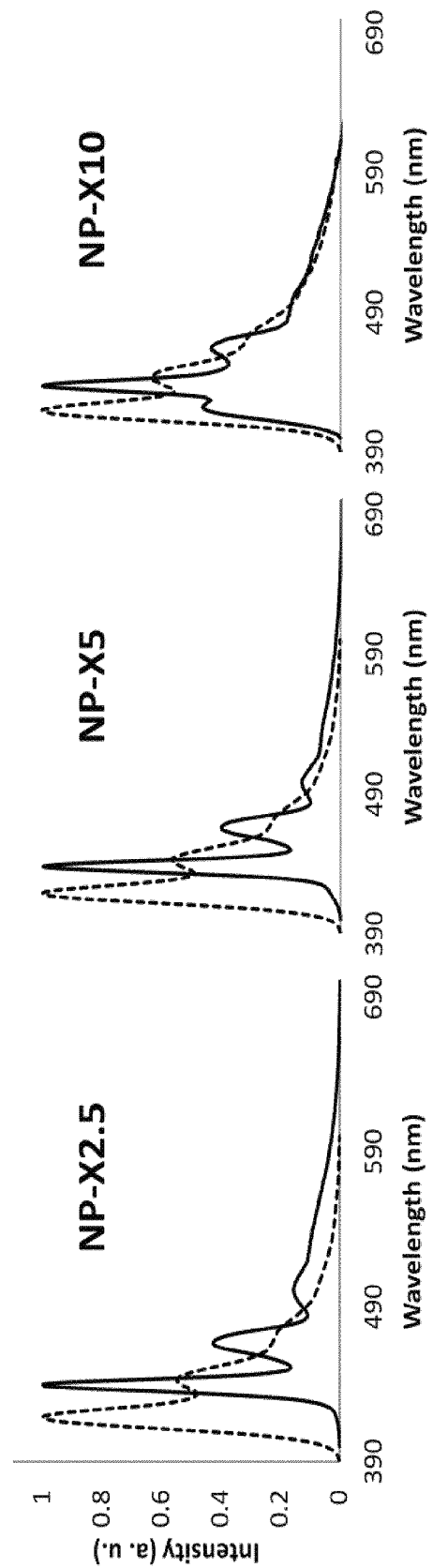
FIG. 3 shows PL spectra of the cross-linked nanoparticles of Example 1 in water (solid line) or THF (broken line).

Following surfactant removal via treatment with amberlite XAD-2, 40 μL of the nanoparticle suspension was diluted with 3 mL of water. PL spectra were recorded on a Varian Cary Eclipse fluorimeter. FIG. 3 shows PL spectra of the cross-linked PFO nanoparticles Photoluminescence (PL) Analysis (Nanoparticles in Water)

Photoluminescence measurements were obtained using a Fluoromax-4 spectrofluorometer. Measurements were carried out on dilute dispersions of the nanoparticles in water (800 μL, abs>1), using the same volume of water for background measurements. The results are provided in Table 4.

TABLE 4

Optical properties of PFO nanoparticles in water

| Sample Name | $\lambda_{max}$ | $\lambda_{em}$[a] |
|---|---|---|
| NP-X2.5 | 390 | 440 |
| NP-X5 | 390 | 438 |
| NP-X10 | 390 | 437 |

[a]$\lambda_{ex}$ = 380 nm

Example 2—5% 2,1,3-Benzothiadiazole, 35% 9,9-Di(undecanoic acid)fluorene and 5% 9,9'-Spirobifluorene Cross-Linked Polyfluorene Nanoparticles (which are UV Absorbing and Emit Green Light)

Synthesis

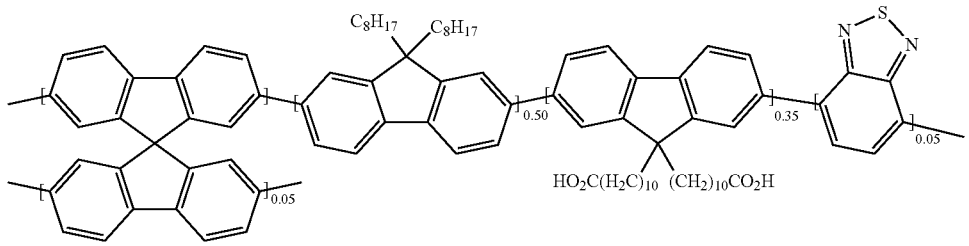

In a Schlenk tube was added water (22.0 mL), sodium dodecyl sulfate (110 mg, 382 μmol) and 1M aqueous sodium hydroxide (1080 μL, 1080 μmol). The solution was purged with argon for 2 hours. In a vial was weighed 9,9-dioctylfluorene-2,7-diboronic acid bis(1,3-propanediol) ester (111.7 mg, 200 μmol), 2,7-dibromo-9,9-di(undecanoic acid) fluorene (96.9 mg, 140 μmol), 2,2',7,7'-tetrabromo-9,9'-spirobifluorene (12.6 mg, 20 μmol), 4,7-dibromobenzo[c]-1,2,5-thiadiazole (5.9 mg, 20 μmol) tris(dibenzylideneacetone) dipalladium(0) (4.6 mg, 5 μmol), tri(o-tolyl)phosphine (9.1 mg, 30 μmol) and hexadecane (171 μL, 585 μmol). The vial was transferred to an argon filled glovebox, sealed with a rubber septum and removed. Toluene (2.19 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, stirred for 30 seconds and ultrasonicated for 1 further minute. The Schlenk tube was sealed, placed in a preheated oil bath at 50° C. and stirred for 20 hours. The Schlenk was opened and a stream of nitrogen gas passed over the emulsion at 50° C., with stirring. The emulsion was cooled to room temperature, the volume increased to 23.0 mL with deionised water and filtered through a glass wool plug. The emulsion was obtained as a milky dark green solution. DLS (water): Z-average=79.0 nm, PdI=0.117, $D_n$=52.4 nm and SD=15.3 nm. UV-Vis Abs. (water): $\lambda_{max}$=380 nm, $\lambda_{sec.}$=450 nm, $\lambda_{onset}$=520 nm. UV-Vis PL (water): $\lambda_{max}$=535 nm, $\lambda_{sec.}$=424 nm.

Example 3—5% 4,7-Bis(4-hexylthiophen-2-yl)
benzo[c][1,2,5]thiadiazole and 5% 9,9'-Spirobifluo-
rene Cross-Linked Polyfluorene Nanoparticles
(which are UV Absorbing and Emit Red Light)

Synthesis

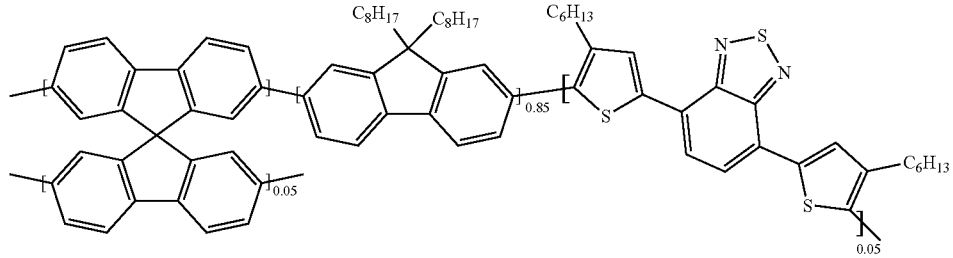

In a Schlenk tube was added water (22.0 mL), sodium dodecyl sulfate (110 mg, 382 µmol) and 1M aqueous sodium hydroxide (800 µL, 800 µmol). The solution was purged with argon for 2 hours. In a vial was weighed 9,9-dioctylfluorene-2,7-diboronic acid bis(1,3-propanediol) ester (111.7 mg, 200 µmol), 9,9-dioctyl-2,7-dibromofluorene (76.8 mg, 140 µmol), 2,2',7,7'-tetrabromo-9,9'-spirobifluorene (12.6 mg, 20 µmol), 4,7-bis(5-bromo-4-hexyl-2-thienyl)-2,1,3-benzothiadiazole (12.5 mg, 20 µmol), tris(dibenzylideneacetone)dipalladium(0) (4.6 mg, 5 µmol), tri(o-tolyl)phosphine (9.1 mg, 30 µmol) and hexadecane (171 µL, 585 µmol). The vial was transferred to an argon filled glovebox, sealed with a rubber septum and removed. Toluene (2.19 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, stirred for 30 seconds and ultrasonicated for 1 further minute. The Schlenk tube was sealed, placed in a preheated oil bath at 50° C. and stirred for 20 hours. The Schlenk was opened and a stream of nitrogen gas passed over the emulsion at 50° C., with stirring. The emulsion was cooled to room temperature, the volume increased to 23.0 mL with deionised water and filtered through a glass wool plug. The emulsion was obtained as a milky bright red solution. DLS (water): Z-average=105 nm, PdI=0.125, $D_n$=64.4 nm and SD=20.8 nm. UV-Vis Abs. (water): $\lambda_{max}$=382 nm, $\lambda_{sec.}$=433 nm, $\lambda_{sec.}$=514 nm, $\lambda_{onset}$=620 nm. UV-Vis PL (water): $\lambda_{max}$=621 nm, $\lambda_{sec.}$=437 nm.

Example 4—10% 4,7-Bis(4-hexylthiophen-2-yl)
benzo[c][1,2,5]thiadiazole and 5% 9,9'-Spirobifluo-
rene Cross-Linked Polyfluorene Nanoparticles
(which are UV Absorbing and Emit Red Light)

Synthesis

In a Schlenk tube was added water (22.0 mL), sodium dodecyl sulfate (110 mg, 382 µmol) and 1M aqueous sodium hydroxide (800 µL, 800 µmol). The solution was purged with argon for 2 hours. In a vial was weighed 9,9-dioctylfluorene-2,7-diboronic acid bis(1,3-propanediol) ester (111.7 mg, 200 µmol), 9,9-dioctyl-2,7-dibromofluorene (65.8 mg, 120 µmol), 2,2',7,7'-tetrabromo-9,9'-spirobifluorene (12.6 mg, 20 µmol), (25.1 mg, 40 µmol), tris(dibenzylideneacetone) dipalladium(0) (4.6 mg, 5 µmol), tri(o-tolyl)phosphine (9.1 mg, 30 µmol) and hexadecane (171 µL, 585 µmol). The vial was transferred to an argon filled glovebox, sealed with a rubber septum and removed. Toluene (2.19 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, stirred for 30 seconds and ultrasonicated for 1 further minute. The Schlenk tube was sealed, placed in a preheated oil bath at 50° C. and stirred for 20 hours. The Schlenk was opened and a stream of nitrogen gas passed over the emulsion at 50° C., with stirring. The emulsion was cooled to room temperature, the volume increased to 23.0 mL with deionised water and filtered through a glass wool plug. The emulsion was obtained as a milky bright red solution. DLS (water): Z-average=130 nm, PdI=0.264, $D_n$=58.4 nm and SD=20.9 nm. UV-Vis Abs. (water): $\lambda_{max}$=382 nm, $\lambda_{sec.}$=432 nm, $\lambda_{sec.}$=515 nm, $\lambda_{onset}$=623 nm. UV-Vis PL (water): $\lambda_{max}$=625 nm.

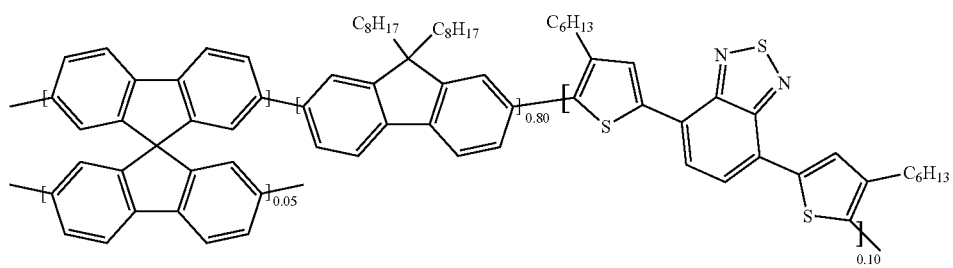

Example 5—2% 9,9-Di(undecanoic acid)fluorene, 5% 2,1,3-Benzothiadiazole, 33% Di(hex-5-en-1-yl) fluorene and 5% 9,9'-Spirobifluorene Cross-Linked Polyfluorene Nanoparticles (which are UV Absorbing, Emit Green Light and Possess a Pendent Terminal Double Bond to Participate in Polymerisation with a H—Si Functionalised Resin)

Synthesis

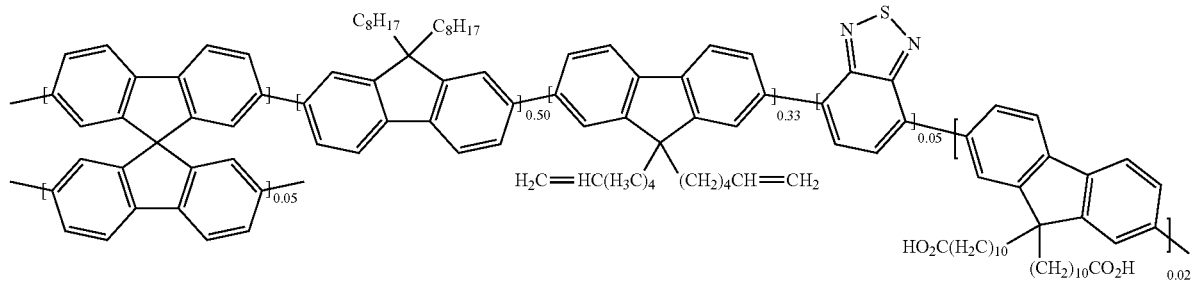

In a Schlenk tube was added water (22.0 mL), sodium dodecyl sulfate (110 mg, 382 μmol) and 1M aqueous sodium hydroxide (816 μL, 816 μmol). The solution was purged with argon for 2 hours. In a vial was weighed 9,9-dioctylfluorene-2,7-diboronic acid bis(1,3-propanediol) ester (111.7 mg, 200 μmol), 2,7-dibromo-9,9-di(undecanoic acid) fluorene (5.5 mg, 8 μmol), 2,2',7,7'-tetrabromo-9,9'-spirobifluorene (12.6 mg, 20 μmol), 4,7-dibromobenzo[c]-1,2,5-thiadiazole (5.9 mg, 20 μmol), 2,7-dibromo-9,9-di(hex-5-en-1-yl)fluorene (64.5 mg, 132 μmol), tris(dibenzylideneacetone)dipalladium(0) (4.6 mg, 5 μmol), tri(o-tolyl)phosphine (9.1 mg, 30 μmol) and hexadecane (171 μL, 585 μmol). The vial was transferred to an argon filled glovebox, sealed with a rubber septum and removed. Toluene (2.19 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, stirred for 30 seconds and ultrasonicated for 1 further minute. The Schlenk tube was sealed, placed in a preheated oil bath at 50° C. and stirred for 20 hours. The Schlenk was opened and a stream of nitrogen gas passed over the emulsion at 50° C., with stirring. The emulsion was cooled to room temperature, the volume increased to 23.0 mL with deionised water and filtered through a glass wool plug. The emulsion was obtained as a milky dark green solution. DLS (water): Z-average=101 nm, PdI=0.166, $D_n$=55.1 nm and SD=18.1 nm. UV-Vis Abs. (water): $\lambda_{max}$=381 nm, $\lambda_{sec.}$=453 nm, $\lambda_{onset}$=522 nm. UV-Vis PL (water): $\lambda_{max}$=530 nm.

Example 6—CL-F8T2 CPNs (CL-F8T2/30 are Blue Light Absorbing and Emit Green Light)

This example is not a cross-linked polymer (as required in the present invention), but it will be appreciated by those skilled in the art that one or more crosslinking monomers described herein could be included to form a nanoparticle of the present invention.

Synthesis

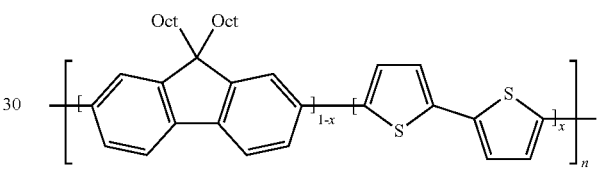

In a Schlenk tube, sodium dodecyl sulfate (50 mg) was dissolved in deionised water (10 mL) under argon. The solution was degassed by bubbling with argon for 30 minutes. In a separate vial, monomer A (58.6 mg, 9.12×10$^{-2}$ mmol), monomer B, monomer C (see amounts in Table 1), monomer D (5.8 mg, 9.12×10$^3$ mmol), tris(dibenzylideneacetone)dipalladium(0) (0.9 mg, 0.98×10$^3$ mmol) and tri(o-tolyl)phosphine (1.2 mg, 3.9×10$^4$ mmol) were dissolved in toluene (1 mL). Hexadecane was added (78 μL) and the mixture was degassed by bubbling with argon for 5 min. After this time, the monomer mixture was then injected to the SDS solution. To promote the miniemulsion, the Schlenk tube was taken to an ice bath and the mixture was sonicated using an ultrasonicator fitted with microtip (Cole Parmer 750 W ultrasonicator, 22% amplitude) for 2 minutes. The tube was resealed and then heated up to 72° C. Once reached this temperature, an aqueous solution of sodium hydroxide 1M (365 μL) was added and the reaction mixture was stirred for 16 h. After cooling down to room temperature, the Schlenk tube was opened and the mixture was stirred for 5 h to remove the residual toluene. To remove SDS, 400 μL of the resulting miniemulsion was diluted with 1.6 mL of deionised water and Amberlite XAD-2 (20 mg) previously washed with water (2×2 mL) was added. The mixture was stirred for 2 hours at room temperature and the Amberlite XAD-2 was removed. Treatment with Amberlite XAD-2 was repeated until the mixture was shaken and no foam formation was longer observed.

Table 5 below shows the amount of monomers B and C used. Table 6 below shows the particle size of the CL-F8T2 CPNs. Table 7 shows the optical properties of CL-F8T2 CPNs in water & THF.

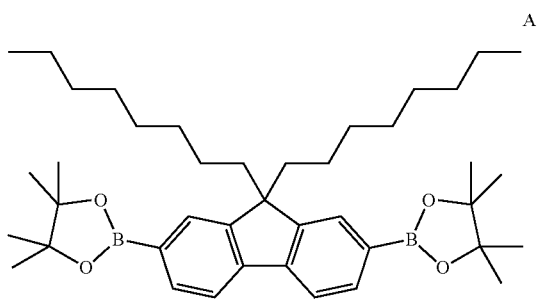

A

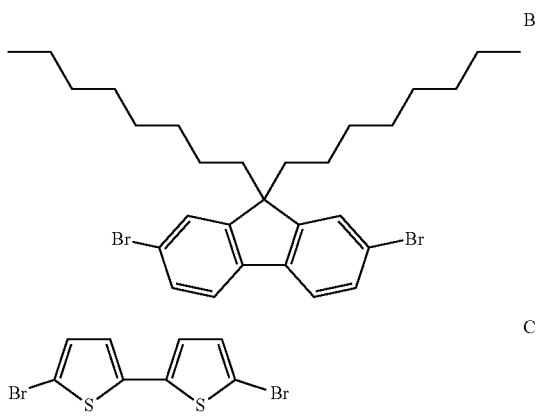

B

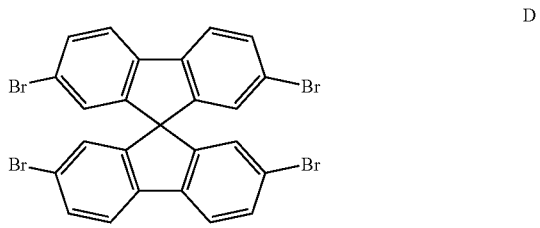

C

D

TABLE 5

Initial loading of monomers B and C in CL-F8T2 CPNs

| Polymer | Monomer C (% mol) | Monomer B (mass, moles) | Monomer C (mass, moles) |
|---|---|---|---|
| CL-F8T2/20 | 20 | 20 mg (3.65 × 10$^{-2}$ mmol) | 11.8 mg (3.65 × 10$^{-3}$ mmol) |
| CL-F8T2/30 | 30 | 10 mg (1.82 × 10$^{-2}$ mmol) | 17.8 mg (5.48 × 10$^{-2}$ mmol) |

TABLE 6

Particle size of CL-F8T2 CPNs in water & THF

| Polymer | Water | | | THF | | |
|---|---|---|---|---|---|---|
| | $d_z$ (nm) | PdI | $D_{Num}$ (nm) | $d_z$ (nm) | PdI | $D_{Num}$ (nm) |
| CL-F8T2/20 | 105 | 0.158 | 64 | 124 | 0.212 | 62 |
| CL-F8T2/30 | 103 | 0.178 | 53 | 120 | 0.223 | 63 |

TABLE 7 optical properties of CL-F8T2 CPNs in water & THF

| | Water | | THF | |
|---|---|---|---|---|
| Polymer | Absorption $\lambda_{max}$ (nm) | Fluorescence $\lambda_{max}$ (nm) | Absorption $\lambda_{max}$ (nm) | Fluorescence $\lambda_{max}$ (nm) |
| CL-F8T2/20 | 386 | 554 | 394 | 525 |
| CL-F8T2/30 | 431 | 541 | 438 | 498 |

Example 7—Synthesis of Cross-linked Blue, Green and Red (RGB) Conjugated Polymer Nanoparticles (CPN)s A series of cross-linked conjugated polymer nanoparticles (CPNs) based on PFO with blue (CL-PFO), green (CL-PFO-BT) and red emission (CL-PFO-DBT$_h$) were synthesised by miniemulsion polymerisation via Suzuki coupling of 9,9-dioctyl-9H-fluorene-2,7-diboronic acid bis(pinacol) ester (A) with 9,9-dioctyl-2,7-dibromofluorene (B), 2,2',7,7'-Tetrabromo-9,9'-spirobifluorene (C) and 4,7-dibromo-2,1,3-benzothiadiazole (D) or 4,7-di(4-hexylthien-2-yl)-2,1,3-benzothiadiazole (E) as acceptor units.

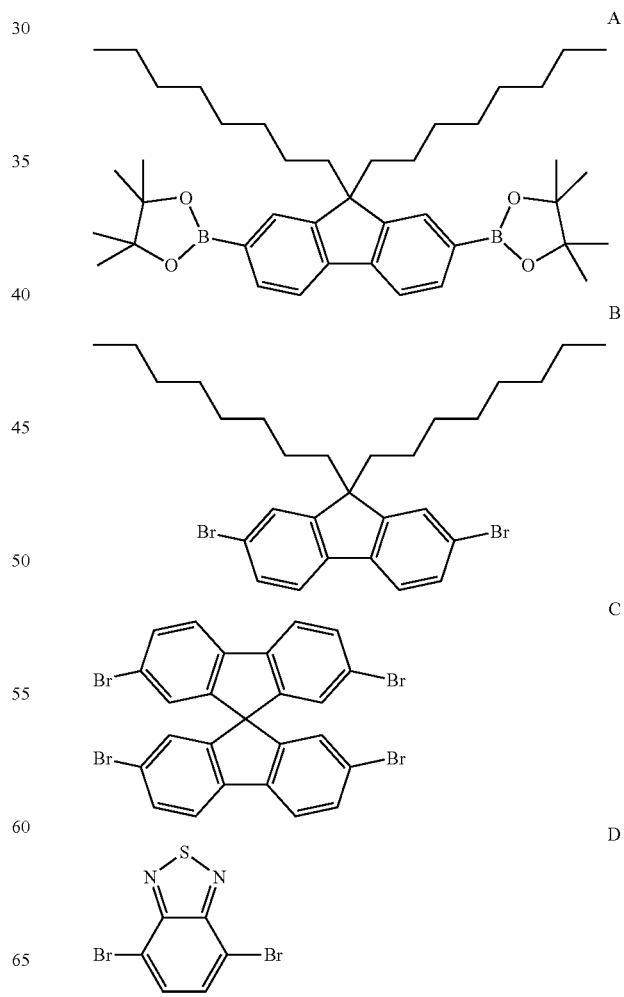

A

B

C

D

-continued

E

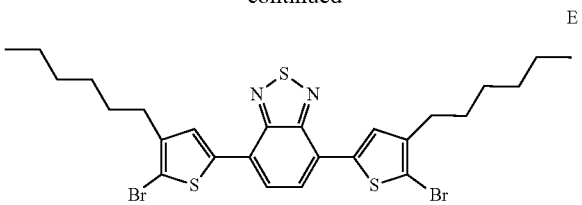

In a Schlenk tube, sodium dodecyl sulfate (50 mg) was dissolved in deionised water (10 mL) under argon. The solution was degassed by bubbling with argon for 30 minutes. In a separate flask, monomer A (58.6 mg, 9.12×10$^{-2}$ mmol), monomer B, monomer C (5.8 mg, 9.12×10$^{-3}$ mmol) and monomer D or monomer E (amounts in Table 8) were dissolved in toluene (1 mL), to which hexadecane was added (78 µL) and the mixture was degassed by bubbling with argon for 5 min. After this time, tris(dibenzylideneacetone) dipalladium(0) (0.9 mg, 0.95×10$^3$ mmol) and tri-(o-tolyl) phosphine (1.2 mg, 3.8×10$^{-3}$ mmol) were added to the monomer mixture which was then injected to the SDS solution. To promote the miniemulsion, the Schlenk tube was taken to an ice bath and the mixture was sonicated using an ultrasonicator fitted with microtip (Cole Parmer 750 W ultrasonicator, 22% amplitude) for 2 minutes. The tube was resealed and then heated up to 72° C. Once reached this temperature, an aqueous solution of sodium hydroxide 1M (365 µL) was added and the reaction mixture was stirred for 16 h. After cooling down to room temperature, the Schlenk tube was opened and the mixture was stirred for 5 h to remove the residual toluene. To remove SDS, 400 µL of the resulting miniemulsion was diluted with 1.6 mL of deionised water and Amberlite XAD-2 (20 mg) previously washed with water (2×2 mL) was added. The mixture was stirred for 2 hours at room temperature and the Amberlite XAD-2 was removed. Treatment with Amberlite XAD-2 was repeated until the mixture was shaken and no foam formation was longer observed.

TABLE 8

Initial loading of monomers B, D and E for synthesis of CL-PFO, CL-PFO-BT and CL-PFO-DBT$_h$ CPNs

| Polymer | Acceptor unit loading (mol %) | Monomer B (mass, moles) | Monomer D (mass, moles) | Monomer E (mass, moles) |
|---|---|---|---|---|
| CL-PFO | — | 40 mg (7.3 × 10$^{-2}$ mmol) | — | — |
| CL-PFO-BT | 10 | 30 mg (5.47 × 10$^{-2}$ mmol) | 5.4 mg (1.82 × 10$^{-2}$ mmol) | — |
| CL-PFO-DBT$_h$ | 5 | 35 mg (6.38 × 10$^{-2}$ mmol) | — | 5.7 mg (9.12 × 10$^{-3}$ mmol) |

The introduction of 2,2',7,7'-Tetrabromo-9,9'-spirobifluorene as cross-linker resulted in CPNs insoluble in different organic solvents (THF, chloroform, toluene, and chlorobenzene). For this reason, determination of molecular weight was not possible. For determination of particle size by DLS, 60 µL of each sample after removal of SDS were diluted with 1 mL of deionised water and the evaluation was carried out using a Malvern Zetasizer Nano ZS.

The particle size of cross-linked blue, green and red-emitting CPNs based on PFO is shown in Table 9:

TABLE 9

Particle size of CL-PFO, CL-PFO-BT and CL-PFO-DBT$_h$ CPNs determined by DLS.

| Polymer | M$_n$ (KDa) | M$_w$ (KDa) | PDI | d$_z$ (nm) | PdI | D$_{Num}$ (nm) |
|---|---|---|---|---|---|---|
| CL-PFO | — | — | — | 91 | 0.182 | 31 |
| CL-PFO-BT | — | — | — | 94 | 0.156 | 38 |
| CL-PFO-DBT$_h$ | — | — | — | 86 | 0.183 | 46 |

The UV-vis absorption spectra of the aqueous dispersion of the cross-linked CPNs were recorded using a Varian Cary 555000UV-Vis-NIR spectrophotometer. Fluorescence spectra of the same samples were recorded on a Varian Cary Eclipse fluorimeter at room temperature at an excitation wavelength of λ=390 nm. The fluorescence quantum yield (QY) was determined using an integration sphere fitted to a Fluorolog 3-22-iHR (Horiba) spectrofluorometer configured with double excitation and emission monochromators with a cooled R928P photomultiplier tube operated in photon-counting mode used as detector. The photophysical properties are displayed in Table 10. The optical properties of cross-linked RGB CPNs were determined in water and in THF.

TABLE 10

Summary of optical properties of cross-linked RGB CPNs in water.

| Polymer | Absorption λ$_{max}$ (nm) | Fluorescence λ$_{max}$ (nm) | QY (%) | QY (StD) |
|---|---|---|---|---|
| CL-PFO | 384, 434 | 438, 465, 501 | 31 | 2 |
| CL-PFO-BT | 378, 445 | 533 | 57 | 1 |
| CL-PFO-DBT$_h$ | 381, 431, 513 | 620 | 37 | 1 |

Figure 4:
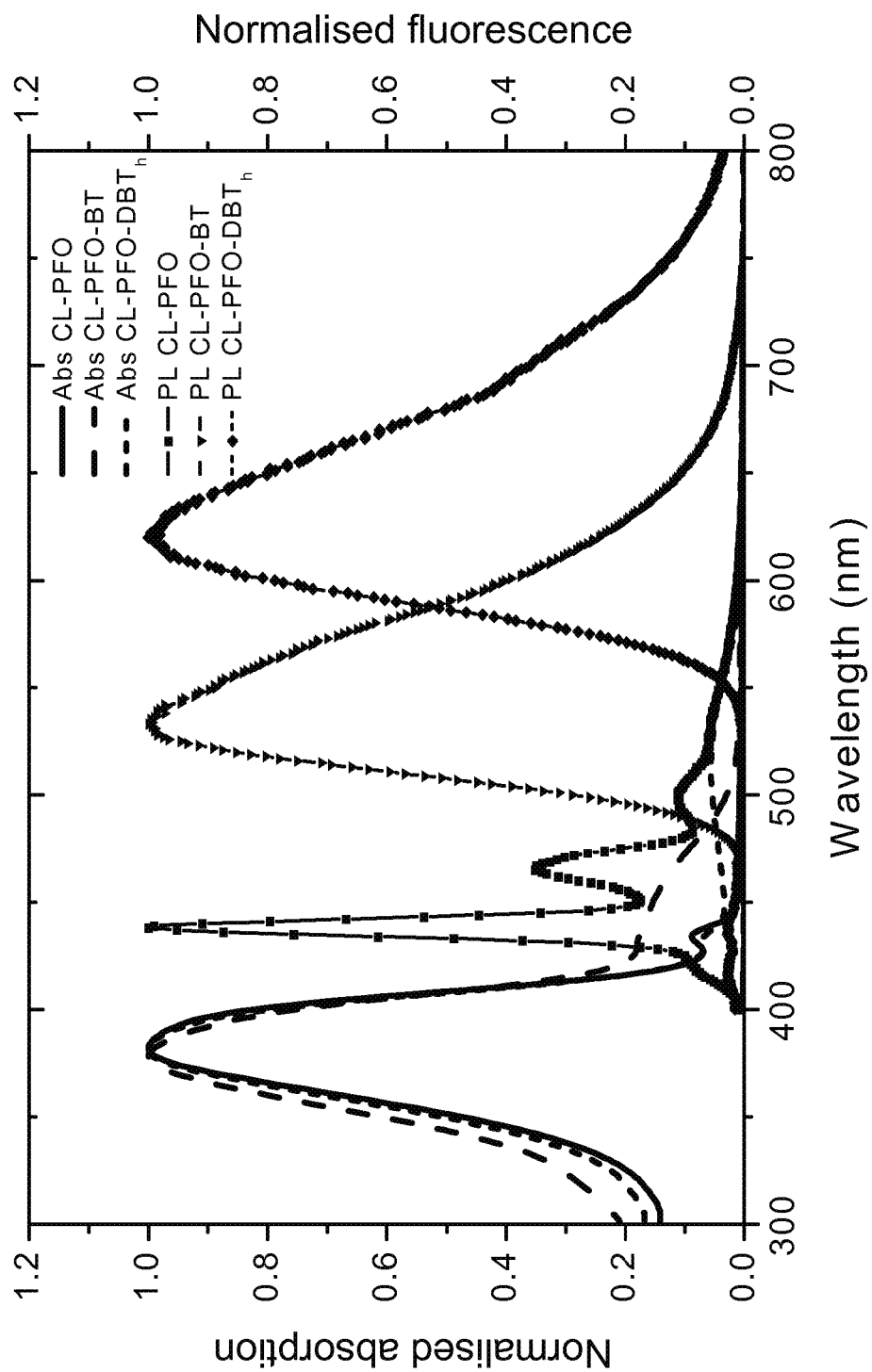
FIG. 4 shows normalised absorption and emission spectra ($\lambda_{exc}$=390 nm) of CL-PFO, CL-PFO-BT and CL-DBT$_h$ CPNs in water [Example 7].

The absorption and emission spectra (λ$_{exc}$=390 nm) of cross-linked blue, green and red CPNs based on PFO are shown in FIG. 4.

The photophysical properties in THF solution of cross-linked RGB CPNs based on PFO are shown in Table 11.

TABLE 11

Summary of optical properties of cross-linked RGB CPNs in THF.

| Polymer | Absorption λ$_{max}$ (nm) | Fluorescence λ$_{max}$ (nm) | QY (%) | QY (StD) |
|---|---|---|---|---|
| CL-PFO | 382, 433 | 419, 442, 477 | 75 | 6 |
| CL-PFO-BT | 382, 435 | 545 | 99 | 1 |
| CL-PFO-DBT$_h$ | 389, 501 | 648 | 76 | 1 |

Figure 5:
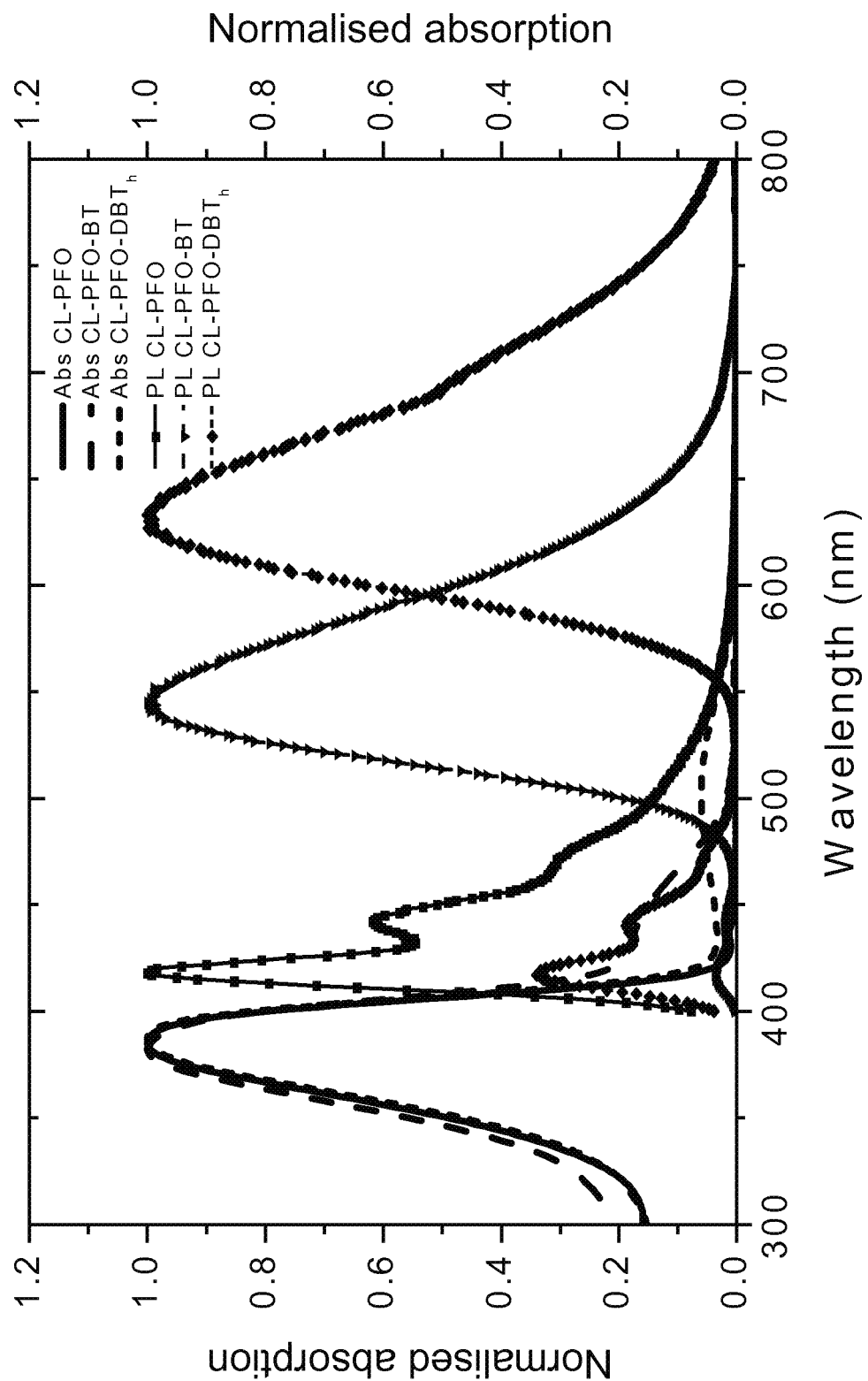
FIG. 5 shows normalised absorption and emission spectra ($\lambda_{exc}$=390 nm) of CL-PFO, CL-PFO-BT and CL-DBT$_h$ CPNs in THF [Example 7].

The absorption and emission spectra (λ$_{exc}$=390 nm) in THF of cross-linked RGB CPNs based on PFO are shown in FIG. 5.

In order to test the suitability of cross-linked blue, green and red-emitting CPNs in LED illumination as phosphors to produce white light by down-conversion of UV light, a series of acrylic films (thickness=1 mm) containing a ternary mixture of cross-linked RGB CPNs were fabricated and evaluated in a remote phosphor LED array using two different reference UV LED as excitation sources (λ$_{exc}$=381 nm and λ$_{exc}$=393 nm). To fabricate the films, the CPNs were first precipitated by addition of methanol and centrifugation.

Once isolated, the CPNs were redispersed in the commercially available acrylic-based resin Tensol 70. Finally, the curing of the films was carried out under ambient conditions in absence of light. The resulting emission spectra from the films when excited with the UV LED source were recorded with an integrating sphere attached to a Rainbow-Light Micro-Spectrometer MR-16-BINS.

Figure 6:
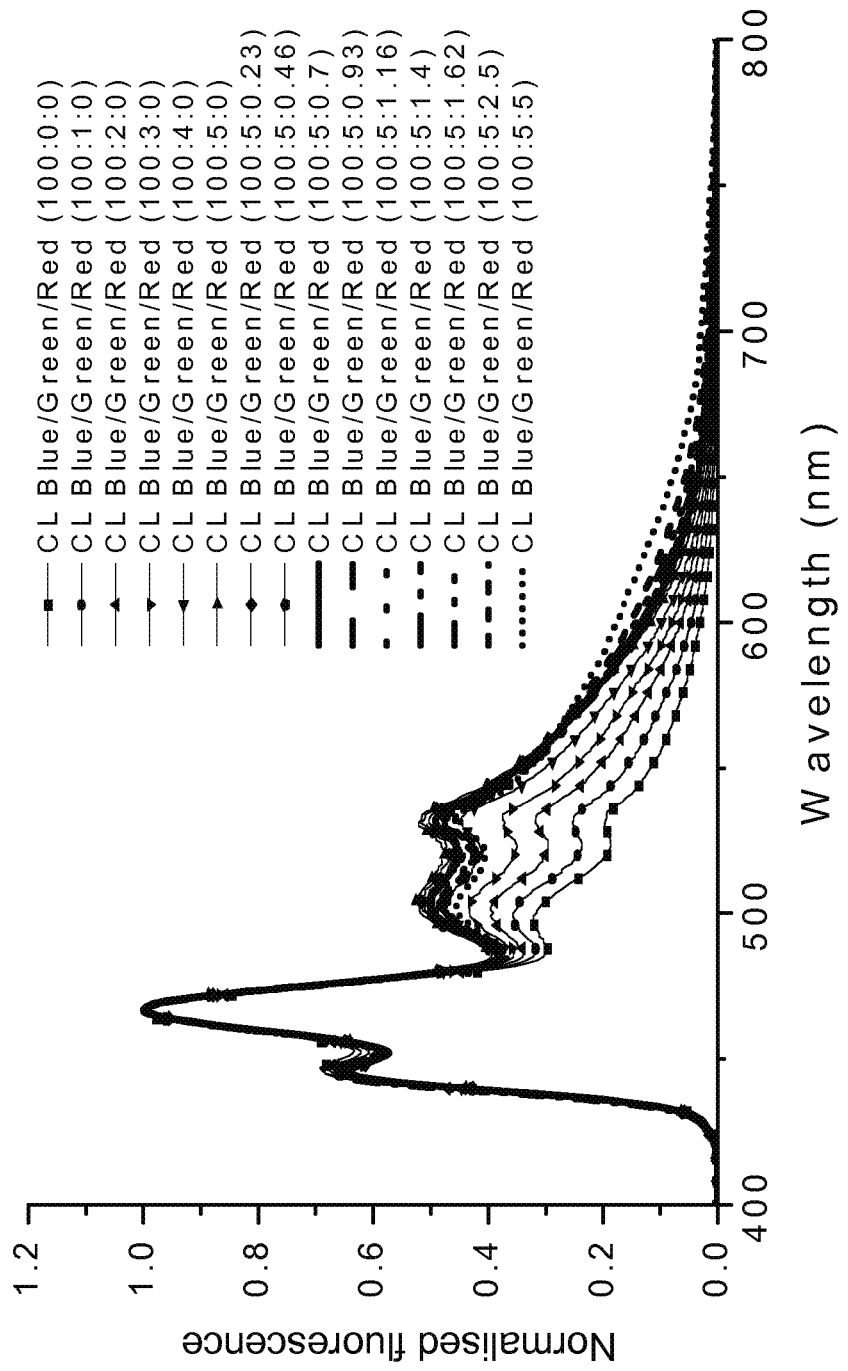
FIG. 6 shows emission profile of mixture of cross-linked RGB CPNs at different ratios [Example 7].

In the first instance, the emission profile of a series of cross-linked RGB CPNs mixtures in water was evaluated to determine the suitable concentration of CPNs in a dispersant medium and the appropriate ratio between each colour CPNs to produce an emission spectrum similar to that exhibited by conventional white LEDs.[1-3] To a dispersion of CL-PFO CPNs at 0.05 mol % in water, aliquots of CL-PFO-BT CPNs were gradually added upon reaching a relative intensity ~0.50 between the emission peak at 530 nm (green emission) and the peak of maximum emission at 467 nm (blue emission). Then, small amounts of an aqueous dispersion of CL-PFO-DBT$_h$ were added to have a final ratio of 100:5:5 (Blue/Green/Red). The progression of the emission profile of the cross-linked RGB CPNs at different ratios is shown in FIG. 6.

Thus, films containing CL-PFO, CL-PFO-BT and CL-DBT$_h$ CPNs at different ratios at a concentration of 0.05 and 0.1 wt. % relative to Tensol 70 were fabricated. The corresponding concentration and ratios between cross-linked blue, green and red CPNs dispersed in the films are presented in Table 12. In FIG. 7, the pictures of Films A-D under visible (top) and UV illumination (bottom) are shown.

TABLE 12

Concentration of cross-linked blue, green and red CPNs in Films A-D.

| Film | Blue/green/red CPNs ratio | Concentration of CPNs in Tensol (wt. %) |
|---|---|---|
| A | 100:5:1 | 0.05 |
| B | 100:5:2.5 | 0.05 |
| C | 100:5:5 | 0.05 |
| D | 100:5:2.5 | 0.1 |

Table 12. Concentration of cross-linked blue, green and red CPNs in Films A-D.

The emission spectra of Films A-D generated when the films are irradiated with two different UV LED sources ($\lambda_{exc}$=381 nm and $\lambda_{exc}$=393 nm) in a remote phosphor LED array are shown in FIG. 8-11.

The Correlated Colour Temperature (CCT), Colour Rendering Index (CRI) and CIE coordinates of the resulting light from Films A-D when irradiated with the reference UV LED source ($\lambda_{exc}$=381 nm) are presented in Table 13. The position of the CIE coordinates in the CIE 1931 chromaticity diagram are displayed in FIG. 12.

TABLE 13

Correlated Colour Temperature (CCT), Colour Rendering Index (CRI) and CIE coordinates of light emitted by Films A-D when irradiated in a remote phosphor LED array at $\lambda_{exc}$ = 381 nm.

| Film | CCT | CRI | CIE coordinates x | Y |
|---|---|---|---|---|
| A | 8076 | 88 | 0.2908 | 0.3150 |
| B | 7529 | 87 | 0.2963 | 0.3237 |
| C | 6108 | 91 | 0.3199 | 0.3317 |
| D | 5075 | 77 | 0.3475 | 0.4089 |

The CCT, CRI and CIE coordinates of the resulting light from Films A-D when irradiated with the reference UV LED source ($\lambda_{exc}$=393 nm) are presented in Table 14. The position of the CIE coordinates in the CIE 1931 chromaticity diagram are displayed in FIG. 13.

TABLE 14

Correlated Colour Temperature (CCT), Colour Rendering Index (CRI) and CIE coordinates of light emitted by Films A-D when irradiated in a remote phosphor LED array at $\lambda_{exc}$ = 393 nm.

| Film | CCT | CRI | CIE coordinates x | y |
|---|---|---|---|---|
| A | 32768 | 29 | 0.2493 | 0.2421 |
| B | 19179 | 91 | 0.2590 | 0.2571 |
| C | 14950 | 89 | 0.2740 | 0.2549 |
| D | 6807 | 81 | 0.3019 | 0.3588 |

Example 8—Synthesis of Cross-Linked White Emitting CPNs Based on PFO

A different approach to generate white light can be achieved by synthesis of one-single cross-linked polymer CPNs based on PFO which emit white light when excited with UV light.

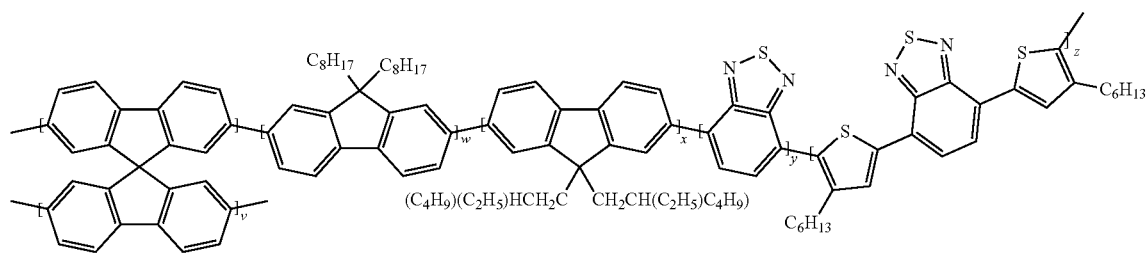

v = 0.05, w = 0.50, x = 0.3994, y = 0.0004, z = 0.0002.

In a Schlenk tube was added water (22.0 mL), sodium dodecyl sulfate (110 mg, 382 μmol) and 1M aqueous sodium hydroxide (800 μL, 800 μmol). The solution was purged with argon for 2 hours. In a vial was added 4,7-dibromobenzo[c]-1,2,5-thiadiazole (47 μL of 1 mg mL$^{-1}$ in dichloromethane, 160 nmole) and 4,7-bis(5-bromo-4-hexyl-2-thienyl)-2,1,3-benzothiadiazole (50 μL of 1 mg mL$^{-1}$ in dichloromethane, 80 nmole) and the solvent was removed using a stream of nitrogen. 9,9-Dioctylfluorene-2,7-diboronic acid bis(1,3-propanediol) ester (111.7 mg, 200 μmol), 9,9-bis(2-ethylhexyl)-2,7-dibromofluorene (87.6 mg, 159.76 μmol), 2,2',7,7'-tetrabromo-9,9'-spirobifluorene (12.6 mg, 20.0 μmol), tris(dibenzylideneacetone) dipalladium(0) (4.6 mg, 5.0 μmol), tri(o-tolyl)phosphine (9.1 mg, 30 μmol) and hexadecane (171 μL, 585 μmol) were further added to the vial. The vial was transferred to an argon filled glovebox, sealed with a rubber septum and removed. Deoxygenated toluene (2.2 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, stirred for 30 seconds and ultrasonicated for 1 further minute. The Schlenk tube was sealed, placed in a preheated oil bath at 50° C. and stirred for 16 hours. The Schlenk tube was opened and a stream of nitrogen gas passed over the emulsion at, 50° C., with stirring. The emulsion was cooled to room temperature, the volume increased to 23.0 mL using deionised water and filtered through a glass wool plug. The emulsion was obtained as a milky light pink solution.

The particle size of cross-linked white-emitting CPNs based on PFO is shown in Table 15:

TABLE 15

Particle size of cross-linked white-emitting CPNs determined by DLS.

| Polymer | $M_n$ (KDa) | $M_w$ (KDa) | PDI | $d_z$ (nm) | PdI | $D_{Num}$ (nm) |
|---|---|---|---|---|---|---|
| CL-PFO-BT-DBT | — | — | — | 92 | 0.187 | 45 |

The optical properties of cross-linked white CPNs based on PFO are summarised in Table 16 and their normalised absorption and emission spectra are shown in FIG. 14.

TABLE 16

Summary of optical properties of cross-linked white-emitting CPNs in water.

| Polymer | Absorption $\lambda_{max}$ (nm) | Fluorescence $\lambda_{max}$ (nm) | Emission wavelength range (nm) |
|---|---|---|---|
| CL-PFO-BT-DBT | 379 | 427, 448, 520, 586 | 400-700 |

Once the CPNs with white emission were successfully synthesised, films containing these particles at 0.05 and 0.1 mol % were fabricated and evaluated in a remote phosphor LED array analogously to the procedure followed for Films A-D. For white-like CPNs the silicon-based resin QLE 1102 was used as dispersant matrix. In FIG. 15, the pictures of Film E and Film F under visible (left) and UV illumination (right) are presented.

The emission spectra of Films E-F generated when the films are irradiated with two different UV LED sources ($\lambda_{exc}$=381 nm and $\lambda_{exc}$=393 nm) in a remote phosphor LED array are shown in FIG. 16-17.

The CCT, CRI and CIE coordinates of the resulting light from Films E-F when irradiated with the reference UV LED source ($\lambda_{exc}$=381 nm) are presented in Table 17. The position of the CIE coordinates in the CIE 1931 chromaticity diagram are displayed in FIG. 18.

TABLE 17

Correlated Colour Temperature (CCT), Colour Rendering Index (CRI) and CIE coordinates of light emitted by Films E-F when irradiated in a remote phosphor LED array at $\lambda_{exc}$ = 381 nm.

| Film | CCT | CRI | CIE coordinates x | y |
|---|---|---|---|---|
| E | 6622 | 81 | 0.3094 | 0.3362 |
| F | 5654 | 79 | 0.3284 | 0.3762 |

The CCT, CRI and CIE coordinates of the resulting light from Films E-F when irradiated with the reference UV LED source ($\lambda_{exc}$=393 nm) are presented in Table 18. The position of the CIE coordinates in the CIE 1931 chromaticity diagram are displayed in FIG. 18.

TABLE 18

Correlated Colour Temperature (CCT), Colour Rendering Index (CRI) and CIE coordinates of light emitted by Films E-F when irradiated in a remote phosphor LED array at $\lambda_{exc}$ = 393 nm.

| Film | CCT | CRI | CIE coordinates x | y |
|---|---|---|---|---|
| E | — | 85 | 0.2235 | 0.1745 |
| F | 15488 | 85 | 0.2606 | 0.2686 |

Example 9—5% 9,9'-Spirobifluorene, 80% 9,9-Dioctyl(fluorene) and 10% 9,9-Di(Sodium Undecanoyl Sulfate)(Fluorene) Nanoparticles (which Emit Blue Light)

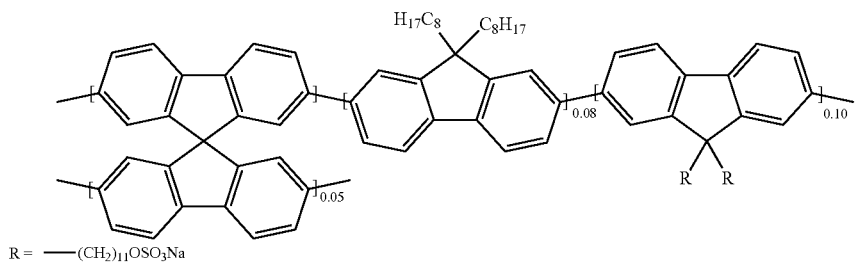

R = ——(CH$_2$)$_{11}$OSO$_3$Na

In a two-litre flask was added water (1000 mL) and sodium hydroxide (1.60 g, 32.0 mmol) and the solution purged with argon for 4 hours. In a Schlenk tube was weighed 9,9-di-n-octylfluorene-2,7-diboronic acid bis(propanediol) ester (5.58 g, 10.0 mmol), 9,9-di-n-octyl-2,7-dibromofluorene (3.29 g, 6.00 mmol), 2,2',7,7'-tetrabromo-9,9'-spirobifluorene (632 mg, 1.00 mmol), tris(dibenzylideneacetone) dipalladium(0) (229 mg, 250 μmol) and tri(o-tolyl)phosphine (456 mg, 1.50 mmol). The Schlenk tube was subjected to 3 argon-vacuum cycles. In a separate Schlenk tube was added toluene (100 mL) and hexadecane (7.73 mL) and the solution purged with argon for 2 hours. This solution was transferred to the former Schlenk tube and the suspension sonicated in an ultrasonic bath until a homogenous solution was achieved. 9,9-Di(sodium undecanoyl sulfate)2,7-dibromofluorene (1.74 g, 2.00 mmol) was added to the initial aqueous solution and cooled to 0° C. in an ice bath. The toluene solution was added rapidly into the aqueous phase under a stream of argon and the ultrasonic probe inserted (½" replaceable tip) to a depth of 2 cm. The solution was ultrasonicated for 5 minutes at 80% intensity with stirring, stirred for 1 minute and ultrasonicated for 5 further minutes. The flask was sealed, placed in a preheated oil bath at 40° C. and stirred for 20 hours. The flask was opened and air passed over the emulsion at 40° C. for 30 hours, with stirring. The emulsion was cooled to room temperature, left to stand 16 hours and filtered through cotton mesh to provide a suspension (310 g, theoretical 25.9 mg g$^{-1}$).

Example 10—5% Benzo[c]-1,2,5-thiadiazole, 5% 9,9'-Spirobifluorene, 75% 9,9-Dioctyl(Fluorene) and 10% 9,9-Di(Sodium Undecanoyl Sulfate)(Fluorene) Nanoparticles (which Emit Green Light)

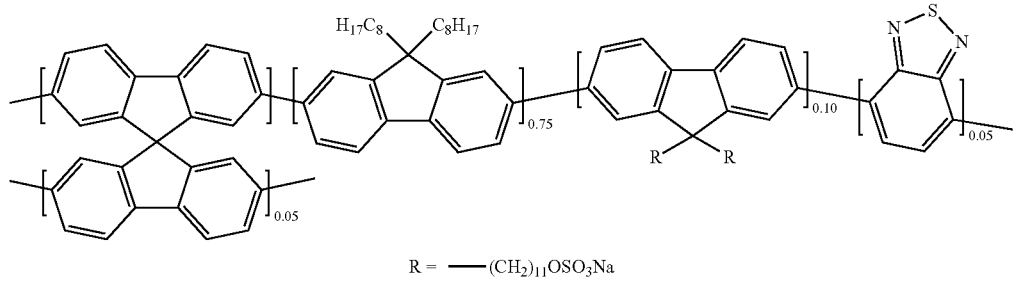

In a one litre flask was added water (800 mL) and 1M aqueous sodium hydroxide (32.0 mL, 32.0 mmol) and the solution purged with argon for 4 hours. In a Schlenk tube was weighed 9,9-di-n-octylfluorene-2,7-diboronic acid bis (propanediol) ester (4.47 g, 8.00 mmol), 9,9-di-n-octyl-2,7-dibromofluorene (2.19 g, 4.00 mmol), 2,2',7,7'-tetrabromo-9,9'-spirobifluorene (506 mg, 800 µmol), 4,7-dibromobenzo[c]-1,2,5-thiadiazole (235 mg, 800 µmol), tris(dibenzylideneacetone) dipalladium(0) (183 mg, 200 µmol) and tri(o-tolyl)phosphine (365 mg, 1.20 mmol). The Schlenk tube was purged argon for 30 mins. In a separate Schlenk tube was added toluene (80.0 mL) and hexadecane (6.20 mL) and the solution purged with argon for 2 hours. This solution was transferred to the former Schlenk tube and the suspension sonicated in an ultrasonic bath until a homogenous solution was achieved. 9,9-Di(sodium undecanoyl sulfate)2,7-dibromofluorene (1.39 g, 1.60 mmol) was added to the initial aqueous solution and cooled to 0° C. in an ice bath. The toluene solution was added rapidly into the aqueous phase under a stream of argon and the ultrasonic probe inserted (½" replaceable tip) to a depth of 2 cm. The solution was ultrasonicated for 5 minutes at 60% intensity with stirring, stirred for 1 minute and ultrasonicated at 80% intensity for 5 minutes. The flask was sealed, placed in a preheated oil bath at 40° C. and stirred for 20 hours. The flask was opened and air passed over the emulsion at 100° C. for 15 hours, with stirring. The emulsion was cooled to room temperature and filtered through cotton mesh to provide a suspension (320 g, theoretical 19.2 mg g$^{-1}$).

Example 11—5% 4,7-bis(5-hexyl-2-thienyl)-2,1,3-benzothiadiazole, 5% 9,9'-spirobifluorene, 75% 9,9-Dioctyl(fluorene) and 10% 9,9-di(sodium undecanoyl sulfate)(fluorene) Nanoparticles (which Emit Red Light)

In a two-litre flask was added water (1000 mL) and sodium hydroxide (1.60 g 32.0 mmol) and the solution purged with argon for 4 hours. In a Schlenk tube was weighed 9,9-di-n-octylfluorene-2,7-diboronic acid bis(propanediol) ester (5.58 g, 10.0 mmol), 9,9-di-n-octyl-2,7-dibromofluorene (2.74 g, 5.00 mmol), 2,2',7,7'-tetrabromo-9,9'-spirobifluorene (632 mg, 1.00 mmol), 4,7-bis(5-bromo-4-hexyl-2-thienyl)-2,1,3-benzothiadiazole (627 mg, 1.00 mmol), tris(dibenzylideneacetone) dipalladium(0) (229 mg, 250 µmol) and tri(o-tolyl)phosphine (456 mg, 1.50 mmol). The Schlenk tube was subjected to three vacuum-argon cycles. In a separate Schlenk tube was added toluene (100.0 mL) and hexadecane (7.73 mL) and the solution purged with argon for 2 hours. This solution was transferred to the former Schlenk tube and the suspension sonicated in an ultrasonic bath until a homogenous solution was achieved. 9,9-Di(sodium undecanoyl sulfate)2,7-dibromofluorene (1.74 g, 2.00 mmol) was added to the initial aqueous solution and cooled to 0° C. in an ice bath. The toluene solution was added rapidly into the aqueous phase under a stream of argon and the ultrasonic probe inserted (½" replaceable tip) to a depth of 2 cm. The solution was ultrasonicated for 5 minutes at 80% intensity with stirring, stirred for 1 minute and ultrasonicated for a further 5 minutes. The flask was sealed, placed in a preheated oil bath at 40° C. and stirred for 20 hours. The flask was opened and air passed over the emulsion at 40° C. for 30 hours, with stirring. The emulsion was cooled to room temperature, left to stand for 16 hours and filtered through cotton mesh to provide a suspension (220 g, theoretical 36.1 mg g$^{-1}$).

The optical properties of cross-linked blue, green and red are summarised in the table below and their normalised absorption and emission spectra are shown in the FIG. 19.

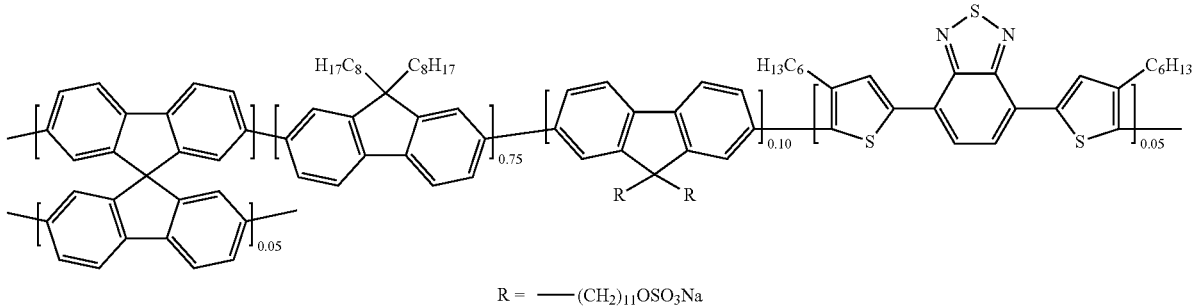

TABLE 19

Optical properties of Examples 9-11 in water.

| Polymer | Absorption $\lambda_{max}$ (nm) | Fluorescence $\lambda_{max}$ (nm) | Emission wavelength range (nm) |
| --- | --- | --- | --- |
| Example 9 | 398 | 424, 448, 463 | 400-700 |
| Example 10 | 394 | 533 | 470-700 |
| Example 11 | 396 | 620 | 550-800 |

Example 12—5% 9,9'-Spirobifluorene, 90% Di((4-((2-ethylhexyl)oxy)phenyl)) fluorene Nanoparticles

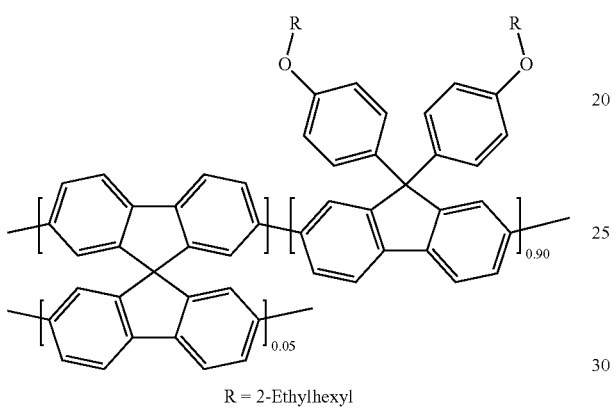

R = 2-Ethylhexyl

In a 250 mL round bottom flask, fitted with an argon inlet, was added water (100 mL), sodium hydroxide (160 mg, 4.00 mmol) and sodium dodecyl sulfate (551 mg) and the solution purged with argon for 1 hour. Toluene was degassed with argon for 2 hours. In a Schlenk tube was weighed 9,9-di((4-((2-ethylhexyl)oxy)phenyl))fluorene-2,7-diboronic acid bis(pinacol) ester (827 mg, 1.00 mmol), 2,7-dibromo-9,9-di((4-((2-ethylhexyl)oxy)phenyl))fluorene (513 mg, 700 µmol), 2,2',7,7'-tetrabromo-9,9'-spirobifluorene (63.2 mg, 100 µmol), hexadecane (855 µL), 4,7-dibromobenzo[c]-1,2,5-thiadiazole (29.4 mg, 100 µmol), tris(dibenzylideneacetone) dipalladium(0) (22.4 mg, 25 µmol) and tri(o-tolyl)phosphine (45.6 mg, 150 µmol). The Schlenk tube was subjected to four vacuum-argon cycles. Toluene (10 mL) was added and the suspension sonicated in an ultrasonic bath until a homogenous solution was achieved. The initial aqueous solution was cooled to 0° C. in an ice bath and the toluene solution was added rapidly into the aqueous phase under a stream of argon. A stirrer bar was added and the ultrasonic probe inserted (½" extender tip) to a depth of 2 cm. The solution was ultrasonicated for 2 minutes at 40% amplitude, stirred for 30 seconds then sonicated for 2 further minutes. The flask was sealed, placed in a preheated oil bath at 70° C. and stirred for 16 hours. The flask was cooled to 50° C. and air passed over the emulsion for 5 hours, with stirring. The emulsion was cooled to room temperature, left to stand for 16 hours and filtered through a glass wool plug. The emulsion was obtained as a bright green cloudy dispersion. DLS: z-Average: 115.9 nm, PdI: 0.153. UV-Vis Abs. (water): $\lambda_{max}$=391 nm. UV-Vis PL (water): $\lambda_{max}$=422 nm.

Example 13—5% 9,9'-Spirobifluorene, 10% Di((4-(sodium undecanoyl sulfate)phenyl))fluorene, 80% Di((4-((2-ethylhexyl)oxy)phenyl))fluorene Nanoparticles

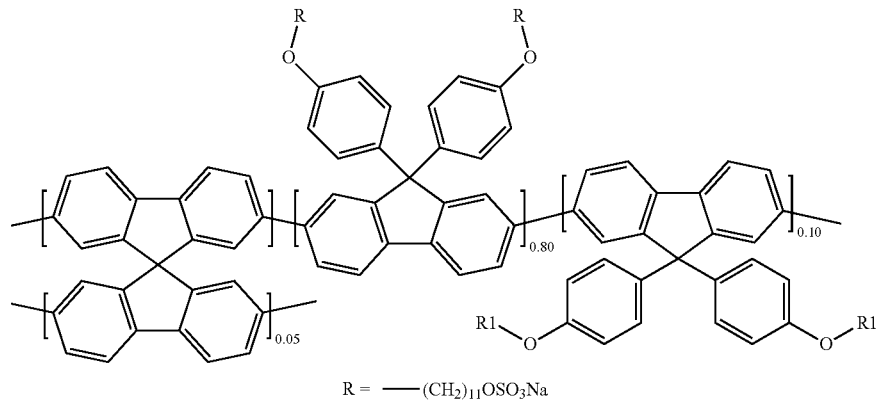

R = —(CH$_2$)$_{11}$OSO$_3$Na

In a 250 mL round bottom flask, fitted with an argon inlet, was added water (100 mL), sodium hydroxide (160 mg, 4.00 mmol) and 2,7-dibromo-9,9-di((4-(sodium undecanoyl sulfate)phenyl))fluorene (211 mg, 200 µmol) and the solution purged with argon for 2 hours. Toluene was degassed with argon for 2 hours. In a Schlenk tube was weighed 9,9-di((4-((2-ethylhexyl)oxy)phenyl))fluorene-2,7-diboronic acid bis(pinacol) ester (827 mg, 1.00 mmol), 2,7-dibromo-9,9-di((4-((2-ethylhexyl)oxy)phenyl))fluorene (440 mg, 600 µmol), 2,2',7,7'-tetrabromo-9,9'-spirobifluorene (63.2 mg, 100 µmol), hexadecane (855 µL), tris(dibenzylideneacetone) dipalladium(0) (22.4 mg, 25 µmol) and tri(o-tolyl)phosphine (45.6 mg, 150 µmol). The Schlenk tube was subjected to four vacuum-argon cycles. Toluene (10 mL) was added and the suspension sonicated in an ultrasonic bath until a homogenous solution was achieved. A stirrer bar was added and the ultrasonic probe inserted (½″ extender tip) to a depth of 2 cm. The solution was ultrasonicated for 2 minutes at 40% amplitude, stirred for 30 seconds then sonicated for 2 further minutes. The flask was sealed, placed in a preheated oil bath at 60° C. and stirred for 16 hours. The flask was cooled to 50° C. and air passed over the emulsion for 5 hours, with stirring. The emulsion was cooled to room temperature, left to stand for 16 hours and filtered through a glass wool plug. The emulsion was obtained as a dark green/grey cloudy dispersion. DLS: z-Average: 171.2 nm, PdI: 0.047. UV-Vis Abs. (water): $\lambda_{max}$=398 nm. UV-Vis PL (water): $\lambda_{max}$=422 nm.

Example 14—5% Benzo[c]-1,2,5-thiadiazole, 5% 9,9′-Spirobifluorene, 85% Di((4-((2-ethylhexyl)oxy)phenyl))fluorene Nanoparticles

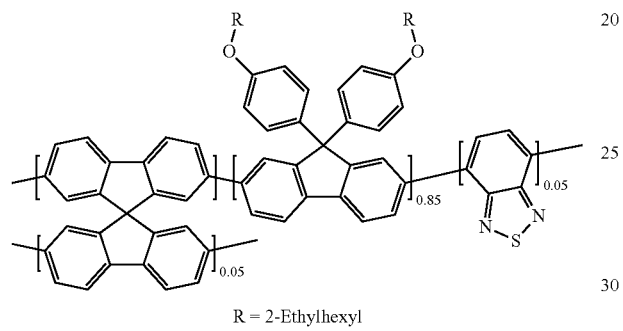

R = 2-Ethylhexyl

In a 250 mL round bottom flask, fitted with an argon inlet, was added water (100 mL), sodium hydroxide (160 mg, 4.00 mmol) and sodium dodecyl sulfate (551 mg) and the solution purged with argon for 1 hour. Toluene was degassed with argon for 2 hours. In a Schlenk tube was weighed 9,9-di((4-((2-ethylhexyl)oxy)phenyl))fluorene-2,7-diboronic acid bis(pinacol) ester (827 mg, 1.00 mmol), 2,7-dibromo-9,9-di((4-((2-ethylhexyl)oxy)phenyl))fluorene (513 mg, 700 µmol), 2,2′,7,7′-tetrabromo-9,9′-spirobifluorene (63.2 mg, 100 µmol), hexadecane (855 µL), 4,7-dibromobenzo[c]-1,2,5-thiadiazole (29.4 mg, 100 µmol), tris(dibenzylideneacetone) dipalladium(0) (22.4 mg, 25

µmol) and tri(o-tolyl)phosphine (45.6 mg, 150 µmol). The Schlenk tube was subjected to four vacuum-argon cycles. Toluene (10 mL) was added and the suspension sonicated in an ultrasonic bath until a homogenous solution was achieved. The initial aqueous solution was cooled to 0° C. in an ice bath and the toluene solution was added rapidly into the aqueous phase under a stream of argon. A stirrer bar was added and the ultrasonic probe inserted (½″ extender tip) to a depth of 2 cm. The solution was ultrasonicated for 2 minutes at 40% amplitude, stirred for 30 seconds then sonicated for 2 further minutes. The flask was sealed, placed in a preheated oil bath at 70° C. and stirred for 16 hours. The flask was cooled to 50° C. and air passed over the emulsion for 5 hours, with stirring. The emulsion was cooled to room temperature, left to stand for 16 hours and filtered through a glass wool plug. The emulsion was obtained as a bright green cloudy dispersion. DLS: z-Average: 115.1 nm, PdI: 0.160. UV-Vis Abs. (water): $\lambda_{max}$=387 nm. UV-Vis PL (water): $\lambda_{max}$=526 nm.

Example 15—5% Benzo[c]-1,2,5-thiadiazole, 5% 9,9′-Spirobifluorene, 10% Di((4-(sodium undecanoyl sulfate)phenyl))fluorene, 75% Di((4-((2-ethylhexyl)oxy)phenyl))fluorene Nanoparticles

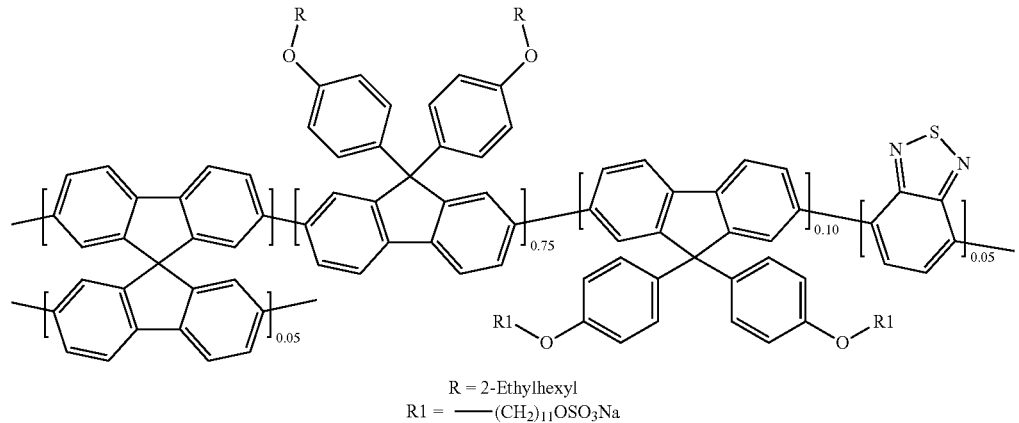

R = 2-Ethylhexyl
R1 = —(CH$_2$)$_{11}$OSO$_3$Na

In a 250 mL round bottom flask, fitted with an argon inlet, was added water (100 mL), sodium hydroxide (160 mg, 4.00 mmol) and 2,7-dibromo-9,9-di((4-(sodium undecanoyl sulfate)phenyl))fluorene (211 mg, 200 µmol) and the solution purged with argon for 1 hour. Toluene was degassed with argon for 1 hours. In a Schlenk tube was weighed 9,9-di((4-((2-ethylhexyl)oxy)phenyl))fluorene-2,7-diboronic acid bis(pinacol) ester (827 mg, 1.00 mmol), 2,7-dibromo-9,9-di((4-((2-ethylhexyl)oxy)phenyl))fluorene (366 mg, 500 µmol), 2,2′,7,7′-tetrabromo-9,9′-spirobifluorene (63.2 mg, 100 µmol), hexadecane (855 µL), 4,7-dibromobenzo[c]-1,2, 5-thiadiazole (29.4 mg, 100 µmol), tris(dibenzylideneacetone) dipalladium(0) (22.4 mg, 25 µmol) and tri(o-tolyl) phosphine (45.6 mg, 150 µmol). The Schlenk tube was subjected to four vacuum-argon cycles. Toluene (10 mL) was added and the suspension sonicated in an ultrasonic bath until a homogenous solution was achieved. The initial aqueous solution was cooled to 0° C. in an ice bath and the toluene solution was added rapidly into the aqueous phase under a stream of argon. A stirrer bar was added and the ultrasonic probe inserted (½" extender tip) to a depth of 2 cm. The solution was ultrasonicated for 2 minutes at 40% amplitude, stirred for 30 seconds then sonicated for 2 further minutes. The flask was sealed, placed in a preheated oil bath at 70° C. and stirred for 16 hours. The flask was cooled to 50° C. and air passed over the emulsion for 5 hours, with stirring. The emulsion was cooled to room temperature, left to stand for 16 hours and filtered through a glass wool plug. The emulsion was obtained as a bright green cloudy dispersion. DLS: z-Average: 184.5 nm, PdI: 0.031. UV-Vis Abs. (water): $\lambda_{max}$=393 nm. UV-Vis PL (water): $\lambda_{max}$=527 nm.

Example 16—5% Benzo[c]-1,2,5-thiadiazole, 5% 9,9'-Spirobifluorene, 75% 9,9-Dioctyl(fluorene), 10% 9,9-Di(poly(ethylene glycol) monomethyl ether$_{(Mn\ 900)}$)(fluorene)

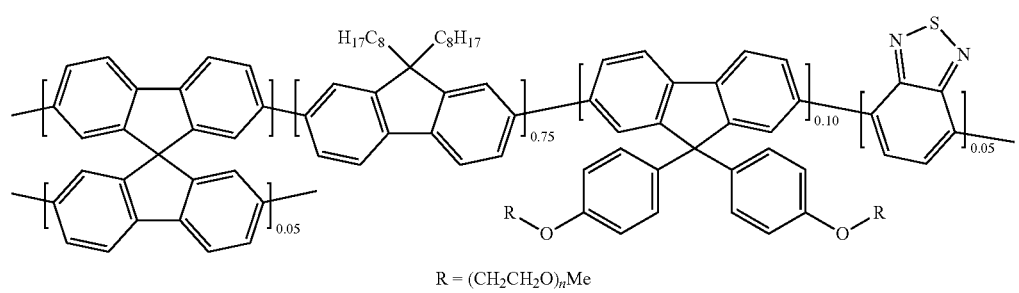

$R = (CH_2CH_2O)_n Me$

In a Schlenk tube was added water (20 mL) and sodium hydroxide (32.0 mg, 800 µmol) and the solution purged with argon for 2 hours. Toluene was degassed with argon for 2 hours. In a vial was weighed 9,9-di-n-octylfluorene-2,7-diboronic acid bis(propanediol) ester (111.7 mg, 200 µmol), 9,9-di-n-octyl-2,7-dibromofluorene (54.8 mg, 100 µmol), 2,2',7,7'-tetrabromo-9,9'-spirobifluorene (12.6 mg, 20 µmol), 2,7-dibromo-9,9-di((poly(ethylene glycol) monomethyl ether$_{(Mn\ 900)}$)phenyl))fluorene (86.3 mg, 40 µmol), 4,7-dibromobenzo[c]-1,2,5-thiadiazole (5.9 mg, 20 µmol), hexadecane (150 µL), tris(dibenzylideneacetone) dipalladium(0) (4.6 mg, 5 µmol) and tri(o-tolyl)phosphine (9.1 mg, 30 µmol). The vial was purged with argon for 30 minutes. Toluene (2.00 mL) was added and the suspension sonicated in an ultrasonic bath until a homogenous solution was achieved. The initial aqueous solution and cooled to 0° C. in an ice bath. The toluene solution was added rapidly into the aqueous phase under a stream of argon. A stirrer bar was added and the ultrasonic probe inserted (6 mm microtip) to a depth of 2 cm. The solution was ultrasonicated for 1 minute at 30% amplitude, stirred for 30 seconds and sonicated for 1 further minute. The flask was sealed, placed in a preheated oil bath at 40° C. and stirred for 20 hours. The flask was heated to 50° C. and air passed over the emulsion for 5 hours, with stirring. The emulsion was cooled to room temperature, left to stand for 16 hours and filtered through cotton mesh. The emulsion was obtained as a bright green cloudy dispersion.

Example 17—5% Benzo[c]-1,2,5-thiadiazole, 5% 9,9'-Spirobifluorene, 74% 9,9-Dioctyl(fluorene), 10% 9,9-Di(sodium undecanoyl sulfate)(fluorene), 1% 9,9-Di(sodium undecanoyl carboxylate)(fluorene)

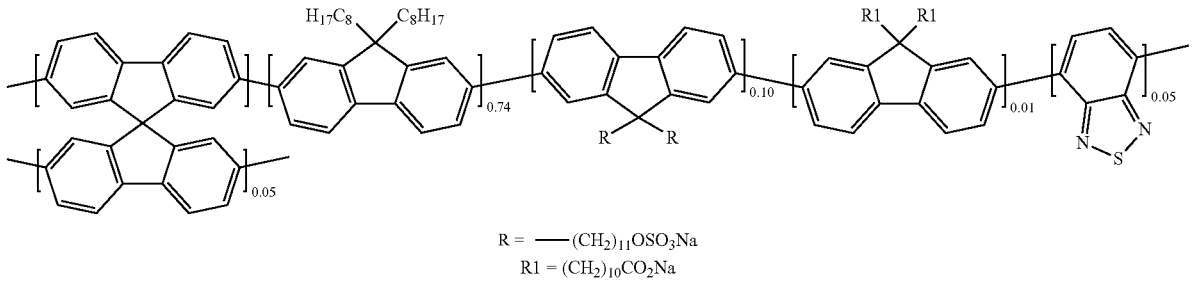

R = —(CH$_2$)$_{11}$OSO$_3$Na
R1 = (CH$_2$)$_{10}$CO$_2$Na

In a Schlenk tube was added water (20 mL) and sodium hydroxide (32.0 mg, 800 µmol) and the solution purged with argon for 2 hours. Toluene was degassed with argon for 2 hours. In a vial was weighed 9,9-di-n-octylfluorene-2,7-diboronic acid bis(propanediol)ester (111.7 mg, 200 µmol), 9,9-di-n-octyl-2,7-dibromofluorene (41.7 mg, 76 µmol), 2,2',7,7'-tetrabromo-9,9'-spirobifluorene (12.6 mg, 20 µmol), 2,7-dibromo-9,9-di(undecanoic acid)fluorene (2.8 mg, 4.0 µmol), 4,7-dibromobenzo[c]-1,2,5-thiadiazole (5.9 mg, 20 µmol), tris(dibenzylideneacetone) dipalladium(0) (4.6 mg, 50 mol) and tri(o-tolyl)phosphine (9.1 mg, 30 µmol). The vial was purged with argon for 30 minutes. Toluene (2.00 mL) was added and the suspension sonicated in an ultrasonic bath until a homogenous solution was achieved. 9,9-Di(sodium undecanoyl sulfate)2,7-dibromofluorene (34.7 mg, 40 µmol) was added to the initial aqueous solution and cooled to 0° C. in an ice bath. The toluene solution was added rapidly into the aqueous phase under a stream of argon. A stirrer bar was added and the ultrasonic probe inserted (6 mm microtip) to a depth of 2 cm. The solution was ultrasonicated for 2 minutes at 30% amplitude, stirred for 30 seconds and this sequence repeated four further times. The flask was sealed, placed in a preheated oil bath at 4000 and stirred for 20 hours. The flask was heated to 50° C. and air passed over the emulsion for 7 hours, with stirring. The emulsion was cooled to room temperature and filtered through a glass wool plug. The emulsion was obtained as a bright green cloudy dispersion.

In a Schlenk tube was added water (20 mL) and sodium hydroxide (33.6 mg, 840 µmol) and the solution purged with argon for 2 hours. Toluene was degassed with argon for 2 hours. In a vial was weighed 9,9-di-n-octylfluorene-2,7-diboronic acid bis(propanediol) ester (111.7 mg, 200 µmol), 9,9-di-n-octyl-2,7-dibromofluorene (43.9 mg, 80 µmol), 2,7-dibromo-9,9-di(undecanoic acid)fluorene (13.9 mg, 20.0 µmol), 2,2',7,7'-tetrabromo-9,9'-spirobifluorene (12.6 mg, 20 µmol), 4,7-dibromobenzo[c]-1,2,5-thiadiazole (5.9 mg, 20 µmol), hexadecane (150 µL), tris(dibenzylideneacetone) dipalladium(0) (4.6 mg, 5 µmol) and tri(o-tolyl)phosphine (9.1 mg, 30 µmol). The vial was purged with argon for 30 minutes. Toluene (2.00 mL) was added and the suspension sonicated in an ultrasonic bath until a homogenous solution was achieved. 9,9-Di(sodium undecanoyl sulfate)2,7-dibromofluorene (34.7 mg, 40 µmol) was added to the initial aqueous solution and cooled to 0° C. in an ice bath. The toluene solution was added rapidly into the aqueous phase under a stream of argon. A stirrer bar was added and the ultrasonic probe inserted (6 mm microtip) to a depth of 2 cm. The solution was ultrasonicated for 2 minutes at 30% amplitude, stirred for 30 seconds and this sequence repeated four further times. The flask was sealed, placed in a preheated oil bath at 40° C. and stirred for 20 hours. The flask was heated to 50° C. and air passed over the emulsion for 5 hours, with stirring. The emulsion was cooled to room temperature and filtered through a glass wool plug. The emulsion was obtained as a bright green slightly cloudy dispersion. DLS: z-Average: 77.1 nm, Pdl: 0.211.

Example 18—5% Benzo[c]-1,2,5-thiadiazole, 5% 9,9'-Spirobifluorene, 70% 9,9-Dioctyl(fluorene), 10% 9,9-Di(sodium undecanoyl sulfate)(fluorene), 5% 9,9-Di(sodium undecanoyl carboxylate)(fluorene)

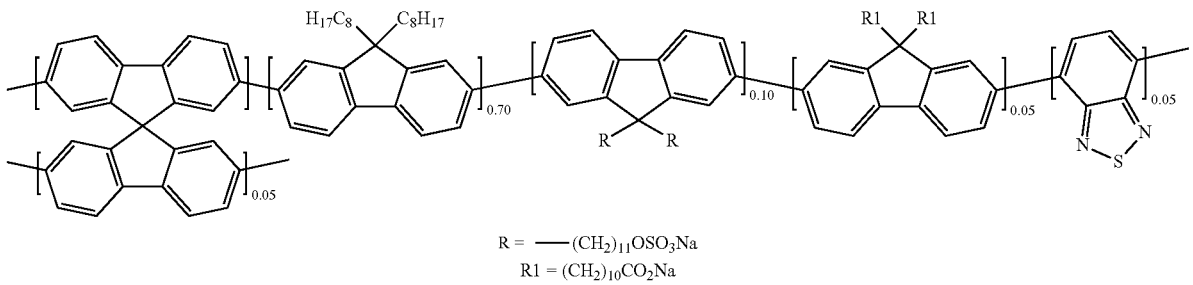

R = —(CH$_2$)$_{11}$OSO$_3$Na
R1 = (CH$_2$)$_{10}$CO$_2$Na

Example 19—5% Benzo[c]-1,2,5-thiadiazole, 5% 9,9'-Spirobifluorene, 70% 9,9-Dioctyl(fluorene), 10% 9,9-Di(sodium undecanoyl sulfate)(fluorene), 5% 9,9-Di(sodium undecanoyl carboxylate)(fluorene)

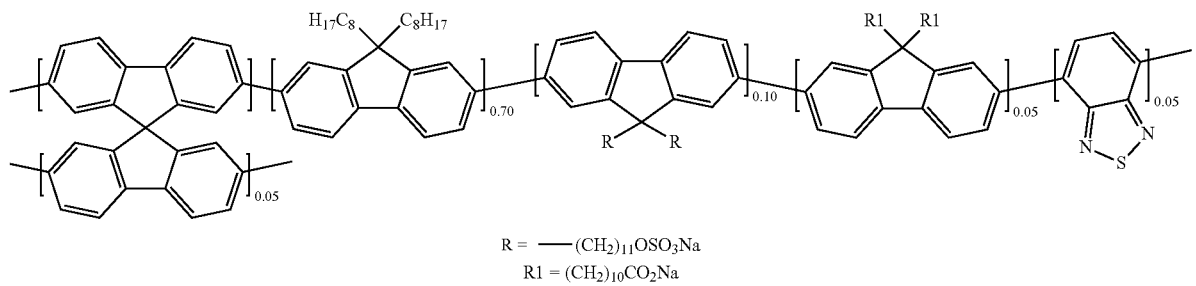

R = —(CH$_2$)$_{11}$OSO$_3$Na
R1 = (CH$_2$)$_{10}$CO$_2$Na

In a Schlenk tube was added water (20 mL) and sodium hydroxide (33.6 mg, 840 μmol) and the solution purged with argon for 2 hours. Toluene was degassed with argon for 2 hours. In a vial was weighed 9,9-di-n-octylfluorene-2,7-diboronic acid bis(propanediol) ester (111.7 mg, 200 μmol), 9,9-di-n-octyl-2,7-dibromofluorene (43.9 mg, 80 μmol), 2,7-dibromo-9,9-di(undecanoic acid)fluorene (13.9 mg, 20.0 μmol), 2,2',7,7'-tetrabromo-9,9'-spirobifluorene (12.6 mg, 20 μmol), 4,7-dibromobenzo[c]-1,2,5-thiadiazole (5.9 mg, 20 μmol), tris(dibenzylideneacetone) dipalladium(0) (4.6 mg, 5 μmol) and tri(o-tolyl)phosphine (9.1 mg, 30 μmol). The vial was purged with argon for 30 minutes. Toluene (2.00 mL) was added and the suspension sonicated in an ultrasonic bath until a homogenous solution was achieved. 9,9-Di(sodium undecanoyl sulfate)2,7-dibromofluorene (34.7 mg, 40 μmol) was added to the initial aqueous solution and cooled to 0° C. in an ice bath. The toluene solution was added rapidly into the aqueous phase under a stream of argon. A stirrer bar was added and the ultrasonic probe inserted (6 mm microtip) to a depth of 2 cm. The solution was ultrasonicated for 2 minutes at 30% amplitude, stirred for 30 seconds and this sequence repeated four further times. The flask was sealed, placed in a preheated oil bath at 40° C. and stirred for 20 hours. The flask was heated to 50° C. and air passed over the emulsion for 5 hours, with stirring. The emulsion was cooled to room temperature and filtered through a glass wool plug. The emulsion was obtained as a bright green clear dispersion. DLS: z-Average: 67.6 nm, PdI: 0.237. UV-Vis Abs. (water): $\lambda_{max}$=375 nm. UV-Vis PL (water): $\lambda_{max}$=536 nm.

Example 20—LED Devices

In order to test the suitability of cross-linked blue, green, and red, nanoparticles in LED illumination as phosphors for down-conversion of UV light, a series of silicone-based films (thickness=0.5 mm) containing blue, green or red nanoparticles was fabricated (Films G-I) and evaluated in a remote phosphor LED array using a reference UV LED as excitation source ($\lambda_{exc}$=385 nm). To fabricate the films, the nanoparticles were first precipitated by addition of isopropanol and centrifugation. Once isolated, the nanoparticles were redispersed in the Part A of the commercially available silicone-based resin QLE 1102. Having obtained a uniform dispersion, the Part B of the resin QLE 1102 was added in a ratio 1:1 relative to the Part A. The concentration of the nanoparticles within the film was 0.67 wt % relative to QLE 1102 (Part A+Part B). Finally, the curing of the films was carried out under ambient conditions in absence of light. The resulting emission spectra from the films when excited with the UV LED source were recorded with an integrating sphere attached to a Rainbow-Light Micro-Spectrometer MR-16-BINS.

Following a similar approach used to produce white light from a combination of cross-linked blue, green and red nanoparticles which down-converts the energy from a UV source, a series of silicone-based films (thickness=0.5 mm) containing a ternary mixture of cross-linked nanoparticles was fabricated (Film J and Film K) and evaluated in a remote phosphor LED array using a reference UV LED as excitation source ($\lambda_{exc}$=385 nm). The films were fabricated using a similar methodology to that followed to fabricate Films G-I. The overall concentration of CPNs within the films was 0.67 wt. % and the corresponding ratios between cross-linked blue, green and red nanoparticles dispersed in the films are presented in Table 20. In FIG. 22, the emission spectra of Films J (left) and K (right) generated when the films are irradiated with a UV LED source ($\lambda_{exc}$=385 nm) in a remote phosphor LED array are shown.

TABLE 20

Ratio between cross-linked blue, green and red nanoparticles in Films J and K.

| Film | Blue/green/red CPNs ratio |
|---|---|
| J | 100:3:1.5 |
| K | 100:5:2.5 |

The Correlated Colour Temperature (CCT), Colour Rendering Index (CRI) and CIE coordinates of the resulting light from Films J and K when irradiated with the reference UV LED source ($\lambda_{exc}$=385 nm) are presented in Table 21. The position of the CIE coordinates in the CIE 1931 chromaticity diagram are displayed in FIG. 23.

TABLE 21

Correlated Colour Temperature (CCT),
Colour Rendering Index (CRI)
and CIE coordinates of light emitted by
Films J and K when irradiated in a remote
phosphor LED array at $\lambda_{exc}$ = 385 nm.

|   | CCT | CRI | CIE coordinates x | y |
|---|---|---|---|---|
| J | 6867.02 | 85.88 | 0.3058 | 0.3306 |
| K | 5339.02 | 82.40 | 0.3368 | 0.3637 |

The use of cross-linked nanoparticles as phosphors for down-conversion of blue light was also studied. The combination of blue light from the LED source and the emission from the nanoparticles resulted in white emission. To corroborate this, a series of silicone-based films (thickness=0.5 mm) containing 0.5 wt. % nanoparticles (Film L) or a mixture of green and red nanoparticles at different ratios was prepared (Film M and Film N) and then evaluated in a remote phosphor LED array using a primary blue LED as excitation source ($\lambda_{exc}$=450 nm). The corresponding ratios between cross-linked green and red nanoparticles dispersed in Films M and N are presented in Table 22. The resulting emission spectra resulting from Films L-N when excited with the blue LED source are shown in FIG. 24.

TABLE 22

Ratio between cross-linked
green and red nanoparticles
in Films M and N.

| Film | Green/red nanoparticles ratio |
|---|---|
| M | 20:1 |
| N | 10:1 |

The Correlated Colour Temperature (CCT), Colour Rendering Index (CRI) and CIE coordinates of the resulting light from Films L-N when irradiated with the reference blue LED source ($\lambda_{exc}$=450 nm) are presented in Table 23. The position of the CIE coordinates in the CIE 1931 chromaticity diagram are displayed in FIG. 25.

TABLE 23

Correlated Colour Temperature (CCT),
Colour Rendering Index (CRI)
and CIE coordinates of light emitted
by Films L-N when irradiated
in a remote phosphor LED
array at $\lambda_{exc}$ = 450 nm.

|   | CCT | CRI | CIE coordinates x | y |
|---|---|---|---|---|
| L | 6543.94 | 57.39 | 0.3035 | 0.3869 |
| M | 4544.34 | 66.11 | 0.368 | 0.4144 |
| N | 4268.73 | 74.98 | 0.3714 | 0.379 |

Example 21—5% Benzo[c]-1,2,5-thiadiazole, 5% 9,9'-Spirobifluorene 85% Spiroanthracenefluorene

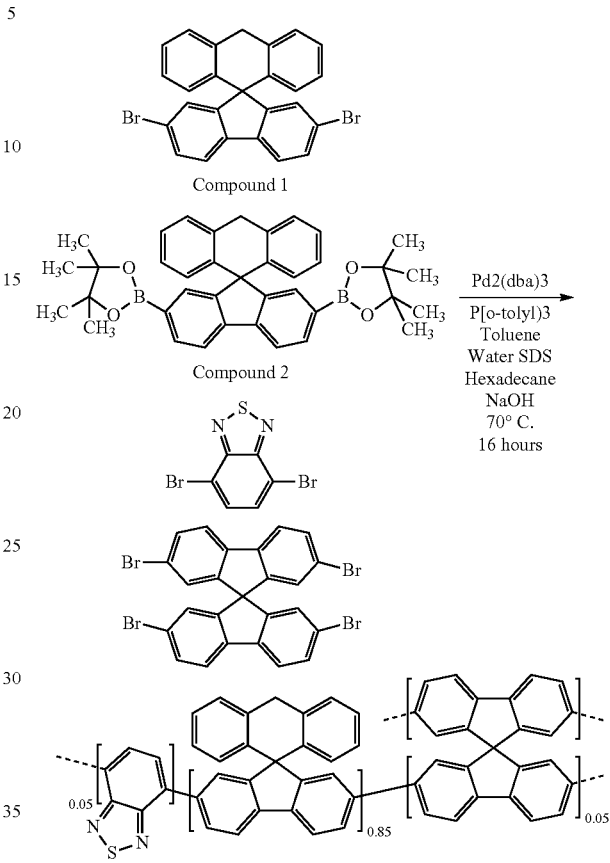

In a Schlenk tube was added water (22.0 mL), sodium dodecyl sulfate (110 mg, 382 µmol) and 1M aqueous sodium hydroxide (800 µL, 800 mol). The solution was purged with argon for 2 hours. In a vial was weighed compound 1 (68.3 mg, 14 µmol), compound 2 (116.5 mg, 200 µmol), 4,7-dibromobenzo[c]-1,2,5-thiadiazole (5.9 mg, 20 µmol), tris (dibenzylideneacetone)dipalladium(0) (4.6 mg, 5 µmol), tri (o-tolyl)phosphine (9.1 mg, 3 µmol), 2,2',7,7'-tetrabromo-9, 9'-spirobifluorene (12.6 mg, 20 µmol) and hexadecane (171 µL, 585 µmol). The vial was sealed with a rubber septum and subjected to three vacuum-argon cycles. In a separate Schlenk tube, toluene was degassed by purging with argon for 2 hours. Toluene (2.2 mL) was added to the vial and the suspension sonicated until a homogenous solution was achieved. The initial aqueous solution was cooled to 0° C. in an ice bath, the ultrasonic probe inserted and the toluene solution injected rapidly into the water. The solution was ultrasonicated for 1 minute, mixed for approx. 30 seconds and ultrasonicated for 1 further minute. The Schlenk tube was sealed, placed in a preheated oil bath at 72° C. and stirred for 20 hours. The Schlenk tube was opened and a stream of nitrogen gas passed over the emulsion at 50° C. for 5 hours, with stirring and additional deionised water added throughout to keep volume ~23.0 mL. The emulsion was cooled to room temperature, the volume increased to 23.0 mL with deionised water and filtered through a glass wool plug. The emulsion was obtained as a bright green dispersion. UV-Vis Abs. (water): $\lambda_{max}$=380 nm. UV-Vis PL (water): $\lambda_{max}$=529 nm.

The suitability of Example 21 as phosphor for down-conversion of LED-light was tested by the evaluation of a series of silicone-based films (thickness=0.5 mm) at 0.3, 0.5 and 0.67 wt. % (Films O-Q) in a remote phosphor LED array using a LED excitation source ($\lambda_{exc}$=385 nm). To fabricate the films, the CPNs were first precipitated by addition of a KCl solution (1 M) and centrifugation. Once isolated, the CPNs were redispersed in the Part A of the commercially available silicone-based resin OLE 1102. Having obtained a uniform dispersion, the Part B of the resin QLE 1102 was added in a ratio 1:1 relative to the Part A. Finally, the curing of the films was carried out under ambient conditions in absence of light. The resulting emission spectra from Films O-Q when excited with the LED light source recorded with an integrating sphere attached to a Rainbow-Light Micro-Spectrometer MR-16-BINS are shown in FIG. 26.

The suitability of Example 21 as phosphors for down-conversion of blue light was confirmed by the evaluation of Films O-Q in a remote phosphor LED array using a blue LED as the excitation source ($\lambda_{exc}$=450 nm). The partial down-conversion of blue light by Film O combined with the emission of Example 21 nanoparticles contained within this film resulted in white emission. The resulting emission spectra from Films O-Q when excited with the blue LED source are shown in FIG. 27.

TABLE 24

Correlated Colour Temperature (CCT), Colour Rendering Index (CRI) and CIE coordinates of light emitted by Films O-Q when irradiated in a remote phosphor LED array at $\lambda_{exc}$ = 450 nm.

|   | CCT | CRI | CIE coordinates x | y |
|---|---|---|---|---|
| O | 10444.37 | 65.71 | 0.2638 | 0.3118 |
| P | 5207.19 | 52.69 | 0.3481 | 0.5039 |
| Q | 4730.46 | 42.86 | 0.3805 | 0.56 |

FIG. 28 shows the position in the CIE 1931 chromaticity diagram of light emitted by Films O-Q when irradiated in a remote phosphor LED array at $\lambda_{exc}$=450 nm.

The invention claimed is:

1. A resin suitable for use in the fabrication of a light emitting device, the resin comprising a plurality of nanoparticles dispersed in an encapsulation medium, wherein the nanoparticles are photoluminescent conjugated polymer nanoparticles formed from a π-conjugated cross-linked polymer, the π-conjugated cross-linked polymer comprising
a) 80-99.9 mol. % of π-conjugated monomers, and
b) 3-10 mol. % of a cross-linker having the formula I shown below:

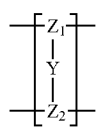

(I)

wherein
$Z_1$ and $Z_2$ are monomeric moieties, and
Y is absent, a bond, or a linking group,
wherein the encapsulation medium is a transparent polymeric encapsulation medium.

2. A resin according to claim 1, wherein the cross-linker of formula I is π-conjugated.

3. A resin according to claim 1, wherein the cross-linker has the formula II shown below:

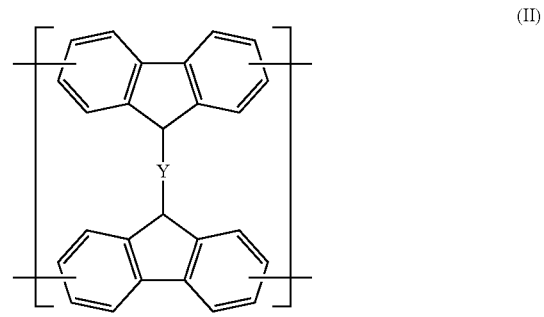

(II)

wherein
Y is absent, a bond, or a linking group.

4. A resin according to claim 1, wherein the cross linker has the formula III shown below:

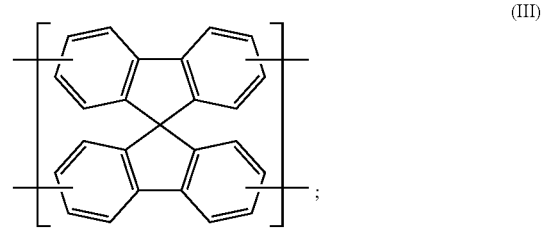

(III)

or wherein the cross-linker has the following structure:

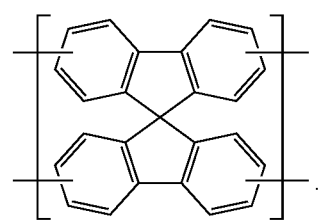

.

5. A resin according to claim 1, wherein one or more of the π-conjugated monomers comprise a moiety having the formula IV shown below:

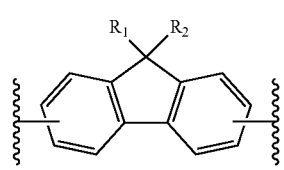

(IV)

wherein
$R_1$ and $R_2$ are each independently hydrogen or a group:

—X-Q wherein

X is absent selected from the group consisting of (1-30C) alkylene, —O-(1-30C)alkylene, —S-(1-30C)alkylene, —NH-(1-30C)alkylene, —N-[(1-30C)alkylene], (2-30C)alkenylene, (2-30C)alkynylene, —[(CH$_2$)$_2$—O]$_n$—, —[O—(CH$_2$)$_2$]$_n$— —[O—CH$_2$MeCH$_2$]$_n$—, —[CH$_2$MeCH$_2$—O]$_n$— and —[O—Si(R$_z$)$_2$]$_n$ (wherein R$_z$ is (1-4C)alkyl and n is 1 to 30), —[(CH$_2$)$_{n'}$—(CF$_2$)$_{m'}$]— (wherein n' is 0-20 and m' is 1 to 30) and Q is a terminal group selected from hydrogen, halogen, methyl, hydroxyl, carboxy, (1-4C)alkoxycarbonyl, amino, —C=CH$_2$, —C≡CH, —SH, —CF$_3$, OSO$_3$H, —SO$_3$H, —OPO$_2$OH and zwitterions (e.g. betaine), and a polymerisable group selected from acrylates, epoxy and styrene, or a salt thereof, or R$_1$ and R$_2$ are aryl or heteroaryl groups optionally substituted with a substituent group;

or R$_1$ and R$_2$ are linked so that, together with the carbon atom to which they are attached, they form ring system optionally substituted with a substituent group.

6. A resin according to claim 1, wherein the plurality of nanoparticles are configured to emit visible light of a single wavelength in the visible spectrum (e.g. red, green, blue, or yellow light); or wherein each nanoparticle emits light of a single wavelength in the visible spectrum.

7. A resin according to claim 1, wherein the plurality of nanoparticles are configured to emit visible light of two or more wavelengths in the visible spectrum (e.g. red, green, blue, and/or yellow light or a range of wavelengths that collectively form white light); or wherein at least one nanoparticle can emit more than one wavelength of light in the visible spectrum (e.g., red and green or red, green and blue).

8. A resin according to claim 7, wherein a first population of the nanoparticles emit light at a first wavelength in the visible spectrum (e.g. red light) and a second population of nanoparticles emit light at a second wavelength in the visible spectrum (e.g. green light) and optionally a third population of nanoparticles emit light of third wavelength in the visible spectrum (e.g. blue light).

9. A resin according to claim 1, wherein the nanoparticles have a particle size (Z-average, measured by DLS) of 20-400 nm, or 30-300 nm.

10. A resin according to claim 1, wherein the nanoparticles have a degree of polymerisation of 10 to 800.

11. A resin according to claim 1, wherein the encapsulation medium is selected from siloxane-based media and/or acrylate polymers.

12. A resin according to claim 1, wherein the loading of nanoparticles within the resin is 0.005 to 5 wt. %.

13. A light emitting device comprising a resin as defined in claim 1 and a primary light source configured to illuminate the resin.

14. A light emitting device according to claim 13, wherein the primary light source emits UV and/or blue light; and/or wherein the nanoparticles in the resin emit secondary light.

15. A light emitting device according to claim 13, wherein the primary light is absorbed by the resin and the only light emitted from the device is secondary light.

16. A light emitting device according to claim 15, wherein the secondary light is white light.

17. A light emitting device according to claim 15, wherein the nanoparticles either (i) emit a mixture of red, green and blue light (which collectively forms the perception of white light), a mixture of blue and yellow light (which collectively forms the perception of white light), yellow and green light or the nanoparticles may emit white light (i.e. a broad spectrum of visible light wavelengths, which collectively form the perception of white light).

18. A light emitting device according to claim 13, wherein a proportion of the primary light transmits through the resin and the light emitted from the device is a mixture of primary light and secondary light.

19. A light emitting device according to claim 18, wherein the device emits white light; and/or wherein the primary light is blue light and the secondary light is selected from either yellow light, red and green light or a range of wavelengths of visible light that, together with the primary blue light transmitted through the resin, create white light.

20. A method of forming a resin according to claim 1, the method comprising the steps of:
   (i) dispersing the nanoparticles according to claim 1 within a precursor encapsulation medium; and either
   (ii) curing the precursor encapsulation medium to form the encapsulation medium; or
   (iii) injection moulding and/or extruding the precursor encapsulation medium to form the resin.

* * * * *